United States Patent
Suzuki et al.

(10) Patent No.: US 8,193,564 B2
(45) Date of Patent: Jun. 5, 2012

(54) SILICON CARBIDE SEMICONDUCTOR DEVICE INCLUDING DEEP LAYER

(75) Inventors: Naohiro Suzuki, Anjo (JP); Eiichi Okuno, Mizuho (JP); Hideo Matsuki, Obu (JP)

(73) Assignee: DENSO CORPORATION, Kariya (JP)

( * ) Notice: Subject to any disclaimer, the term of this patent is extended or adjusted under 35 U.S.C. 154(b) by 95 days.

(21) Appl. No.: 12/379,076

(22) Filed: Feb. 12, 2009

(65) Prior Publication Data

US 2009/0200559 A1    Aug. 13, 2009

(30) Foreign Application Priority Data

Feb. 13, 2008   (JP) ................. 2008-031704
Dec. 18, 2008   (JP) ................. 2008-322233
Dec. 18, 2008   (JP) ................. 2008-322426

(51) Int. Cl.
    *H01L 29/71* (2006.01)
(52) U.S. Cl. .............. 257/216; 257/219; 257/E29.201
(58) Field of Classification Search ............... 257/216, 257/219, 328–331, 341, E29.201
    See application file for complete search history.

(56) References Cited

U.S. PATENT DOCUMENTS

| | | | |
|---|---|---|---|
| 5,322,802 A | 6/1994 | Baliga et al. | |
| 5,637,898 A | 6/1997 | Baliga | |
| 5,744,826 A | 4/1998 | Takeuchi et al. | |
| 5,969,378 A | 10/1999 | Singh | |
| 5,998,268 A | 12/1999 | Tomatsu et al. | |
| 6,054,752 A | 4/2000 | Hara et al. | |
| 6,057,558 A | 5/2000 | Yamamoto et al. | |
| 6,133,587 A | 10/2000 | Takeuchi et al. | |
| 6,645,815 B2 | 11/2003 | Hshieh et al. | |
| 7,091,573 B2 | 8/2006 | Hirler et al. | |
| 7,345,342 B2 | 3/2008 | Challa et al. | |
| 7,504,690 B2 | 3/2009 | Kelly et al. | |
| 7,652,326 B2 | 1/2010 | Kocon | |
| 2002/0027237 A1 | 3/2002 | Onishi et al. | |
| 2002/0030237 A1 | 3/2002 | Omura et al. | |
| 2004/0056306 A1 | 3/2004 | Saito et al. | |
| 2004/0135228 A1 | 7/2004 | Iwamoto et al. | |

(Continued)

FOREIGN PATENT DOCUMENTS

JP    A-H8-264772    10/1996

(Continued)

OTHER PUBLICATIONS

U.S. Appl. No. 12/289,624, filed Oct. 29, 2008, Suzuki et al.

(Continued)

*Primary Examiner* — Cuong Q Nguyen
*Assistant Examiner* — Tran Tran
(74) *Attorney, Agent, or Firm* — Posz Law Group, PLC

(57) ABSTRACT

A silicon carbide semiconductor device includes a substrate, a drift layer located on a first surface of the substrate, a base region located on the drift layer, a source region located on the base region, a trench penetrating the source region and the base region to the drift layer, a channel layer located in the trench, a gate insulating layer located on the channel layer, a gate electrode located on the gate insulating layer, a source electrode electrically coupled with the source region and the base region, a drain electrode located on a second surface of the substrate, and a deep layer. The deep layer is located under the base region, extends to a depth deeper than the trench and is formed along an approximately normal direction to a sidewall of the trench.

3 Claims, 47 Drawing Sheets

U.S. PATENT DOCUMENTS

| | | | |
|---|---|---|---|
| 2005/0167742 | A1 | 8/2005 | Challa et al. |
| 2005/0181536 | A1 | 8/2005 | Tsuji |
| 2005/0233539 | A1 | 10/2005 | Takeuchi et al. |
| 2006/0001084 | A1 | 1/2006 | Kelly et al. |
| 2006/0006458 | A1 | 1/2006 | Motai et al. |
| 2006/0043434 | A1 | 3/2006 | Huang et al. |
| 2006/0057796 | A1 | 3/2006 | Harada et al. |
| 2007/0052015 | A1 | 3/2007 | Miura et al. |
| 2007/0114602 | A1 | 5/2007 | Saito et al. |
| 2007/0181939 | A1 | 8/2007 | Huang et al. |
| 2008/0099837 | A1* | 5/2008 | Akiyama et al. .............. 257/341 |
| 2008/0280412 | A1 | 11/2008 | Tsuji |
| 2009/0072241 | A1* | 3/2009 | Harris et al. .................... 257/77 |
| 2009/0200559 | A1 | 8/2009 | Suzuki et al. |
| 2009/0311839 | A1 | 12/2009 | Miyahara et al. |

FOREIGN PATENT DOCUMENTS

| | | |
|---|---|---|
| JP | A-2000-269518 | 9/2000 |
| JP | A-2001-267570 | 9/2001 |
| JP | A-2007-281265 | 10/2007 |

OTHER PUBLICATIONS

Notice of Reasons for Refusal mailed Jun. 15, 2010 in corresponding Japanese Application No. 2008-31704.

Extended European Search Report dated Sep. 10, 2009 issued from the European Patent Office in corresponding European patent application No. 09001454.9-2203.

Office Action dated Oct. 1, 2010 issued from the Korean Patent Office in corresponding Korean patent application No. 10-2009-011552 (English translation enclosed).

Office Action dated May 27, 2010 in corresponding U.S. Appl. No. 12/453,520.

Notice of Allowance dated Sep. 16, 2010 in corresponding U.S. Appl. No. 12/453,520.

Office Action mailed Oct. 19, 2010 in related U.S. Appl. No. 12/385,715.

Notice of Reasons for Refusal mailed on Nov. 2, 2010 issued from the Japanese Patent Office in the corresponding Japanese patent application No. 2008-031704 (with English translation).

Notice of Reasons for Refusal mailed on Nov. 16, 2010 issued from the Japanese Patent Office in the corresponding Japanese patent application No. 2008-322426 (with English translation).

Office Action dated Apr. 17, 2012 in corresponding EP Application No. 09001454.9.

* cited by examiner

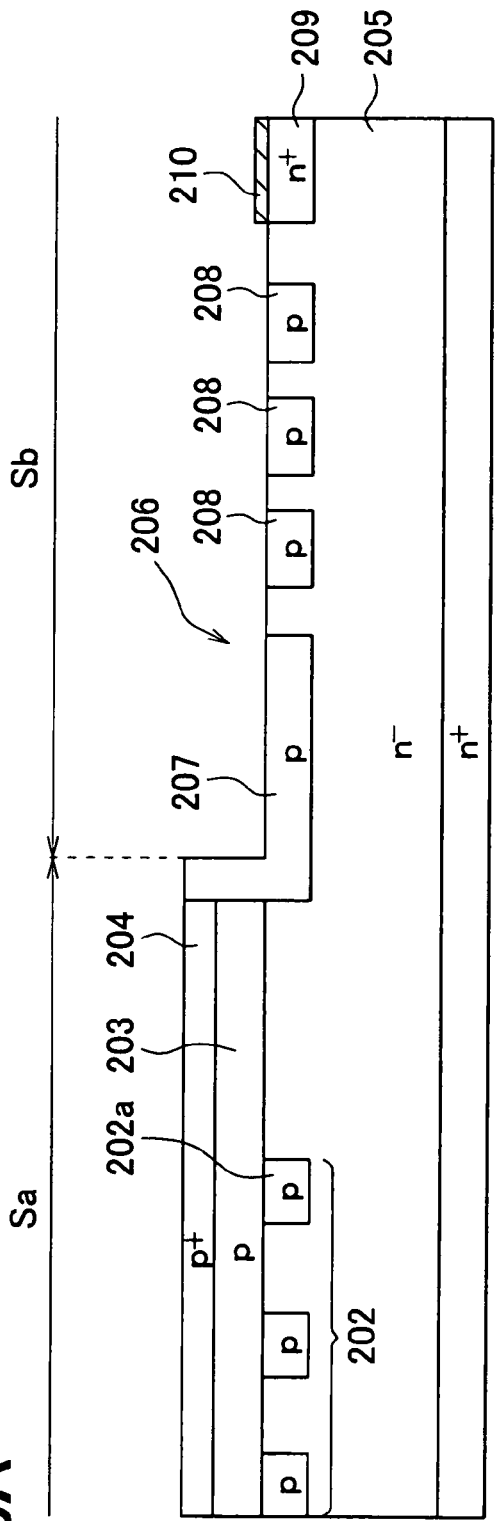
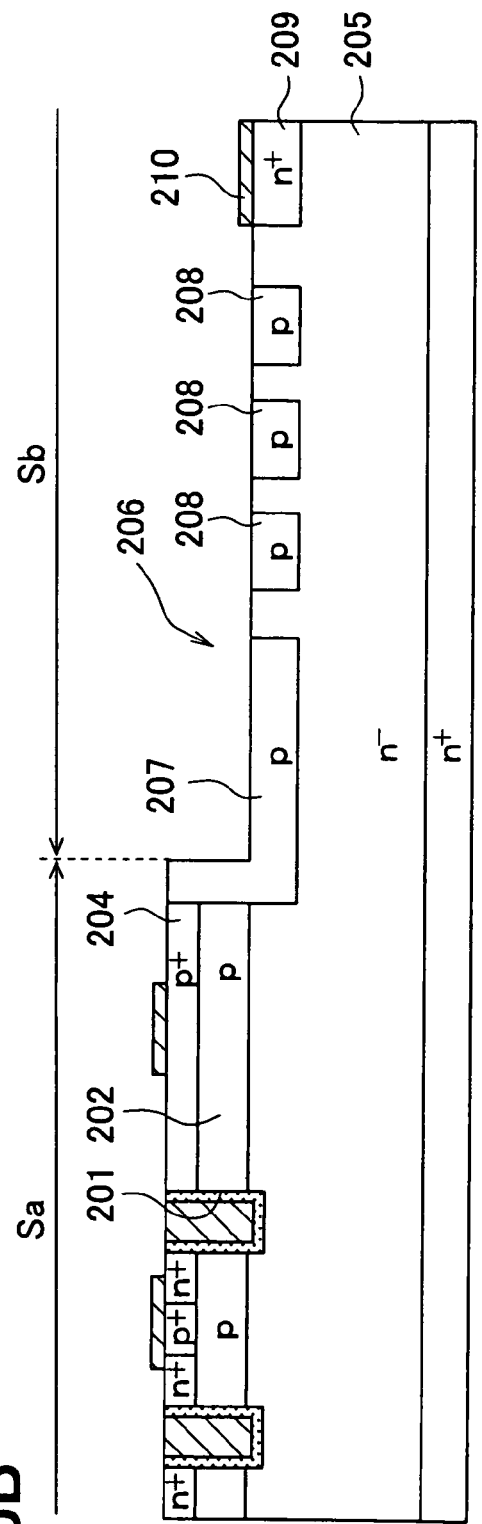
FIG. 25A
FIG. 25B

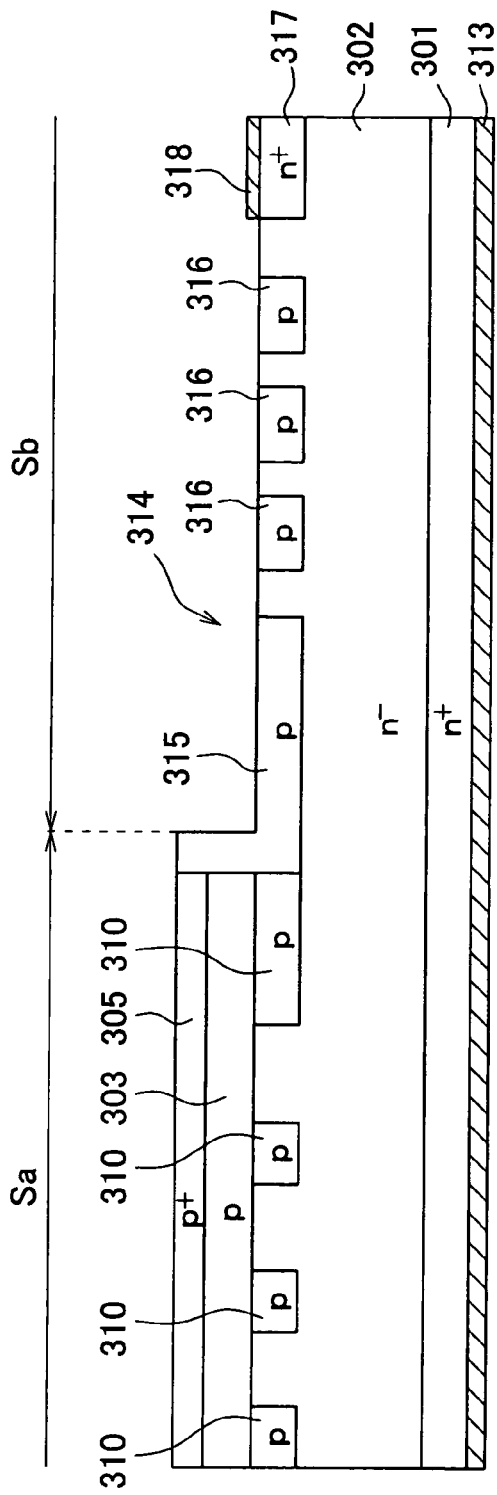
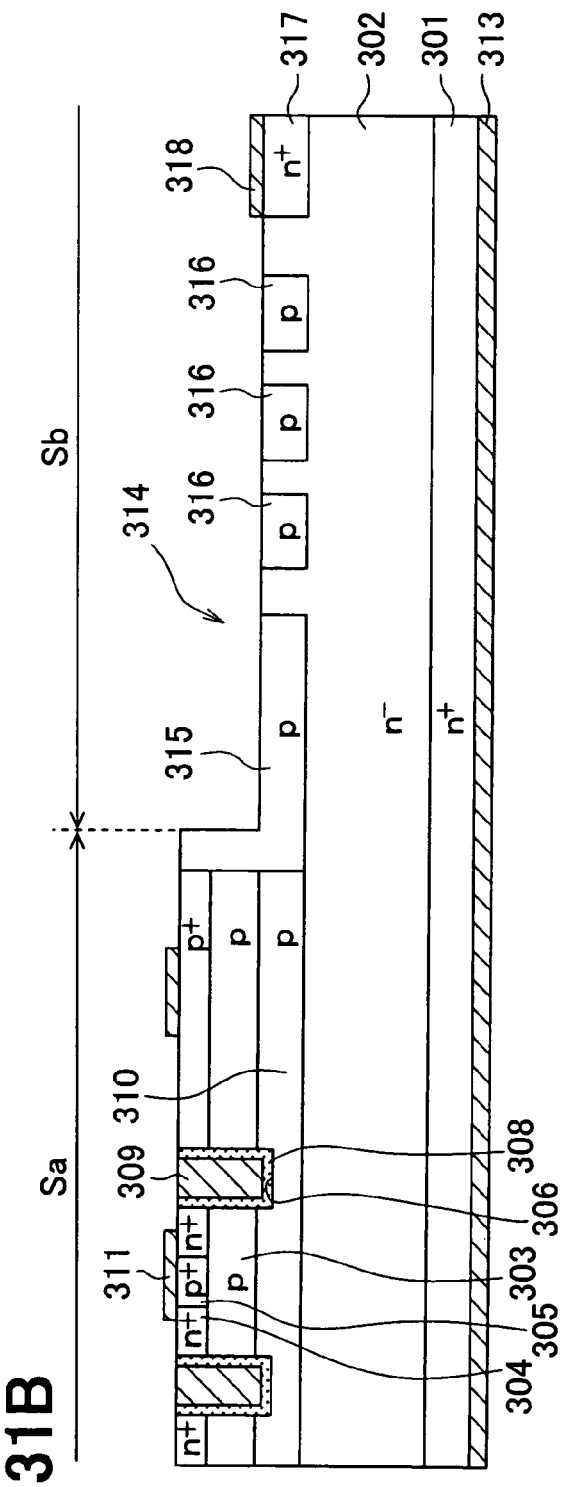
FIG. 31A
FIG. 31B

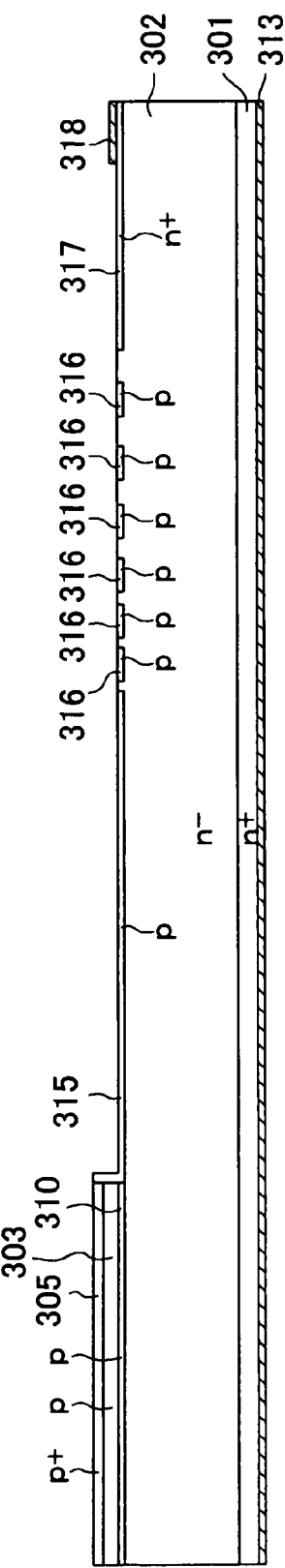
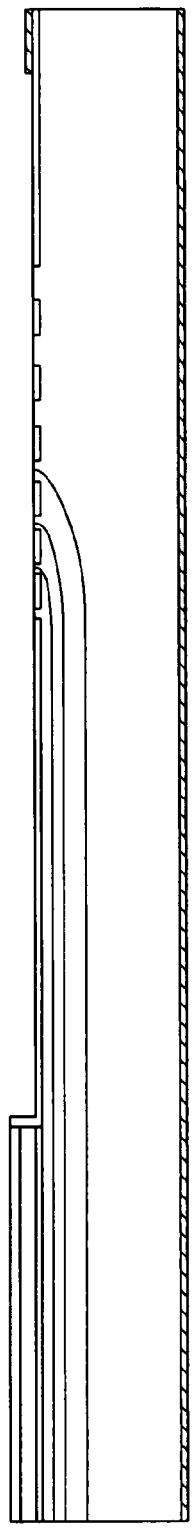
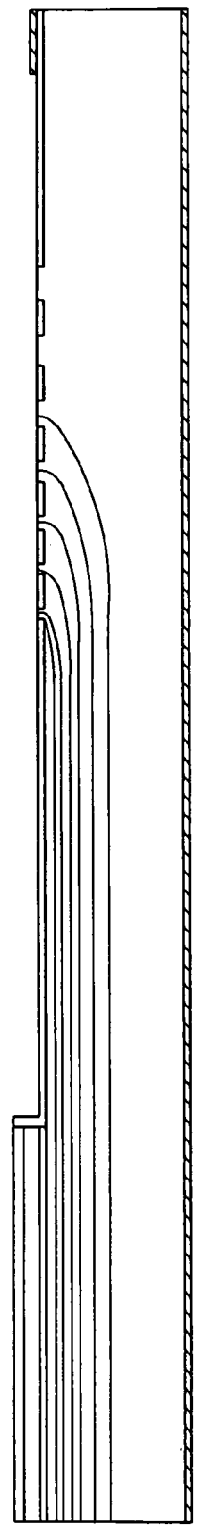
FIG. 32A
FIG. 32B
FIG. 32C $1 \times 10^{25}$
$1 \times 10^{24}$
$1 \times 10^{23}$
$1 \times 10^{22}$
$1 \times 10^{21}$

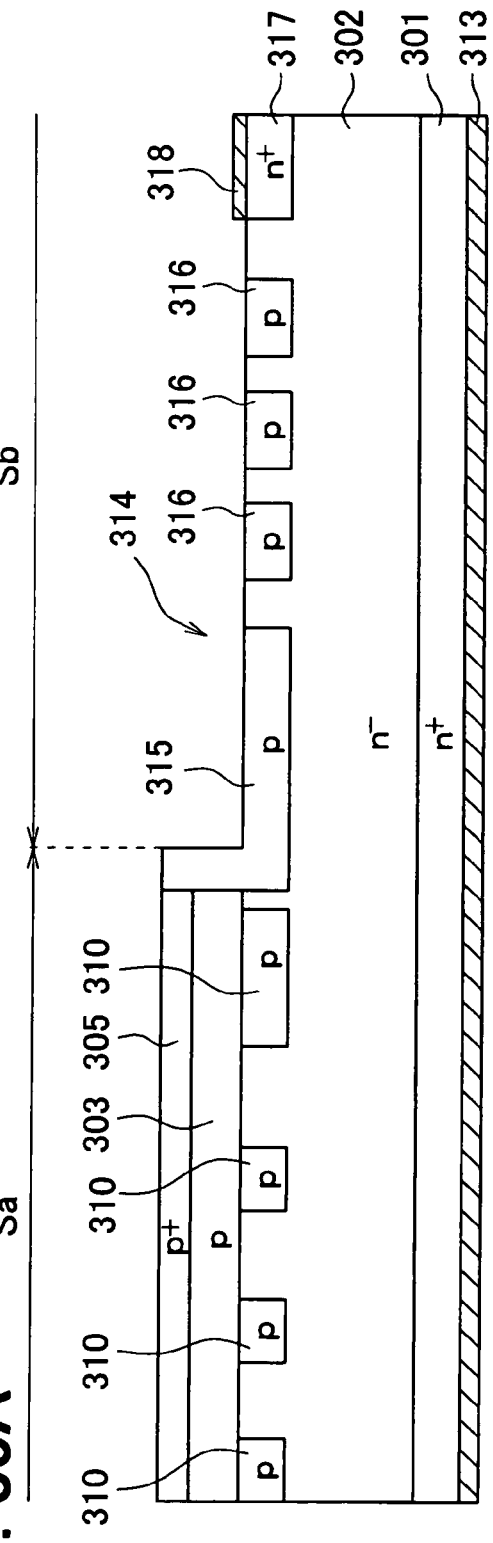
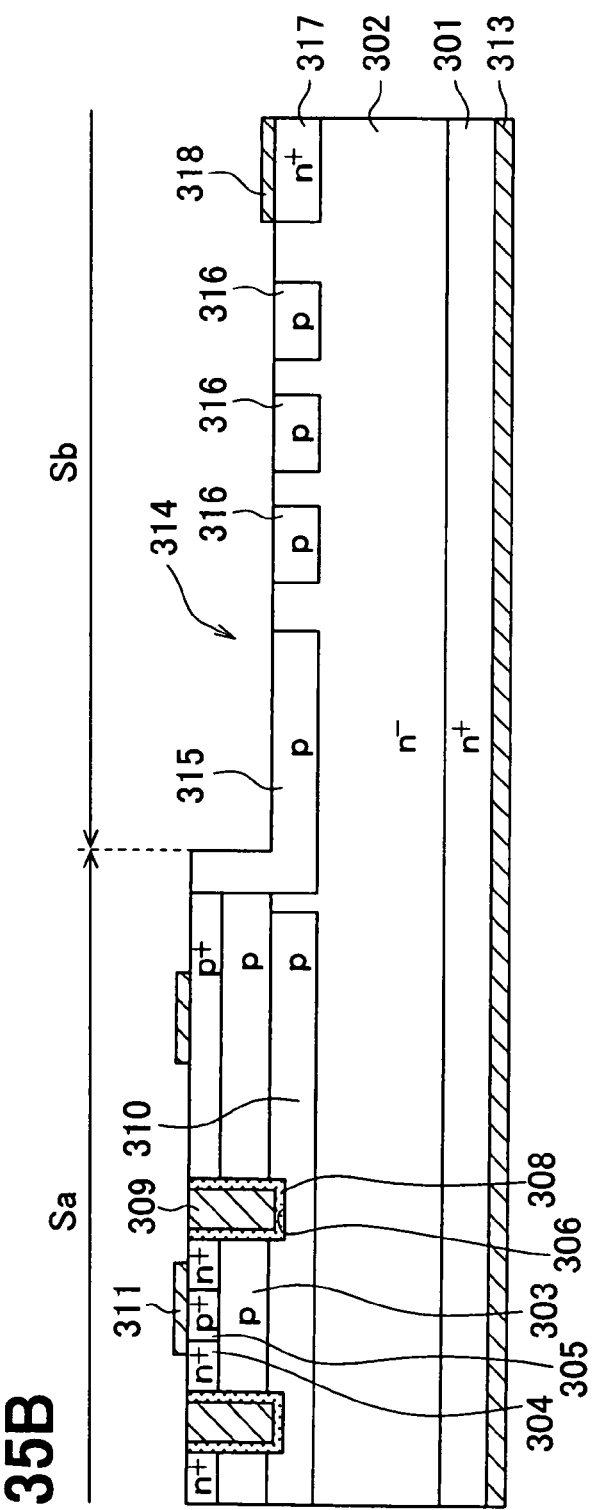
FIG. 35A
FIG. 35B

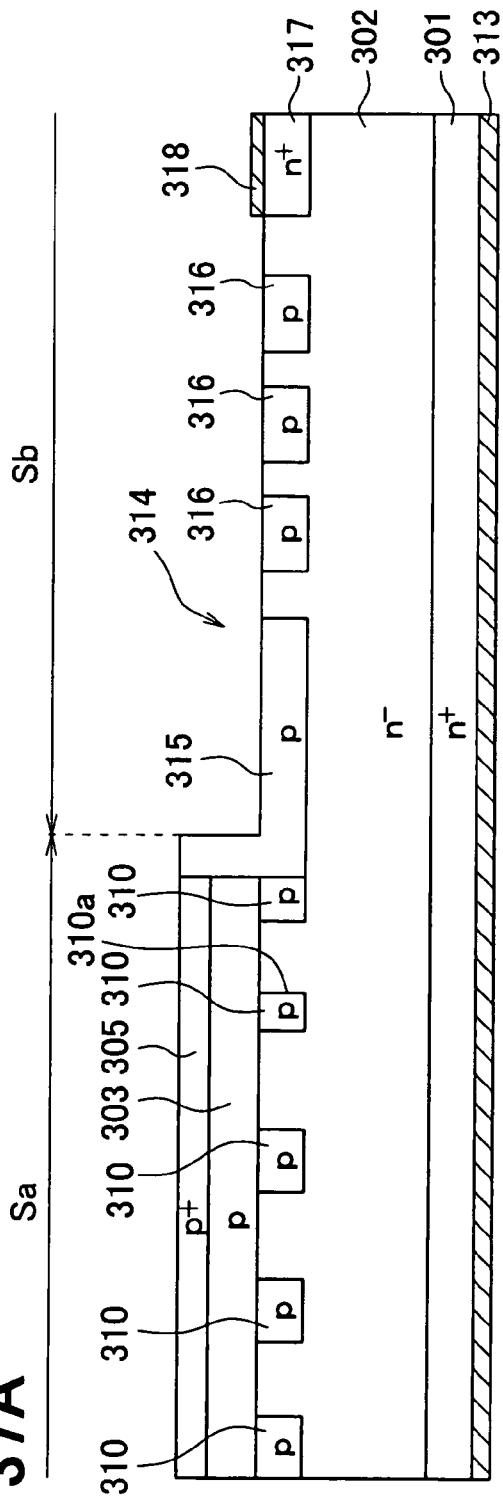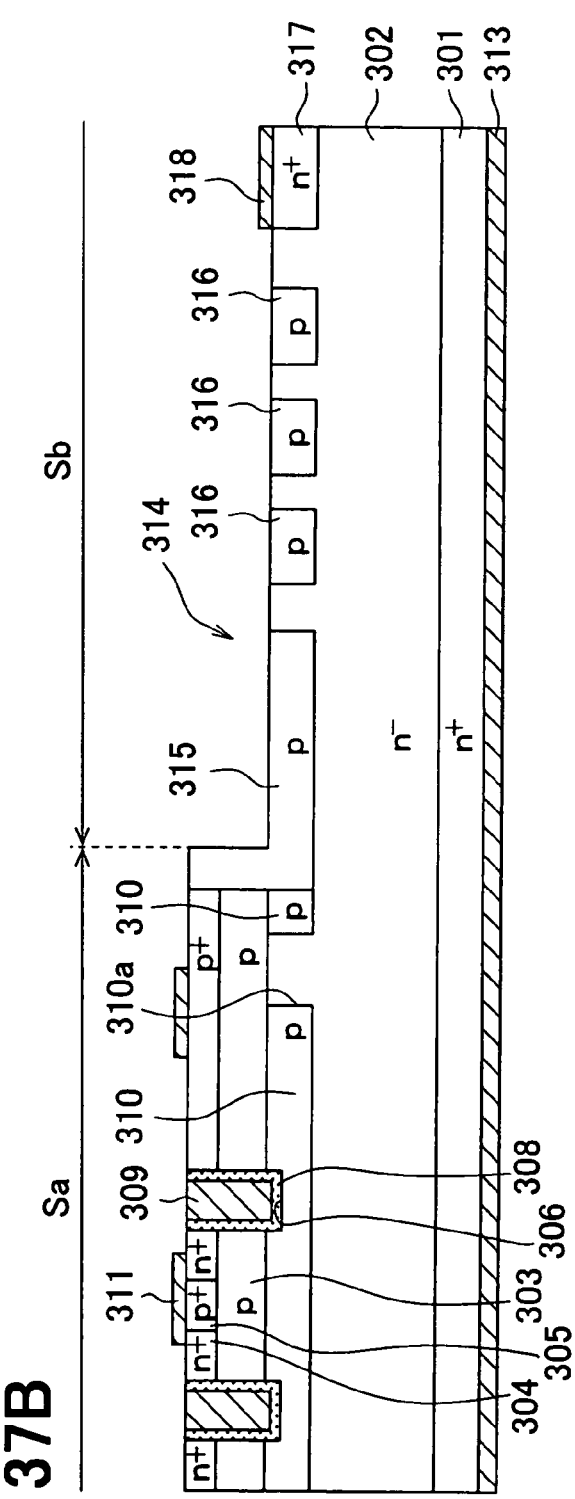

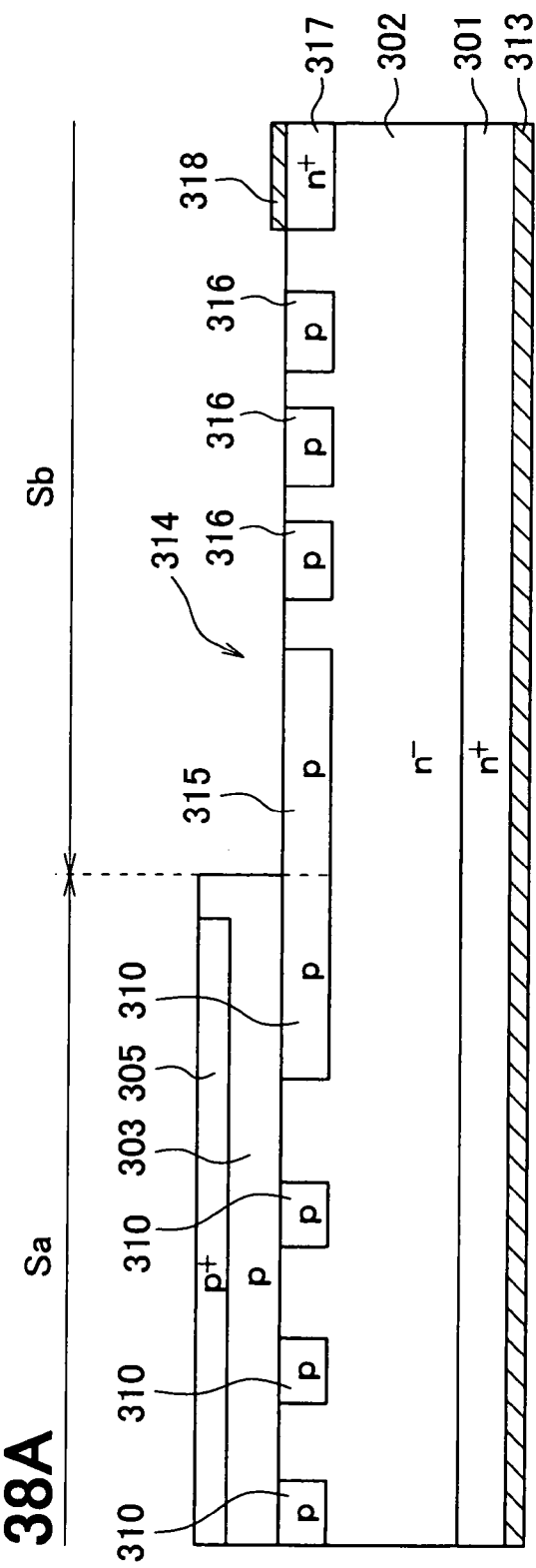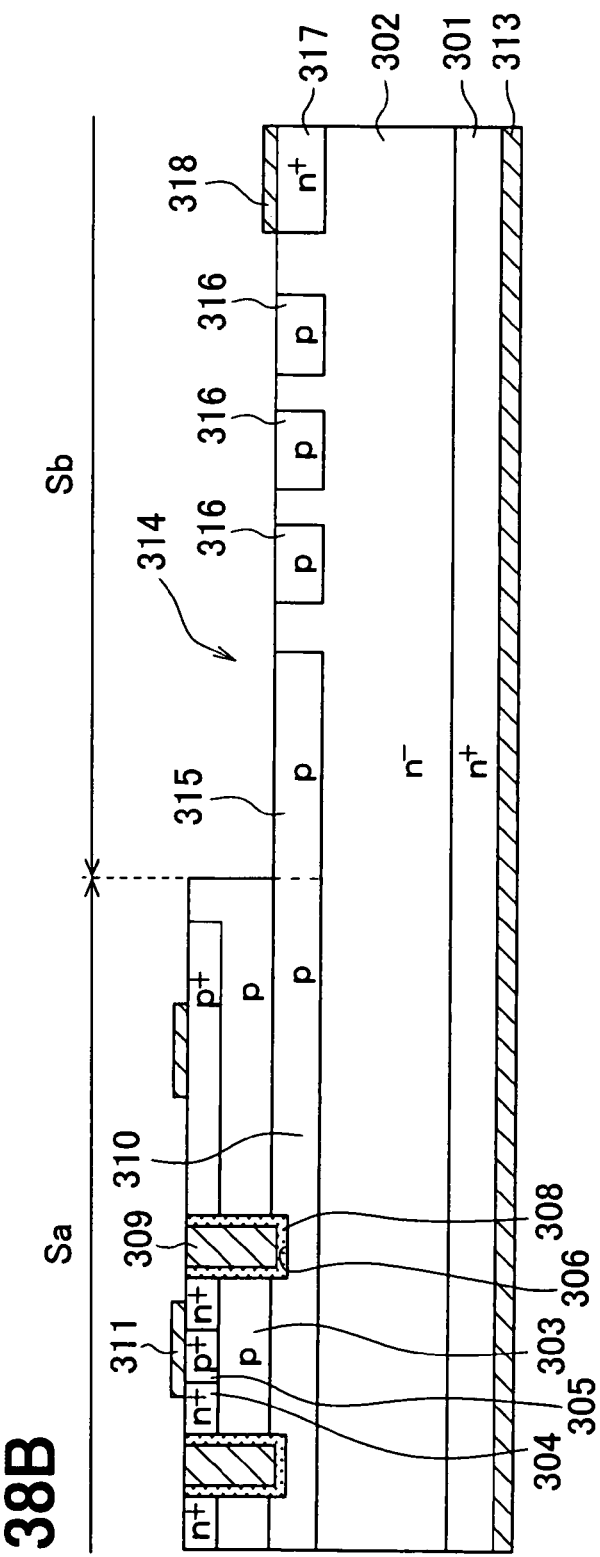
FIG. 38A
FIG. 38B

SILICON CARBIDE SEMICONDUCTOR DEVICE INCLUDING DEEP LAYER

CROSS REFERENCE TO RELATED APPLICATIONS

The present application is based on and claims priority to Japanese Patent Applications No. 2008-31704 filed on Feb. 13, 2008, No. 2008-322426 filed on Dec. 18, 2008, and No. 2008-322233 filed on Dec. 18, 2008, the contents of which are incorporated in their entirety herein by reference.

BACKGROUND OF THE INVENTION

1. Field of the Invention

The present invention relates to a silicon carbide semiconductor device including a deep layer.

2. Description of the Related Art

A silicon carbide (SiC) semiconductor device typically has a high breakdown field strength and can therefore control a high current. The SiC semiconductor device can be used for controlling a motor of a hybrid vehicle, for example.

In order to increase electric current that flows in a semiconductor device, a channel density can be increased. In a silicon semiconductor device, a metal-oxide semiconductor field-effect transistor (MOSFET) having a trench gate structure is in practical use. When a trench gate structure is applied to the SiC semiconductor device, difficulty arises. The breakdown field strength of SiC is about ten times greater than a breakdown field strength of silicon. Thus, a voltage about ten times greater than a voltage applied to the silicon semiconductor device may be applied to the SiC semiconductor device. If such a voltage is applied, a gate insulating layer disposed in a plurality of trenches provided in an SiC substrate may receive an electric field about ten times greater than an electric field in the silicon semiconductor device. As a result, the gate insulating layer may be damaged, for example, at a corner portion of each of the trenches. According to a simulation by the inventors named in the present application, when a voltage of about 650 V is applied to a drain, the gate insulating layer in the trenches receives an electric field of about 4.9 MV/cm. The electric filed applied to the gate insulating layer is required to be about 3 MV/cm or less for practical use. Furthermore, the electric field applied to the gate insulating layer is required to be about 2 MV/cm or less for long-term use.

In an SiC semiconductor device described in U.S. Pat. No. 5,744,826 (corresponding to JP-A-9-199724), a thickness of an gate insulating layer located at a bottom portion of each of the trenches is set to be greater than a thickness of the gate insulating layer located at a sidewall of each of the trenches for reducing an electric field concentration at the bottom portion of each of the trenches. The SiC semiconductor device described in U.S. Pat. No. 5,744,826 is made of a 4H—SiC substrate having a main surface of (000-1)-face and the trenches extend in a (1120)-direction. An oxidation rate of the (000-1)-face is about five times greater than an oxidation rate of the (1120)-face. Thus, when a gate insulation layer is formed by thermal oxidation in the trenches that have a sidewall of (1120)-face and a bottom of (000-1)-face, a thickness of an oxide layer formed at the bottom portion can be about five times greater than a thickness of the oxide layer formed on the sidewall. Thereby, the electric field concentration at the bottom portion of the trenches can be reduced.

According to another simulation by the inventors, in which a thickness of the gate insulating layer on the sidewall is set to be about 40 nm and the thickness of gate insulation layer at the bottom portion is set to be about 200 nm, when a voltage of about 650 V is applied to a drain, the electric field concentration at the gate insulating layer in the trenches can be reduced to about 3.9 MV/cm. However, further relaxation of the electric field is required.

Japanese Patent Application No. 2007-288545 made by the inventors describes an SiC semiconductor device including P type deep layers formed along a longitudinal direction of a trench gate. The P type deep layers are located on an opposite side of an N+ type source region and a P type base region from the trench gate. The P type deep layers are located under a P+ type contact region for electrically coupling the P type base region and a source electrode. The P type deep layers extend to a depth deeper than a bottom portion of the trench gate. In the SiC semiconductor device described therein, the electric field can be further relaxed.

In a manufacturing process of the above-described SiC semiconductor device, the trench gate and the P type deep layers are formed during different processes. Thus, a positioning is difficult, and a distance between a sidewall of the trench and the P type deep layer may vary. As a result, a production property may vary and a yield may be reduced.

SUMMARY OF THE INVENTION

In view of the foregoing problems, it is an object of the present invention to provide an SiC semiconductor device including a deep layer.

An SiC semiconductor device according to a first aspect of the present invention includes a substrate, a drift layer, a trench, a gate insulating layer, a base region, a channel layer, a source region, a gate electrode, a source electrode, a drain electrode, and a deep layer. The substrate is made of silicon carbide and has one of a first conductivity type and a second conductivity type. The substrate has first and second opposing surfaces. The drift layer is located on the first surface of the substrate. The drift layer is made of silicon carbide. The drift layer has the first conductivity type and has an impurity concentration less than an impurity concentration of the substrate. The trench is provided from a surface of the drift layer. The gate insulating layer is located in the trench. The base region sandwiches the trench. The base region has a predetermined distance from the gate insulating layer on a sidewall of the trench. The base region is made of silicon carbide and has the second conductivity type. The channel layer is located between the base region and the gate insulating layer. The channel layer is made of silicon carbide and has the first conductivity type. The source region is located on the base region and sandwiches the trench. The source region is in contact with the channel layer. The source region is made of silicon carbide. The source region has the first conductive type and has an impurity concentration greater than the impurity concentration of the drift layer. The gate electrode is located on the gate insulating layer in the trench. The source electrode is electrically coupled with the source region and the base region. The drain electrode is located on the second surface of the substrate. The deep layer is located under the base region and extends to a depth deeper than the trench. The deep layer is formed along an approximately normal direction to the sidewall of the trench. The deep layer has the second conductivity type. An accumulation channel is provided at the channel layer on the sidewall of the trench and electric current flows between the source electrode and the drain electrode through the source region and the drift layer by controlling a voltage applied to the gate electrode.

In the present SiC semiconductor device, the deep layer is formed along a direction approximately perpendicular to a longitudinal direction of the trench. Thus, a misalignment of a mask for forming the trench and a mask for forming the deep layer does not affect a property of the SiC semiconductor device. Thereby, a variation of a production property can be reduced and a yield can be improved.

An SiC semiconductor device according to a second aspect of the present invention includes a substrate, a drift layer, a trench, a base region, a source region, a gate insulating layer, a gate electrode, a source electrode, a drain electrode, and a deep layer. The substrate is made of silicon carbide and has one of a first conductivity type and a second conductivity type. The substrate has first and second opposing surfaces. The drift layer is located on the first surface of the substrate. The drift layer is made of silicon carbide. The drift layer has the first conductivity type and has an impurity concentration less than an impurity concentration of the substrate. The trench is provided from a surface of the drift layer. The base region sandwiches the trench so as to be in contact with a sidewall of the trench. The base region is made of silicon carbide and has the second conductivity type. The source region is located on the base region and sandwiches the trench. The source region is in contact with the sidewall of the trench. The source region is made of silicon carbide. The source region has the first conductive type and has an impurity concentration greater than the impurity concentration of the drift layer. The gate insulating layer is located on a surface of the trench. The gate electrode is located on the gate insulating layer in the trench. The source electrode is electrically coupled with the source region and the base region. The drain electrode is located on the second surface of the substrate. The deep layer is located under the base region and extends to a depth deeper than the trench. The deep layer is formed along an approximately normal direction to the sidewall of the trench. The deep layer has the second conductivity type. An inversion channel is provided at a surface portion of the base region located on the sidewall of the trench and electric current flows between the source electrode and the drain electrode through the source region and the drift layer by controlling a voltage applied to the gate electrode.

In the present SiC semiconductor device, the deep layer is formed along a direction approximately perpendicular to a longitudinal direction of the trench. Thus, a misalignment of a mask for forming the trench and a mask for forming the deep layer does not affect a property of the SiC semiconductor device. Thereby, a variation of a production property can be reduced and a yield can be improved.

An SiC semiconductor device according to a third aspect of the present invention includes a substrate, a drift layer, a base region, a source region, a trench, a gate insulating layer, a gate electrode, a source electrode, a drain electrode, a deep layer, and a body layer. The substrate is made of silicon carbide and has one of a first conductivity type and a second conductivity type. The substrate has first and second opposing surfaces. The drift layer is located on the first surface of the substrate. The drift layer is made of silicon carbide. The drift layer has the first conductivity type and has an impurity concentration less than an impurity concentration of the substrate. The base region is located on the drift layer. The base region is made of silicon carbide and has the second conductivity type. The source region is located on the base region. The source region is made of silicon carbide. The source region has the first conductive type and has an impurity concentration greater than the impurity concentration of the drift layer. The trench extends to a depth deeper than the source region and the base region and reaches the drift layer. The trench is sandwiched by each of the base region and the source region. The trench is provided along a first direction. The gate insulating layer is located on a surface of the trench. The gate electrode is located on the gate insulating layer in the trench. The source electrode is electrically coupled with the source region and the base region. The drain electrode is located on the second surface of the substrate. The deep layer is located under the base region and extends to a depth deeper than the trench. The deep layer is formed in parallel with a planer direction of the substrate along a second direction crossing the first direction. The deep layer has the second conductivity type. The body layer has a predetermined distance from a sidewall of the trench. The body layer is located at a portion deeper than the source region. The body layer has the second conductivity type and has an impurity concentration greater than the impurity concentration of the base region. A inversion channel is provided at a surface portion of the base region located on the sidewall of the trench and electric current flows between the source electrode and the drain electrode through the source region and the drift layer by controlling a voltage applied to the gate electrode.

In the present SiC semiconductor device, an on-resistance can be reduced and a breakdown voltage can be increased due to the body layer having the impurity concentration greater than the impurity concentration of the base region.

An SiC semiconductor device according to a fourth aspect of the present invention includes a substrate, a drift layer, a base region, a source region, a plurality of trenches, a gate insulating layer, a gate electrode, a source electrode, a drain electrode, a deep layer, and a peripheral high-voltage part. The substrate is made of silicon carbide and has one of a first conductivity type and a second conductivity type. The substrate has first and second opposing surfaces. The drift layer is located on the first surface of the substrate. The drift layer is made of silicon carbide. The drift layer has the first conductivity type and has an impurity concentration less than an impurity concentration of the substrate. The drift layer has a cell section and a peripheral section surrounding the cell section. The base region is located on the cell section of the drift layer. The base region is made of silicon carbide and has the second conductivity type. The source region is located on the base region. The source region is made of silicon carbide. The source region has the first conductive type and has an impurity concentration greater than the impurity concentration of the drift layer. The trenches extend to a depth deeper than the source region and the base region and reach the drift layer. The trenches are arranged in a stripe pattern. Each of the trenches is sandwiched by each of the base region and the source region. Each of the trenches is provided along a first direction. The gate insulating layer is located on a surface of each of the trenches. The gate electrode is located on the gate insulating layer in each of the trenches. The source electrode is electrically coupled with the source region and the base region. The drain electrode is located on the second surface of the substrate. The deep layer is located under the base region and extends to a depth deeper than the trenches. The deep layer has the second conductivity type. The deep payer has a plurality of stripe portions and an outer edge portion surrounding the stripe portions. The stripe portions are arranged in a stripe pattern. Each of the stripe portions is formed in parallel with a planer direction of the substrate along a second direction crossing the first direction. The outer edge portion of the deep layer is located at an outer edge portion of the cell section and is formed toward the peripheral section. The peripheral high-voltage part is located at the peripheral section. An inversion channel is provided at a surface portion of the base region located on the sidewall of the trench and electric current flows between the source electrode and the drain electrode through the source region and the drift layer by controlling a voltage applied to the gate electrode.

In the present SiC semiconductor device, a portion where a breakdown can possibly occur is moved to the peripheral section due to the outer edge portion of the deep layer located at the outer edge portion of the cell section. Thus, a breakdown voltage of the SiC semiconductor device can be increased.

An SiC semiconductor device according to a fifth embodiment of the present invention includes a substrate, a drift layer, a base region, a source region, a plurality of trenches, a channel layer, a gate insulating layer, a gate electrode, a source electrode, a drain electrode, a deep layer, and a peripheral high-voltage part. The substrate is made of silicon carbide and has one of a first conductivity type and a second conductivity type. The substrate has first and second opposing surfaces. The drift layer is located on the first surface of the substrate. The drift layer is made of silicon carbide. The drift layer has the first conductivity type and has an impurity concentration less than an impurity concentration of the substrate. The drift layer has a cell section and a peripheral section surrounding the cell section. The base region is located on the cell section of the drift layer. The base region is made of silicon carbide and has the second conductivity type. The source region is located on the base region. The source region is made of silicon carbide. The source region has the first conductive type and has an impurity concentration greater than the impurity concentration of the drift layer. The trenches extend to a depth deeper than the source region and the base region and reach the drift layer. The trenches are arranged in a stripe pattern. Each of the trenches is sandwiched by each of the base region and the source region. Each of the trenches is provided along a first direction. The channel layer is located on a surface of each of the trenches. The channel layer is made of silicon carbide. The channel layer has the first conductivity type and has an impurity concentration less than the impurity concentration of the source region. The gate insulating layer is located on a surface of the channel layer in each of the trenches. The gate electrode is located on the gate insulating layer in each of the trenches. The source electrode is electrically coupled with the source region and the base region. The drain electrode is located on the second surface of the substrate. The deep layer is located under the base region and extends to a depth deeper than the trenches. The deep layer has the second conductivity type. The deep payer has a plurality of stripe portions and an outer edge portion surrounding the stripe portions. The plurality of stripe portions arranged in a stripe pattern, each of the plurality of stripe portions formed in parallel with a planer direction of the substrate along a second direction crossing the first direction. The outer edge portion of the deep layer is located at an outer edge portion of the cell section and is formed toward the peripheral section. The peripheral high-voltage part is located at the peripheral section. An accumulation channel is provided at the channel layer and electric current flows between the source electrode and the drain electrode through the source region and the drift layer by controlling a voltage applied to the gate electrode.

In the present SiC semiconductor device, a portion where a breakdown can possibly occur is moved to the peripheral section due to the outer edge portion of the deep layer located at the outer edge portion of the cell section. Thus, a breakdown voltage of the SiC semiconductor device can be increased.

BRIEF DESCRIPTION OF THE DRAWINGS

Additional objects and advantages of the present invention will be more readily apparent from the following detailed description of exemplary embodiments when taken together with the accompanying drawings. In the drawings:

FIG. 25A is a diagram illustrating a cross-sectional view of the SiC semiconductor device taken along line XXVA-XXVA in FIG. 24;

FIG. 25B is a diagram illustrating a cross-sectional view of the SiC semiconductor device taken along line XXVB-XXVB in FIG. 24;

FIG. 31A is a diagram illustrating a cross-sectional view of the SiC semiconductor device taken along line XXXIA-XXXIA in FIG. 28;

FIG. 31B is a diagram illustrating a cross-sectional view of the SiC semiconductor device taken along line XXXIB-XXXIB in FIG. 28;

FIG. 32A is a diagram illustrating a cross-sectional view of a part of the SiC semiconductor device according to the sixth embodiment in the vicinity of a joint portion of a P type deep layer and a P type RESURF layer;

FIG. 32B is a diagram illustrating an electric potential distribution in the SiC semiconductor device illustrated in FIG. 32A in a case where a drain electrode is about 200 V;

FIG. 32C is a diagram illustrating an electric potential distribution in the SiC semiconductor device illustrated in FIG. 32A in a case where a drain electrode is about 400 V;

FIG. 35A is a diagram illustrating a cross-sectional view of the SiC semiconductor device taken along line XXXVA-XXXVA in FIG. 34;

FIG. 35B is a diagram illustrating a cross-sectional view of the SiC semiconductor device taken along line XXXVB-XXXVB in FIG. 34;

FIG. 37A is a diagram illustrating a cross-sectional view of the SiC semiconductor device taken along line XXXVIIA-XXXVIIA in FIG. 36;

FIG. 37B is a diagram illustrating a cross-sectional view of the SiC semiconductor device taken along line XXXVIIB-XXXVIIB in FIG. 36;

FIG. 38A is a diagram illustrating a cross-sectional view of an SiC semiconductor device according to a ninth embodiment taken along a line corresponding to line XXXIA-XXXIA in FIG. 28;

FIG. 38B is a diagram illustrating a cross-sectional view of the SiC semiconductor device according to the ninth embodiment taken along a line corresponding to line XXXIB-XXXIB in FIG. 28;

DETAILED DESCRIPTION OF THE EXEMPLARY EMBODIMENTS

First Embodiment

An SiC semiconductor device according to a first embodiment of the present invention will now be described with reference to FIG. 1 to FIG. 2D. The SiC semiconductor device includes a plurality of accumulation type MOSFETs, for example.

Figure 1:
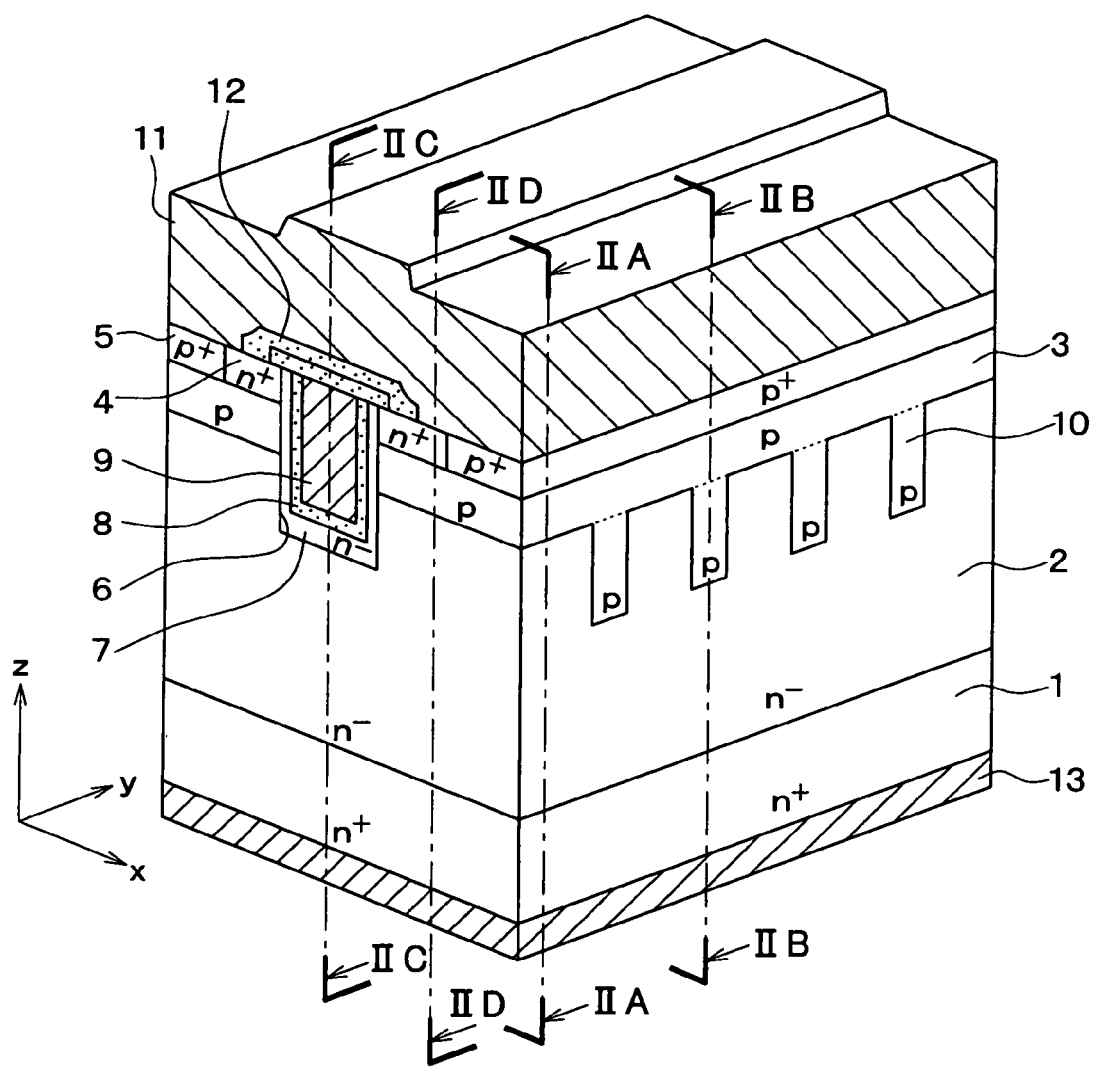
FIG. 1 is a diagram illustrating a perspective cross-sectional view of a MOSFET in an SiC semiconductor device according to a first embodiment.
Figure 2A:
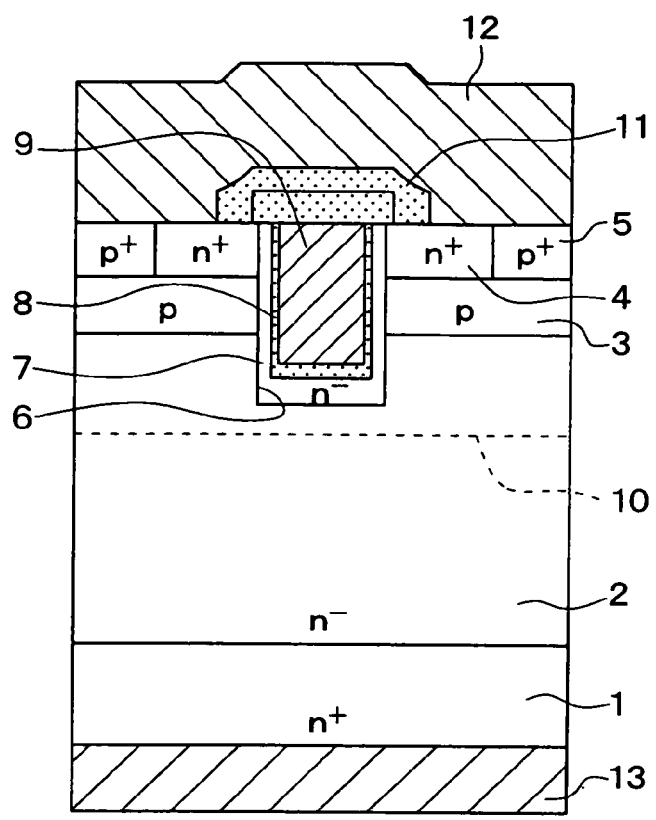
FIG. 2A is a diagram illustrating a cross-sectional view of the MOSFET taken along line IIA-IIA in FIG. 1.
Figure 2B:
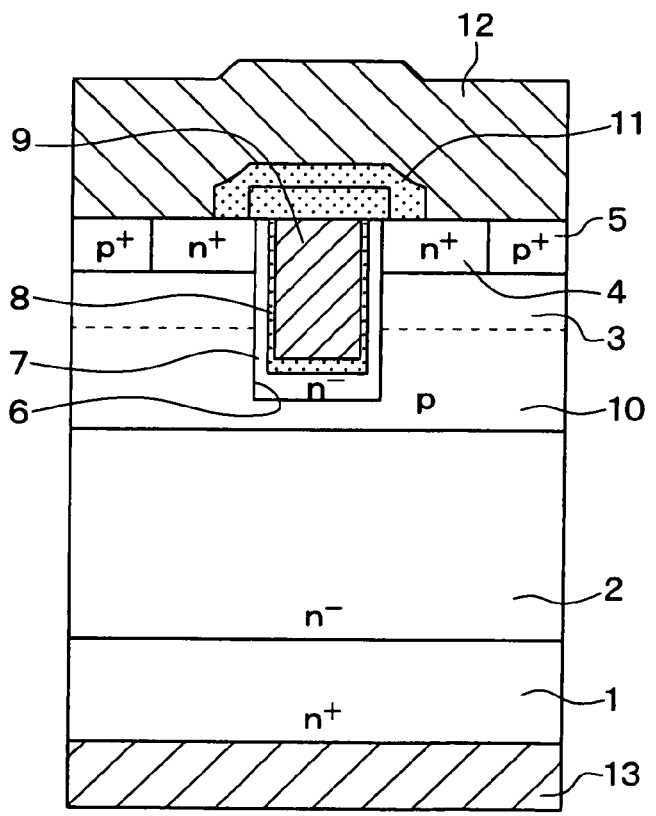
FIG. 2B is a diagram illustrating a cross-sectional view of the MOSFET taken along line IIB-IIB in FIG. 1.
Figure 2C:
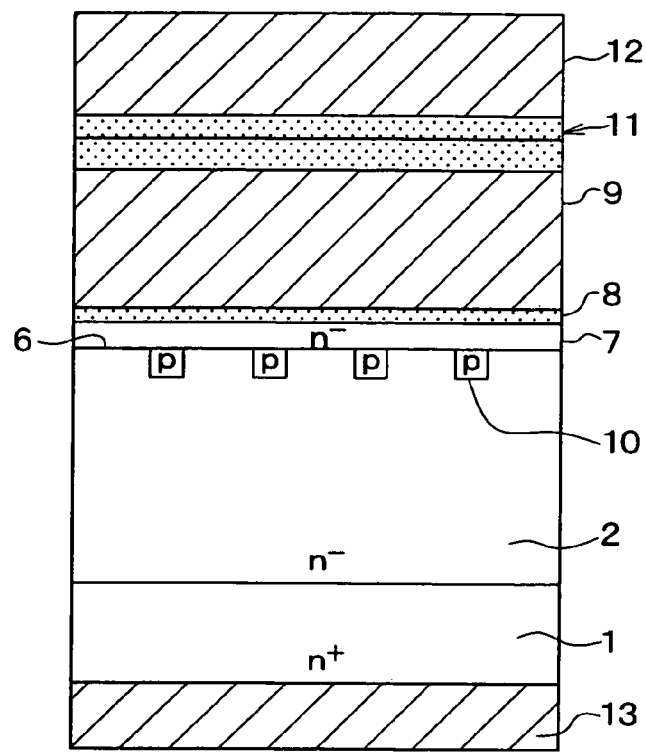
FIG. 2C is a diagram illustrating a cross-sectional view of the MOSFET taken along line IIC-IIC in FIG. 1.
Figure 2D:
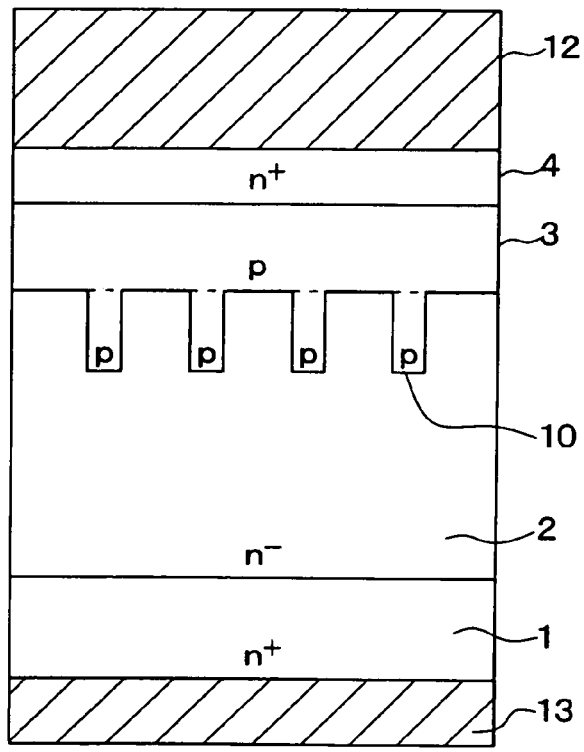
FIG. 2D is a diagram illustrating a cross-sectional view of the MOSFET taken along line IID-IID in FIG. 1.

One of the MOSFETs is illustrated in FIG. 1. In the SiC semiconductor device, the MOSFETs are arranged in a plurality of rows so as to be adjacent to each other.

The MOSFET includes an N+ type substrate 1 made of SiC. The N+ type substrate 1 includes, for example, phosphorus as N type impurities. An impurity concentration of the N+ type substrate 1 is, for example, about $1.0 \times 10^{19}$ cm$^{-3}$. The N+ type substrate 1 has a thickness of, for example, about 300 µm. On a front surface of the N+ type substrate 1, an N− type drift layer 2 made of SiC is located. The N− type drift layer 2 includes, for example, phosphorus as N type impurities. An impurity concentration of the N− type drift layer 2 is, for example, between about $3.0 \times 10^{15}$ cm$^{-3}$ and about $7.0 \times 10^{15}$ cm$^{-3}$. The N− type drift layer 2 has a thickness, for example, between about 10 µm and about 15 µm. The impurity concentration of the N− type drift layer 2 may be substantially constant in a thickness direction of the N− type drift layer 2. Alternatively, the impurity concentration of the N− type drift layer 2 may be varied in the thickness direction of the N− type drift layer 2. For example, the impurity concentration of the N− type drift layer 2 may decrease toward a side away from the front surface of the N+ type substrate 1. The impurity concentration of a portion of the N− type drift layer 2 at a distance between about 3 µm and about 5 µm from the front surface of the N+ type substrate 1 may be greater than the impurity concentration of the other portion of the N− type drift layer 2 by about $2.0 \times 10^{15}$ cm$^{-3}$. In the present case, an internal resistance of the N− type drift layer 2 can be reduced. Thus, an on-resistance of the MOSFET can be reduced.

At a surface portion of the N− type drift layer 2, a P type base region 3 is located. At a surface portion of the P type base region 3, an N+ type source region 4 and a P+ type body layer 5 are located.

The P type base region 3 includes, for example, boron or aluminum, as P type impurities. An impurity concentration of the P type base region 3 is, for example, between about $5.0 \times 10^{16}$ cm$^{-3}$ and about $2.0 \times 10^{19}$ cm$^{-3}$. The P type base region 3 has a thickness of, for example, about 2.0 µm. The P type base region 3 sandwiches a trench 6. The N+ type source region 4 includes, for example, phosphorus as N type impurities. An impurity concentration of a surface portion of the N+ type source region 4 is, for example, about $1.0 \times 10^{21}$ cm$^{-3}$. The N+ type source region 4 has a thickness of, for example, about 0.3 µm. The P+ type body layer 5 includes, for example, boron or aluminum as P type impurities. An impurity concentration of a surface portion of the P+ type body layer 5 is, for example, about $1.0 \times 10^{21}$ cm$^{-3}$. The P+ type body layer 5 has a thickness of, for example, about 0.3 µm. The N+ type source region 4 sandwiches the trench 6. The P+ type body layer 5 sandwiches the N+ type source region 4 and the trench 6.

The trench 6 penetrates the N+ type source region 4 and the P type base region 3 to the N− type drift layer 2. The trench 6 has a width between about 1.4 µm and about 2.0 µm and has a depth greater than or equal to about 2.0 µm such as, for example, about 2.4 µm. A sidewall of the trench 6 is in contact with the P type base region 3 and the N+ type source region 4. On a surface of the sidewall of the trench 6, an N type channel layer 7 is located. The N type channel layer 7 includes, for example, phosphorus as N type impurities. An impurity concentration of the N type channel layer 7 is about $1.0 \times 10^{16}$ cm$^{-3}$, for example. The N type channel layer 7 provides a channel region. A thickness of the N type channel layer 7 is set so that the MOSFET becomes normally-off type. For example, the N type channel layer 7 has a thickness between about 0.3 µm and about 1.0 µm at a bottom portion the trench 6 and has a thickness between about 0.1 µm and about 0.3 µm on the sidewall of the trench 6.

A surface of the N type channel layer 7 is covered with a gate oxide layer 8. On a surface of the gate oxide layer 8, a gate electrode 9 made of doped polysilicon is located so as to fill the trench 6. The gate oxide layer 8 is formed by thermally oxidizing the surface of the N type channel layer 7. The gate oxide layer 8 has a thickness of about 100 nm at the bottom portion and the sidewall of the trench 6.

The trench 6, the N+ type source region 4, and the P+ type body layer 5 are formed along a y-direction illustrated in FIG. 1. The MOSFETs are arranged in an x-direction approximately perpendicular to the y-direction.

In the N− type drift layer 2, a plurality of P type deep layers 10 is located under the P type base region 3. The P type deep layers 10 are formed along an approximately normal direction to the sidewall of the trench 6 where the channel region is provided. That is, the P type deep layers 10 are formed along the x-direction approximately perpendicular to a longitudinal direction of the trench 6. The P type deep layers 10 extend to a depth deeper than the bottom portion the trench 6, that is, a bottom portion of the N type channel layer 7. For example, the P type deep layers 10 extend to a portion between about 2.6 µm and about 3.0 µm from the front surface of the N− type drift layer 2, that is, between about 0.6 µm and about 1.0 µm from a bottom portion of the P type base region 3. A width of each of the P type deep layers 10 in the y-direction is, for example, between about 0.6 µm and about 1.0 µm. The P type deep layers 10 include, for example, boron or aluminum as P type impurities. An impurity concentration of the P type deep layers 10 is, for example, between about $1.0 \times 10^{17}$ cm$^{-3}$ and about $1.0 \times 10^{19}$ cm$^{-3}$. The P type deep layers 10 are arranged in the longitudinal direction of the trench 6 so as to be parallel to each other. A distance between the adjacent P type deep layers 10 is, for example, between about 2 µm and about 3 µm.

A source electrode 11 and a gate wiring (not shown) are located on surfaces of the N+ type source region 4, the P+ type body layer 5, and the gate electrode 9. The source electrode 11 and the gate wiring are made of a plurality of metals, for example, an alloy of nickel and aluminum. At least portions of the source electrode 11 and the gate wiring being in contact with an N type SiC are made of a metal that can provide an ohmic connection between each of the source electrode 11 and the gate wiring and the N type SiC. The N type SiC includes the N+ type source region 4 and the gate electrode 9 if the gate electrode 9 includes N type impurities. At least portions of the source electrode 11 and the gate wiring being in contact with a P type SiC are made of a metal that can provide an ohmic connection between each of the source electrode 11 and the gate wiring and the P type SiC. The P type SiC includes the P+ type body layer 5 and the gate electrode 9 if the gate electrode 9 includes P type impurities. The source electrode 11 and the gate wiring are located on an interlayer insulating layer 12. Thus, the source electrode 11 and the gate wiring are electrically insulated. The source electrode 11 is electrically coupled with the N+ type source region 4 and the P+ type body layer 5 through contact holes provided in the interlayer insulating layer 12. The gate wiring is electrically coupled with the gate electrode 9 though a contact hole provided in the interlayer insulating layer 12.

On a rear surface of the N+ type substrate 1, a drain electrode 13 is located. The drain electrode 13 is electrically coupled with the N+ type substrate 1. Thereby, the N channel accumulation type MOSFET having a trench gate structure is formed.

The MOSFET may be operated, for example, as described below. When an impurity concentration of SiC is high, for example, about $1.0 \times 10^{19}$ cm$^{-3}$, the SiC has an internal voltage of about 3 V. Thus, before a gate voltage is applied to the gate electrode 9, the P type base region 3 acts as if the P type base region 3 has a voltage of about −3 V even when a voltage of the source electrode is 0 V. Thus, a depletion layer expands from the P type base region 3, and a region located adjacent to the P type base region 3 acts like an insulator. Accordingly, even if a positive voltage is applied to the drain electrode 13, the N type channel layer 7 acts like an insulator. Thus, electrons cannot reach the N type channel layer 7 and electric current does not flow between the source electrode 11 and the drain electrode 13.

When the MOSFET is deactivated, for example, when the gate voltage is 0 V, the drain voltage is about 650 V, and the source voltage is 0 V, even if a voltage is applied to the drain electrode 13, the voltage creates a reverse bias. Thus, the depletion layer expands from a region between the P type base region 3 and the N− type drift layer 2 and a region between the P type base region 3 and the N type channel layer 7. The impurity concentration of the P type base region 3 is much greater than the impurity concentration of the N− type drift layer 2. Thus, the depletion layer expands toward the N− type drift layer 2. For example, when the impurity concentration of the P type base region 3 is set to be about ten times greater than the impurity concentration of the N− type drift layer 2, the depletion layer expands about 0.7 μm toward the P type base region 3 and about 7.0 μm toward the N− type drift layer 2. The thickness of the P type base region 3 is about 2.0 μm and is greater than an expanding amount of the depletion layer. Thus, a punch through can be prevented. Because the depletion layer expands more than a case where the drain voltage is 0 V, the region that acts like an insulator expands. Thus, electric current does not flow between the source electrode 11 and the drain electrode 13.

Because the gate voltage is 0 V, an electric field is applied between the drain electrode 13 and the gate electrode 9. Thus, an electric field concentration can possibly occur at the bottom portion of the gate oxide layer 8. The SiC semiconductor device according to the present embodiment includes the P type deep layers 10 that are deeper than the trench 6. The depletion layer expands toward the N− type drift layer 2 at the PN junction between the P type deep layers 10 and the N− type drift layer 2. Thus, a high voltage due to the drain voltage is difficult to enter the gate oxide layer 8. When the impurity concentration of the P type deep layers 10 is set to be greater than the impurity concentration of the P type base region 3, an expanding amount of the depletion layer toward the N− type drift layer 2 increases. Thereby, an electric field concentration in the gate oxide layer 8, especially, the electric field concentration in the gate oxide layer 8 at the bottom portion of the trench 6 can be reduced. As a result, a damage of the gate oxide layer 8 can be reduced.

According to a simulation by the inventors, when a voltage of about 650 V is applied to the drain electrode 13, an electric field strength of the gate oxide layer 8 at the bottom portion of the trench 6 is about 2.0 MV/cm, which is a level that the gate oxide layer 8 is not broken. Thus, the gate oxide layer 8 is not broken even when the voltage of about 650 V is applied to the drain electrode 13.

When the MOSFET is activated, for example, when the gate voltage is about 20 V, the drain voltage is about 1 V, and the source voltage is 0 V, the gate electrode 9 is applied with the gate voltage of about 20 V. Thus, the N type channel layer 7 can function as an accumulation channel. Thus, electrons induced from the source electrode 11 flow to the N− type drift layer 2 through the N+ type source region 4 and the N type channel layer 7. Thereby, electric current flows between the source electrode 11 and the drain electrode 13.

According to a calculation by the inventors, an on-resistance of the SiC semiconductor device according to the present embodiment is about 4.9 mΩ·cm$^2$ and an on-resistance of an SiC semiconductor device without the P type deep layers 10 is about 4.3 mΩ·cm$^2$. Thus, the on-resistance increases by about 15% by providing the P type deep layers 10. The on-resistance increases because a channel is not formed on the sidewall of the trench 6 at portions where the P type deep layers 10 are formed. However, the increase of the on-resistance is not so large and can be controlled by changing the width of the P type deep layers 10 and the intervals of the P type deep layers 10. Thus, the increase of the on-resistance does not become an issue.

Figure 3A:
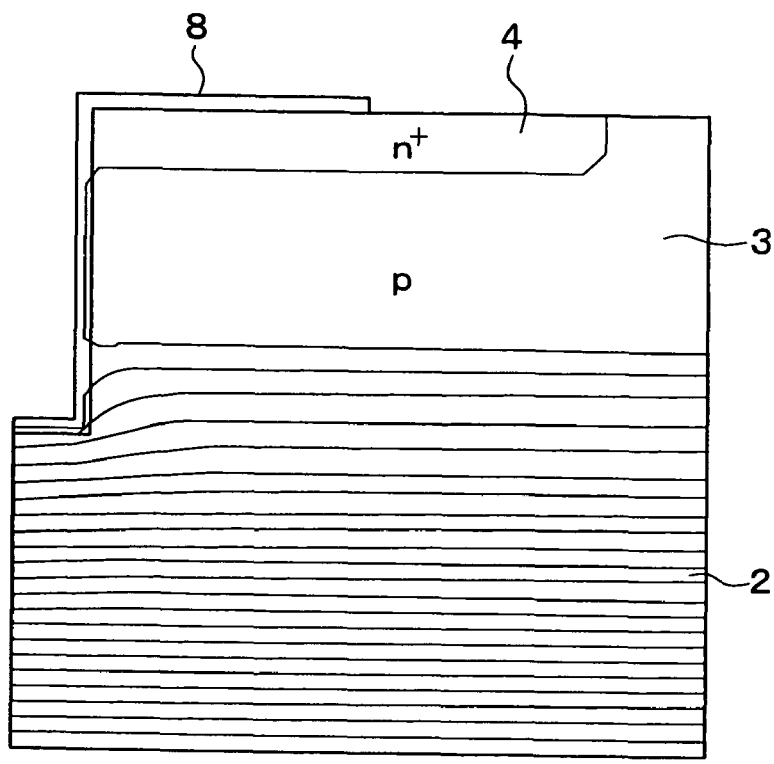
FIG. 3A is a diagram illustrating an electric potential distribution in a cross section of an SiC semiconductor device including deep layers.
Figure 3B:
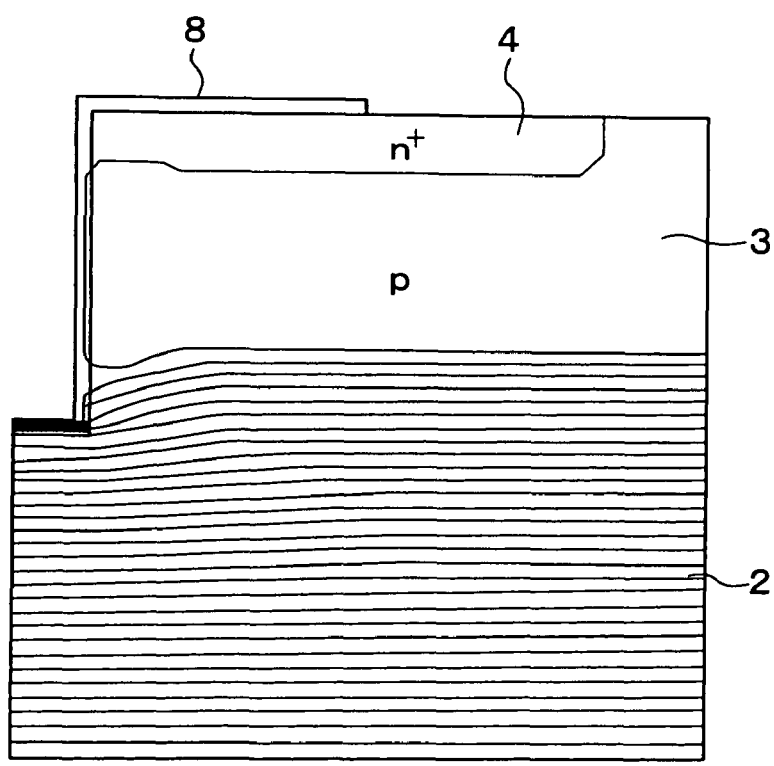
FIG. 3B is a diagram illustrating an electric potential distribution in a cross section of an SiC semiconductor device without deep layers.
Figure 4:
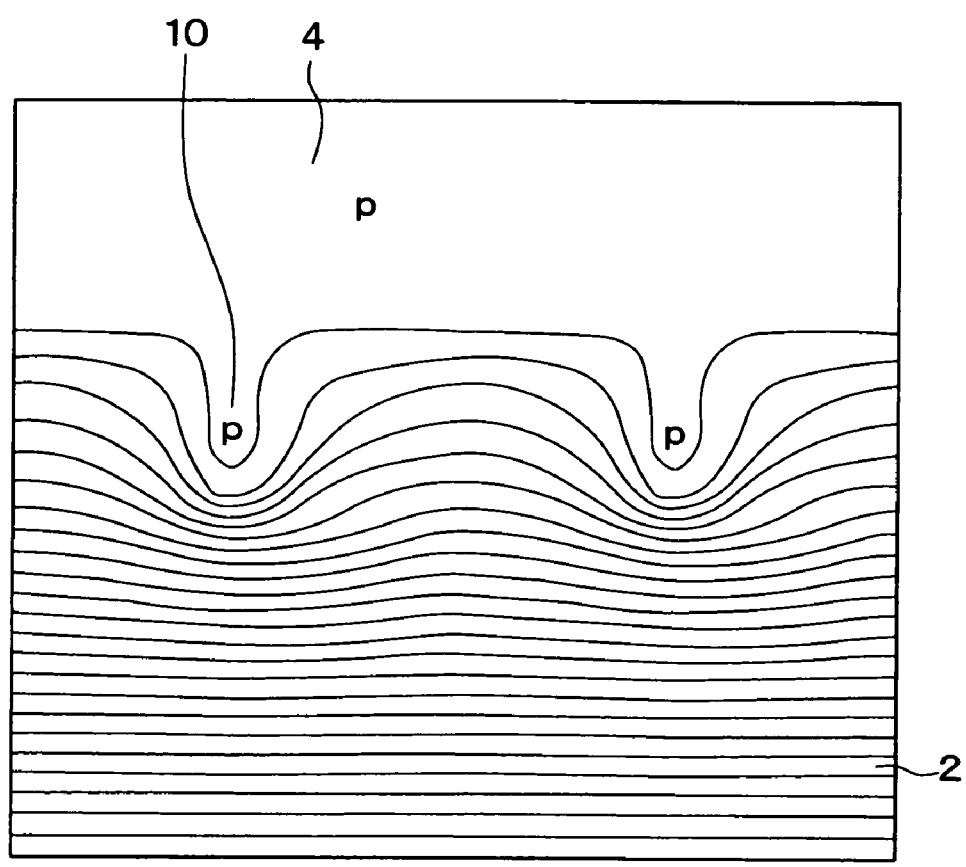
FIG. 4 is a diagram illustrating an electric potential distribution in another cross section of the SiC semiconductor device including the deep layers.

An electric potential distribution at a time when a voltage of about 650 V is applied to the drain electrode 13 can be simulated as was demonstrated by the inventors. A simulated electric potential distribution in a cross section of an SiC semiconductor device including the P type deep layers 10 is illustrated in FIG. 3A. A simulated electric potential distribution in a cross section of an SiC semiconductor device without the P type deep layers 10 is illustrated in FIG. 3B. Each of the cross sections is taken along a line corresponding to line IIA-IIA in FIG. 1. A voltage at the P type base region 3 and front surfaces of the P type deep layers 10 is set to be 0 V. Equipotential lines are illustrated at 10 V intervals. In addition, a simulated electric potential distribution in another cross section of the SiC semiconductor device including the P type deep layers 10 is illustrated in FIG. 4. The cross section is taken along a line corresponding to line IID-IID in FIG. 1.

In the SiC semiconductor device without the P type deep layers 10, intervals between the equipotential lines are narrow in the gate oxide layer 8, especially at the bottom portion of the trench 6 as illustrated in FIG. 3B. In this case, the electric field in the gate oxide layer 8 is about 4.9 MV/cm. In the SiC semiconductor device including the P type deep layers 10, the equipotential lines are pressed down by the P type deep layers 10 as illustrated in FIG. 4. Thus, intervals between the equipotential lines are broaden in the gate oxide layer 8 at the sidewall and the bottom portion of the trench 6 as illustrated in FIG. 3A. In this case, the electric field in the gate oxide layer 8 is about 2.0 MV/cm as described above. Thus, the electric field is reduced to less than half of the electric filed in the SiC semiconductor device without the P type deep layers 10. As a result, the electric field concentration in the gate oxide layer 8 can be reduced by providing the P type deep layers 10.

An exemplary method of manufacturing the MOSFET illustrated in FIG. 1 will now be described with reference to FIG. 5A to FIG. 6F. During a process illustrated in FIG. 5A and FIG. 5B, the N+ type substrate 1 made of SiC is prepared, The concentration of the N type impurity in the N+ type substrate 1 is about $1.0 \times 10^{19}$ cm$^{-3}$, for example. The thickness of the N+ type substrate 1 is about 300 μm, for example. On the rear surface of the N+ type substrate 1, the drain electrode 13 is formed. On the front surface of the N+ type substrate 1, the N− type drift layer 2 is epitaxially formed. The concentration of the N type impurity in the N− type drift layer 2 is between about $3.0 \times 10^{15}$ cm$^{-3}$ and about $7.0 \times 10^{15}$ cm$^{-3}$, for example. The thickness of the N− type drift layer 2 is about 15 μm.

Figure 5A:
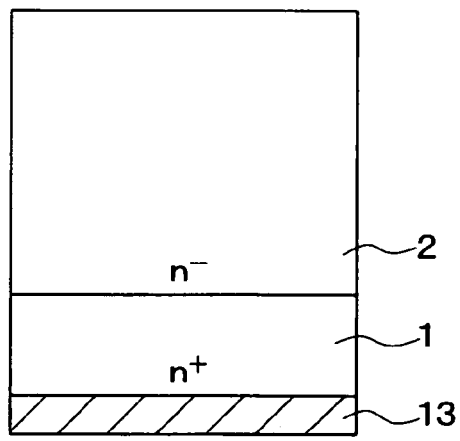
FIG. 5A, FIG. 5C, FIG. 5E, FIG. 6A, FIG. 6C, and FIG. 6E are diagrams illustrating cross-sectional views of an exemplary manufacturing process of the MOSFET taken along line IIA-IIA in FIG. 1.
Figure 5B:
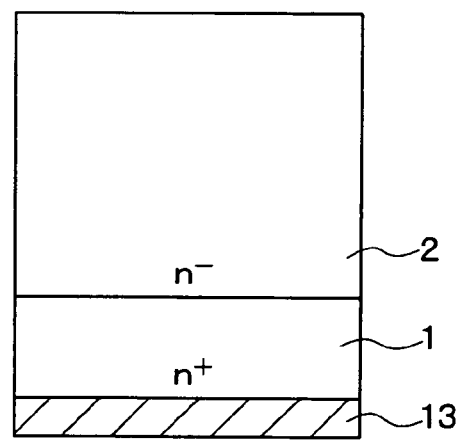
FIG. 5B, FIG. 5D, FIG. 5F, FIG. 6B, FIG. 6D, and FIG. 6F are diagrams illustrating cross-sectional views of the exemplary manufacturing process of the MOSFET taken along line IID-IID in FIG. 1.
Figure 5C:
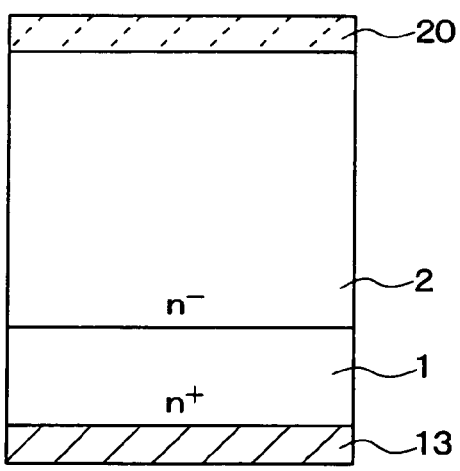
Figure 5D:
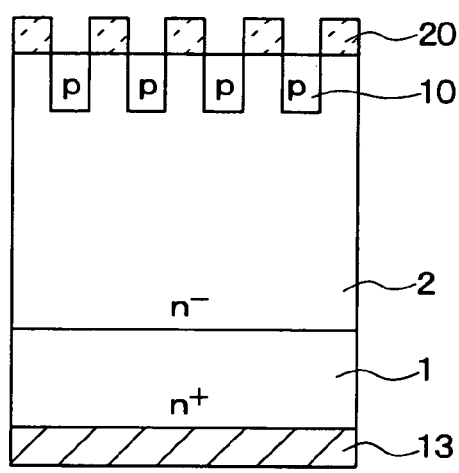

During a process illustrated in FIGS. 5C and 5D, a mask 20 is formed on the front surface of the N− type drift layer 2. The mask 20 is made of low temperature oxide (LTO), for example. Then, opening portions are provided in the mask 20 by a photolithography process. The opening portions are provided at regions where the P type deep layers 10 will be formed. The P type impurities are ion-implanted through the mask 20 and are activated. Thereby, the P type deep layers 10 are formed. The P type impurities are boron or aluminum, for example. The impurity concentration in the P type deep layers 10 is between about $1.0 \times 10^{17}$ cm$^{-3}$ and about $1.0 \times 10^{19}$ cm$^{-3}$, for example. The thickness of the P type deep layers 10 is between about 0.6 μm and about 1.0 μm, for example. The width of the P type deep layers 10 is between about 0.6 μm and about 1.0 μm. After forming the P type deep layers 10, the mask 20 is removed.

Figure 5E:
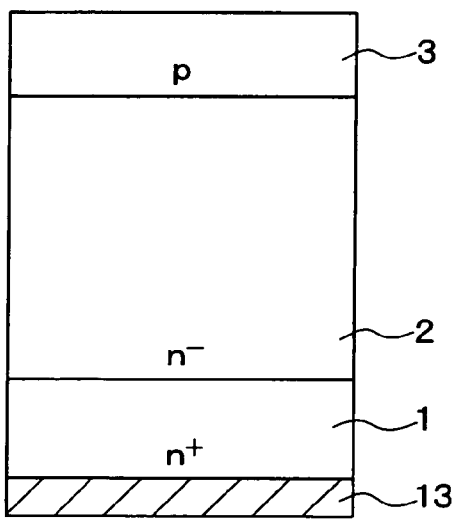
Figure 5F:
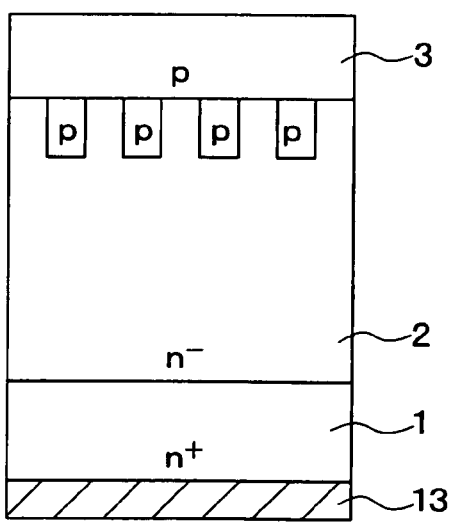

During a process illustrated in FIG. 5E and FIG. 5F, the P type base region 3 is formed on the N− type drift layer 2. The impurity concentration in the P type base region 3 is between about $5.0 \times 10^{16}$ cm$^{-3}$ and about $2.0 \times 10^{19}$ cm$^{-3}$, for example. The thickness of the P type base region 3 is about 2.0 μm, for example.

Figure 6A:
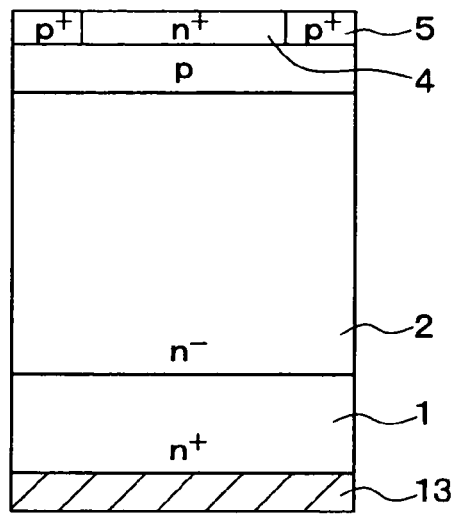
Figure 6B:
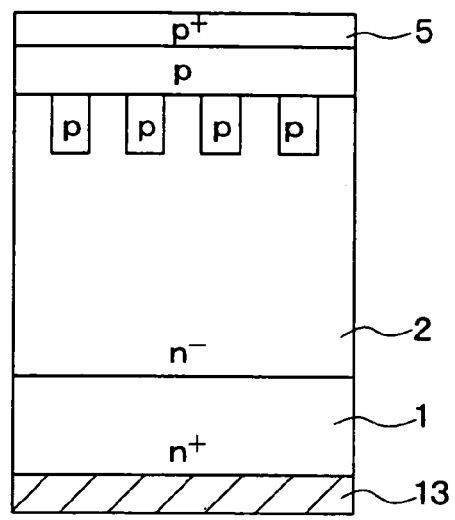

During a process illustrated in FIGS. 6A and 6B, a first mask (not shown), for example, made of LTO is formed. Then, an opening portion is provided in the first mask by a photolithography process. The opening portion is provided at a portion where the N+ type source region 4 will be formed. Then, the N type impurities are ion-implanted. The N type impurities include nitrogen, for example. After removing the first mask, a second mask, for example, made of LTO is formed. An opening portion is provided in the second mask by a photolithography process. The opening portion is provided at a portion where the P+ type body layer 5 will be formed. Then, the P type impurities are ion-implanted. The P type impurities include nitrogen, for example. The implanted ions are activated. Thereby, the N+ type source region 4 and the P+ type body layer 5 are formed. The impurity concentration at the surface portion of the N+ type source region 4 is about $1.0 \times 10^{21}$ cm$^{-3}$ and the thickness of the N+ type source region 4 is about 0.3 μm, for example. The impurity concentration at the surface portion of the P+ type body layer 5 is about $1.0 \times 10^{21}$ cm$^{-3}$ and the thickness of the P+ type body layer 5 is about 0.3 μm, for example. After forming the P+ type body layer 5, the second mask is removed.

Figure 6C:
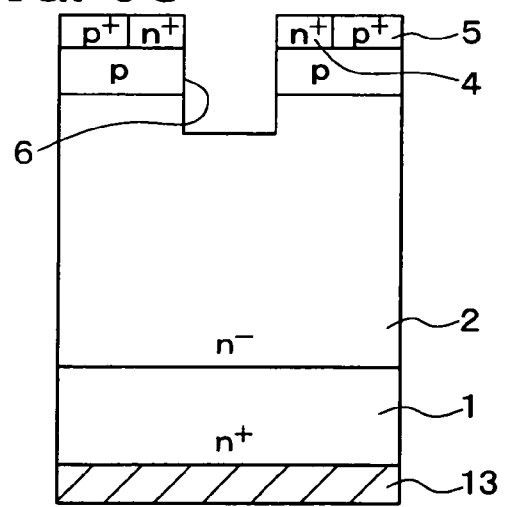
Figure 6D:
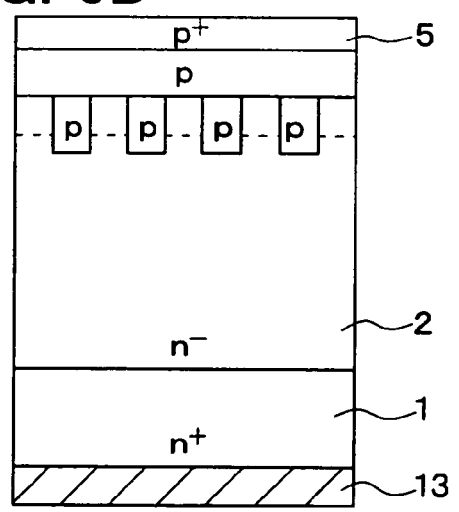

During a process illustrated in FIG. 6C and FIG. 6D, an etching mask (not shown) is formed on the N+ type source region 4 and the P+ type body layer 5. An opening portion is provided in the etching mask so that a region where the trench 6 will be provided is open. Then, an anisotropic etching process is performed using the etching mask. After that, an isotropic etching process and/or a sacrificial oxidation are performed if needed. Thereby, the trench 6 is provided. Then, the etching mask is removed.

Figure 6E:
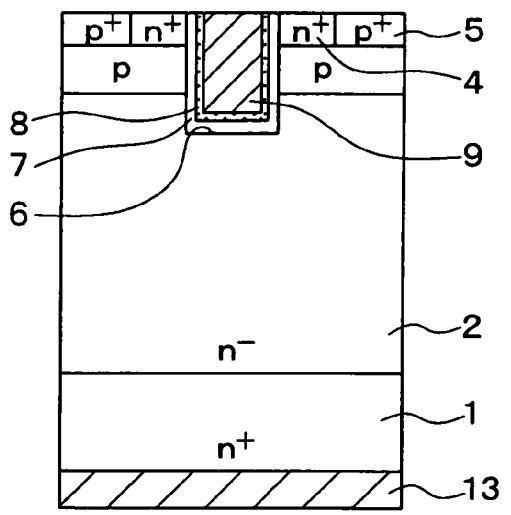
Figure 6F:
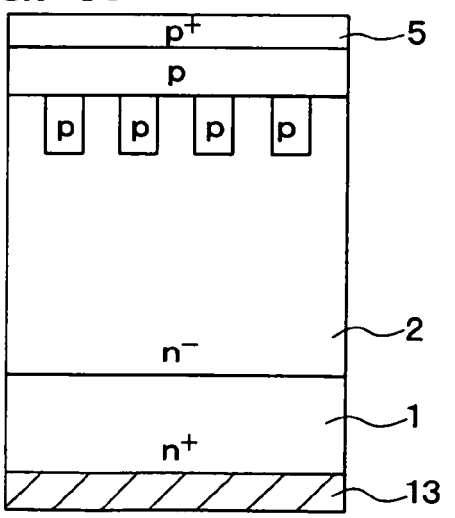

During a process illustrated in FIG. 6E and FIG. 6F, the N type channel layer 7 is epitaxially formed on the whole area of the surface of the substrate. The concentration of the N type impurities in the N type channel layer 7 is about $1.0 \times 10^{16}$ cm$^{-3}$, for example. Due to a plane direction dependence of the epitaxial growth, the N type channel layer 7 at the bottom portion of the trench 6 becomes thicker than the N type channel layer 7 on the sidewall of the trench 6. Then, unnecessary portion of the N type channel layer 7, that is, portion of the N type channel layer 7 formed on the P type base region 3, the N+ type source region 4, and the P+ type body layer 5 are removed. The gate oxide layer 8 is formed by thermal oxidation in a wet atmosphere, for example.

A polysilicon layer doped with the N type impurities is formed on the surface of the gate oxide layer 8, for example, at 600 degrees centigrade so as to have a thickness of about 440 nm. Then, an etch back process is performed so that the gate oxide layer 8 and the gate electrode 9 remain in the trench 6.

A process after forming the gate oxide layer 8 and the gate electrode 9 are similar to a known process. Therefore, the process after forming the gate oxide layer 8 and the gate electrode 9 is not illustrated. The interlayer insulating layer 12 is formed and the contact holes extending to corresponding ones of the N+ type source region 4 and the P+ type body layer 5 are provided in a cross section of the interlayer insulating layer 12. In addition, the contact hole extending to the gate electrode 9 is provided in another cross section of the interlayer insulating layer 12. A layer of an electrode material is formed on the interlayer insulating layer 12 so as to fill the contact holes and is pattern-formed. Thereby, the source electrode 11 and the gate wiring are formed and the MOSFET illustrated in FIG. 1 is formed.

In the present manufacturing method, the P type deep layers 10 are not formed by providing trenches and epitaxially forming P type layers so as to fill the trenches. Thus, a planarization process after forming the P type layers is not required. As a result, a crystal defect, which can possibly generate due to the planarization process, can be prevented.

In the present manufacturing method, the P type deep layers 10 are formed by the ion implantation from the surface of the N− type drift layer 2. Alternatively, the ion implantation may be performed from the surface of the P type base region 3. When the ion implantation is performed from the surface of the N− type drift layer 2, the ion implantation does not require a high energy compared with a case where the ion implantation is performed from the surface of the P type base region 3. Thus, a crystal defect, which can possibly be generated due to an ion implantation with a high energy, can be prevented.

In a case where the longitudinal direction of the trench 6 and the longitudinal direction of the P type deep layers 10 are parallel to each other, a device property is affected by a variation in a distance between the trench 6 and the P type deep layers 10. Thus, a mask for providing the trench 6 and a mask for providing the P type deep layers 10 are required to be positioned with a high degree of accuracy. However, it is inevitable that the masks can possibly be out of alignment. Thus, an effect of a misalignment of the masks on the device property cannot be completely prevented. In the SiC semiconductor device according to the present embodiment, the longitudinal direction of the trench 6 and the longitudinal direction of the P type deep layers 10 are approximately perpendicular to each other. Thus, the device property is not affected by the misalignment of the masks. Thereby, a variation in a production property can be reduced and a yield can be improved.

Second Embodiment

Figure 7:
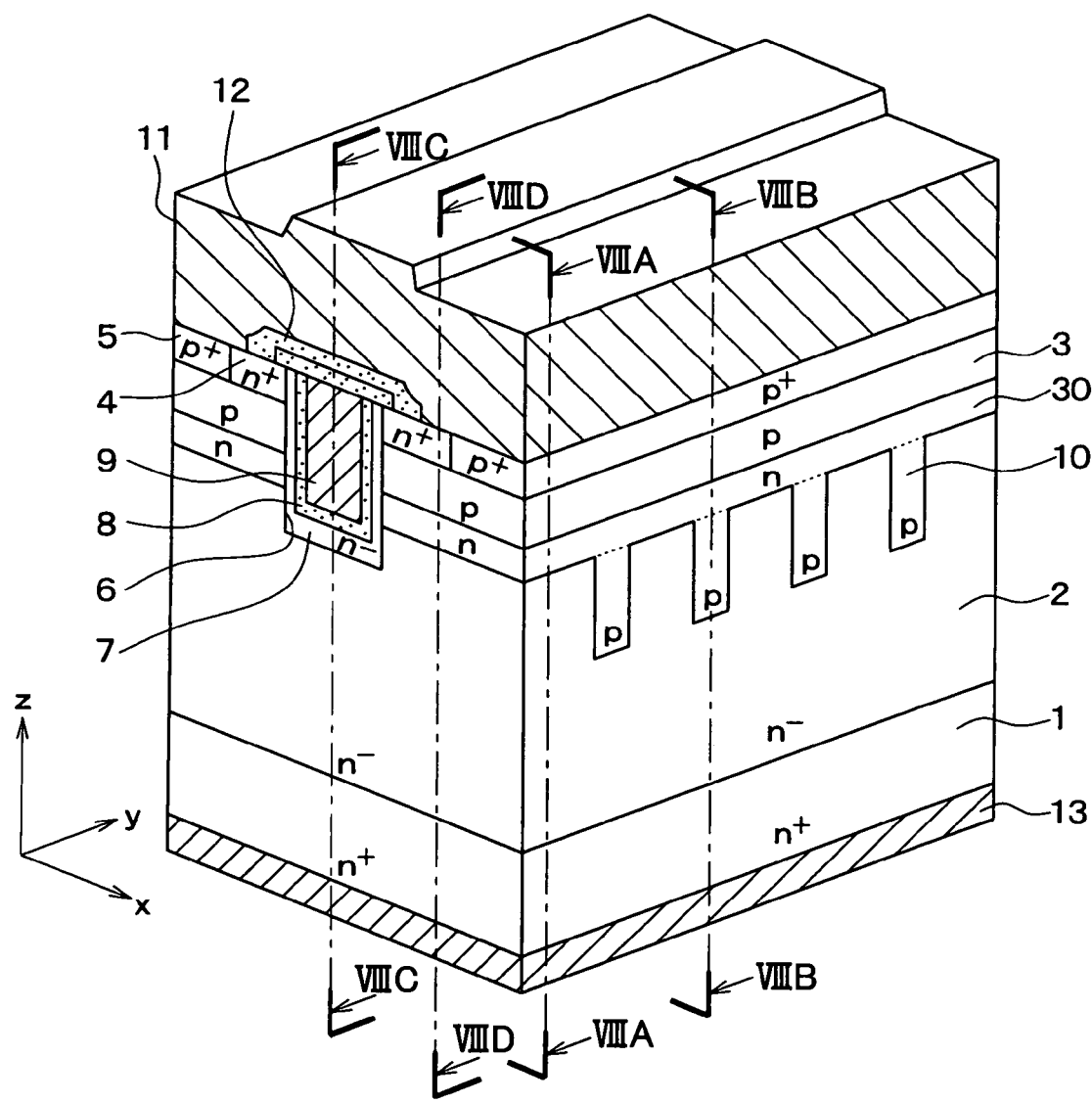
FIG. 7 is a diagram illustrating perspective cross-sectional view of a MOSFET in an SiC semiconductor device according to a second embodiment.
Figure 8A:
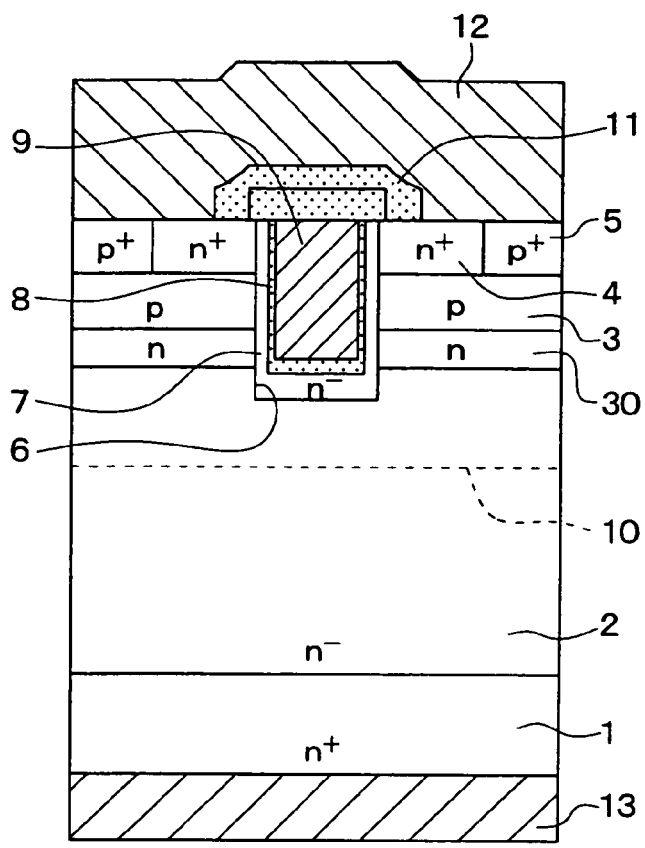
FIG. 8A is a diagram illustrating a cross-sectional view of the MOSFET taken along line VIIIA-VIIIA in FIG. 7.
Figure 8B:
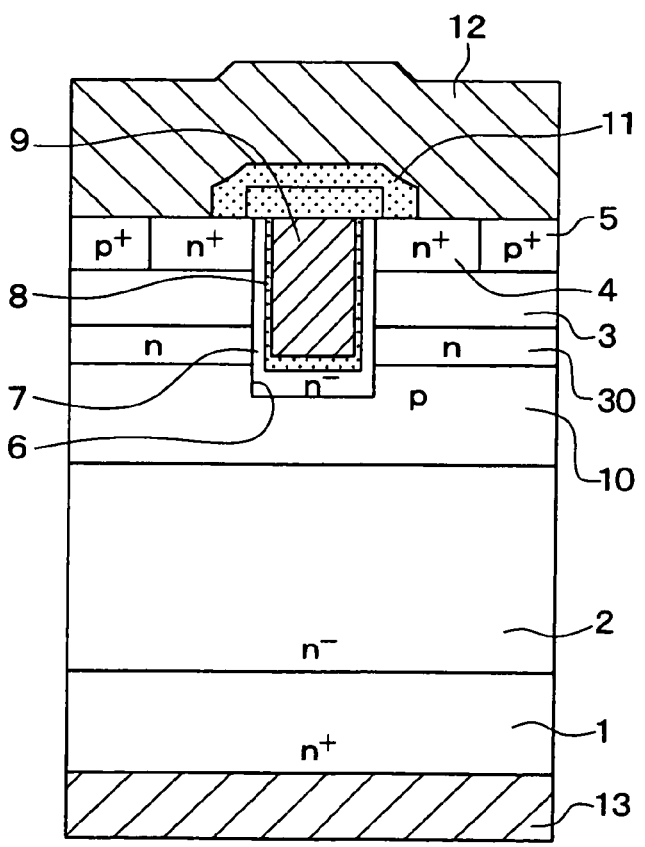
FIG. 8B is a diagram illustrating a cross-sectional view of the MOSFET taken along line VIIIB-VIIIB in FIG. 7.
Figure 8C:
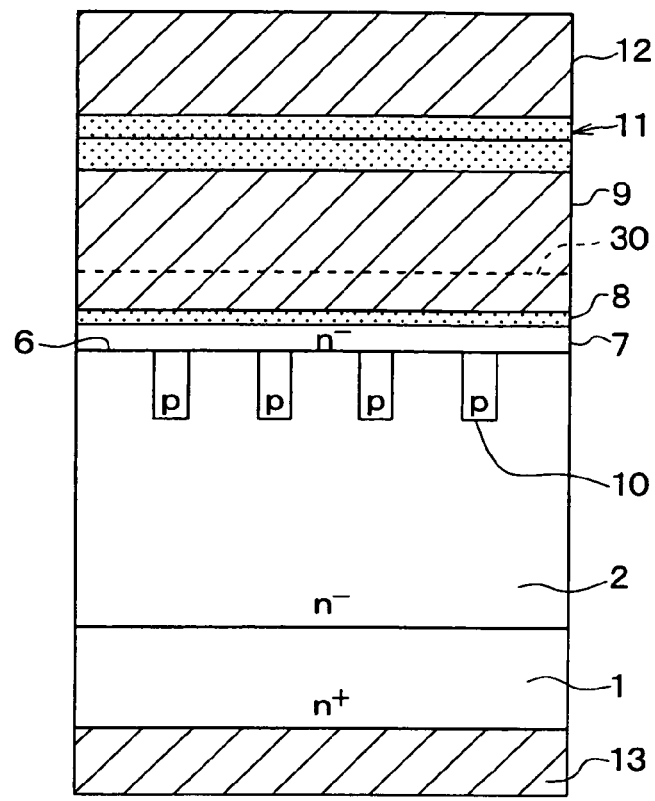
FIG. 8C is a diagram illustrating a cross-sectional view of the MOSFET taken along line VIIIC-VIIIC in FIG. 7.
Figure 8D:
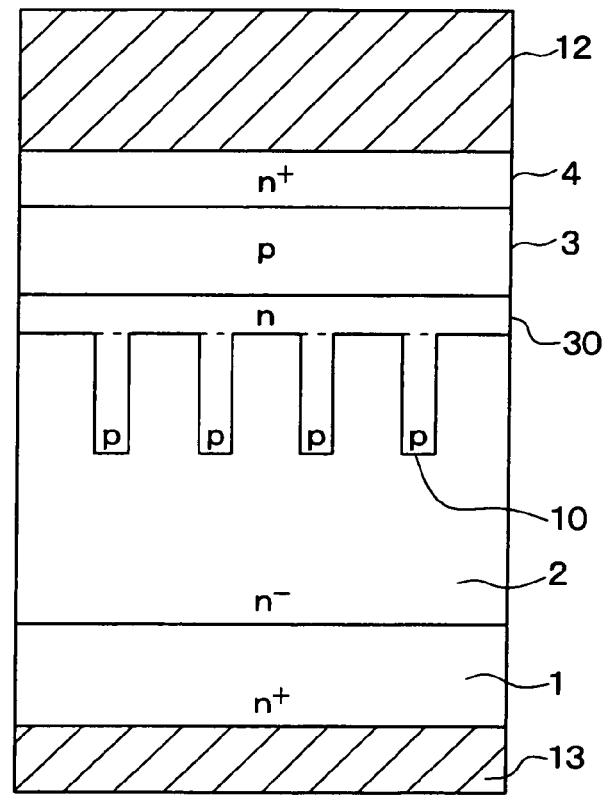
FIG. 8D is a diagram illustrating a cross-sectional view of the MOSFET taken along line VIIID-VIIID in FIG. 7.
Figure 9A:
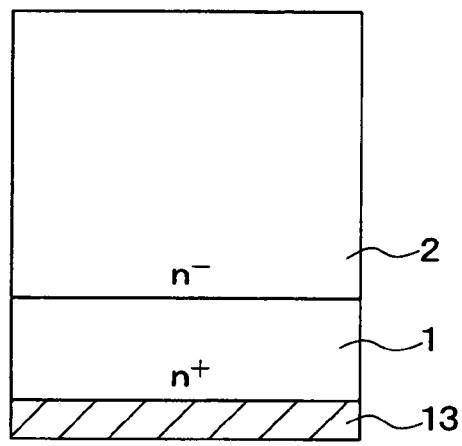
FIG. 9A, FIG. 9C, FIG. 9E, FIG. 10A, FIG. 10C, and FIG. 10E are diagrams illustrating cross-sectional views of an exemplary manufacturing process of the MOSFET taken along line VIIIA-VIIIA in FIG. 7.
Figure 9B:
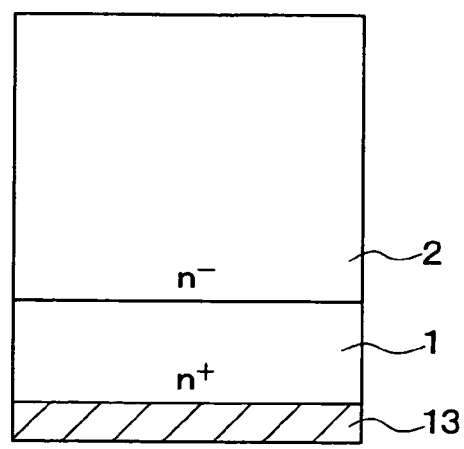
FIG. 9B, FIG. 9D, FIG. 9F, FIG. 10B, FIG. 10D, and FIG. 10F are diagrams illustrating cross-sectional views of the exemplary manufacturing process of the MOSFET taken along line VIIID-VIIID in FIG. 7.
Figure 9C:
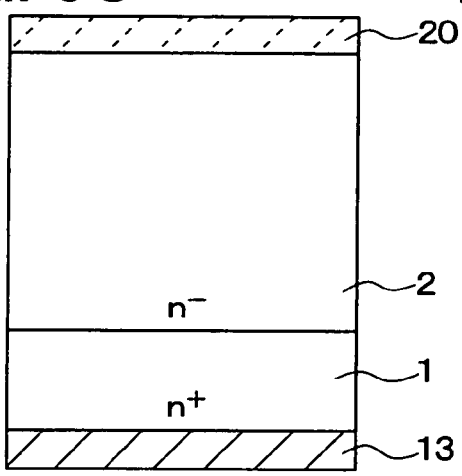
Figure 9D:
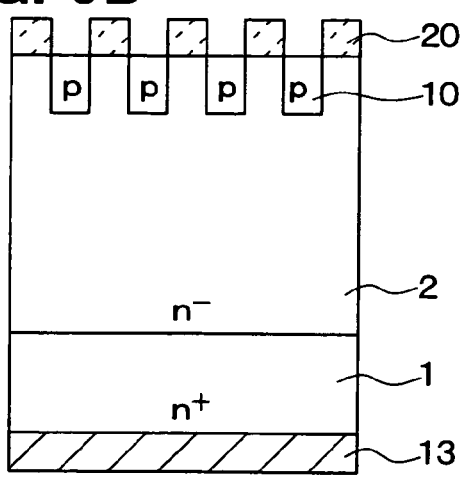
Figure 9E:
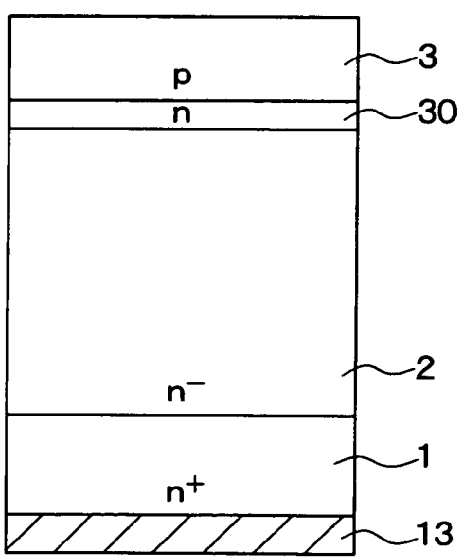
Figure 9F:
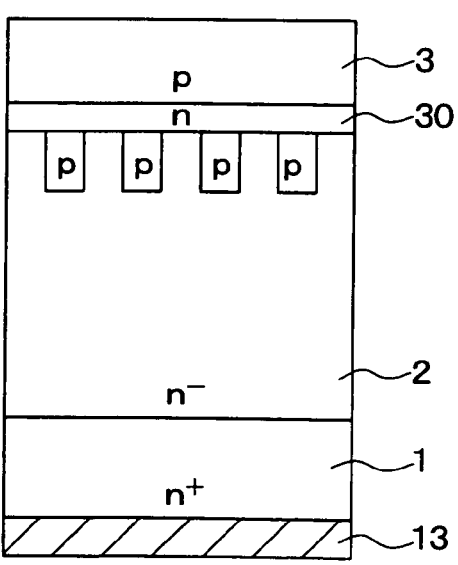
Figure 10A:
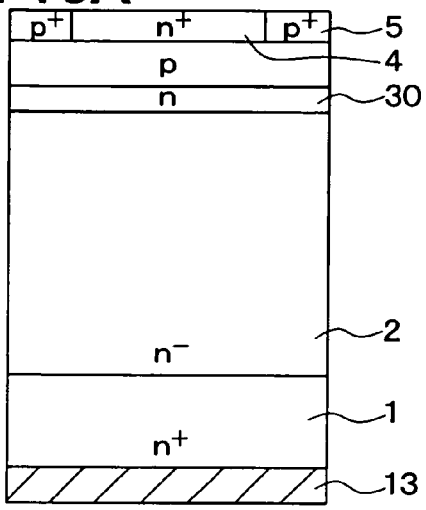
Figure 10B:
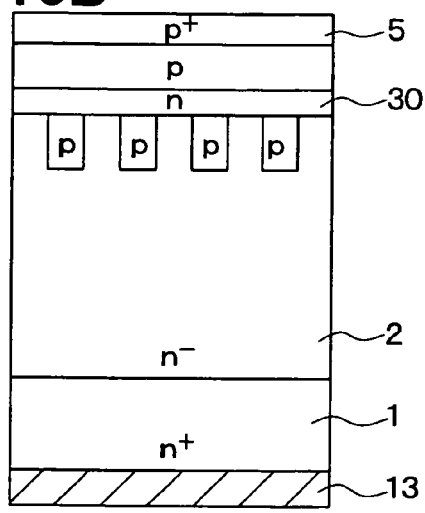
Figure 10C:
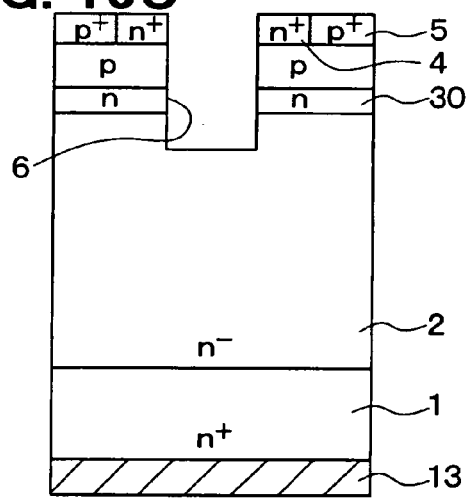
Figure 10D:
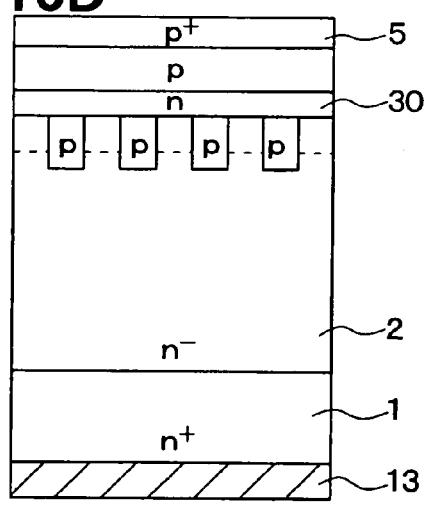
Figure 10E:
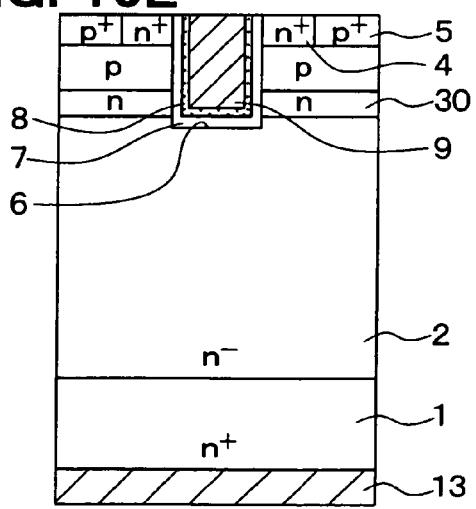
Figure 10F:
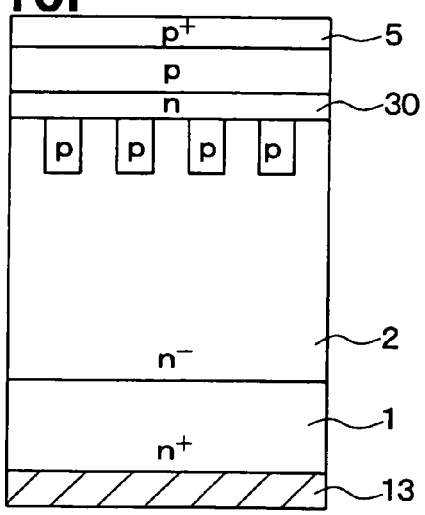

An SiC semiconductor device according to a second embodiment of the present invention will be described with reference to FIG. 7 to FIG. 8D. As illustrated in FIG. 7, in a MOSFET included in the SiC semiconductor device according to the present embodiment, an N type current diffusion layer 30 is disposed between the N− type drift layer 2 and the P type base region 3 so as to be in contact with the N type channel layer 7. The N type current diffusion layer 30 includes, for example, phosphorous as N type impurities. A concentration of the N type impurities in the N type current diffusion layer 30 is set to be greater than the concentration of the N type impurity in the N− type drift layer 2. The concentration of the N type impurity in the N type current diffusion layer 30 may be greater than the concentration of the N type impurity in the N type channel layer 7. For example, the impurity concentration in the N type current diffusion layer 30 is between about $2.0 \times 10^{15}$ cm$^{-3}$ and about $1.0 \times 10^{17}$ cm$^{-3}$. The N type current diffusion layer 30 may have any thickness. For example, the N type current diffusion layer 30 has a thickness of about 0.3 µm so that the trench 6 can penetrate through the N type current diffusion layer 30. The P type deep layers 10 are formed under the N type current diffusion layer 30. The N type current diffusion layer 30 separates the P type deep layers 10 and the P type base region 3. For example, the P type deep layers 10 have a depth between about 0.6 µm and about 1.0 µm from a rear surface of the N type current diffusion layer 30. An impurity concentration, a width, and an interval of the P type deep layers 10 according to the present embodiment are similar to those of the P type deep layers 10 illustrated in FIG. 1.

The present MOSFET can be operated in a manner similar to the MOSFET illustrated in FIG. 1. When the present MOSFET is activated, electric current that flows in the N type channel layer 7 is extended in the N type current diffusion layer 30 in an approximately normal direction to the sidewall of the trench 6. Thus, the electric current disperses widely in the N− type drift layer 2. As a result, an on-resistance of the present MOSFET can be reduced compared with the MOSFET illustrated in FIG. 1.

An exemplary method of manufacturing the MOSFET illustrated in FIG. 7 will be described with reference to FIG. 9A to FIG. 10F. During a process illustrated in FIG. 9A to FIG. 9D, the drain electrode 13 is formed on the rear surface of the N+ type substrate 1, the N− type drift layer 2 is formed on the front surface of the N+ type substrate 1, and the P type deep layers 10 are formed in the N− type drift layer 2 in a manner similar to the process illustrated in FIG. 5A to FIG. 5D. During a process illustrated in FIG. 9E and FIG. 9F, the N type current diffusion layer 30 is epitaxially formed on the front surface of the N− type drift layer 2 and the front surfaces of the P type deep layers 10. In addition, the P type base region 3 is epitaxially formed on the front surface of the N type current diffusion layer 30. During a process illustrated in FIG. 10A-10F, the N+ type source region 4, the P+ type body layer 5, the trench 6, the N type channel layer 7, the gate oxide layer 8, and the gate electrode 9 are formed in a manner similar to the process illustrated FIG. 6A to FIG. 6F. Furthermore, the interlayer insulating layer 12, the contact holes, the source electrode 11, and the gate wiring are formed. Thereby, the MOSFET illustrated in FIG. 7 is formed.

Third Embodiment

An SiC semiconductor device according to a third embodiment of the present invention will be described with reference to FIG. 11 to FIG. 12D.

Figure 11:
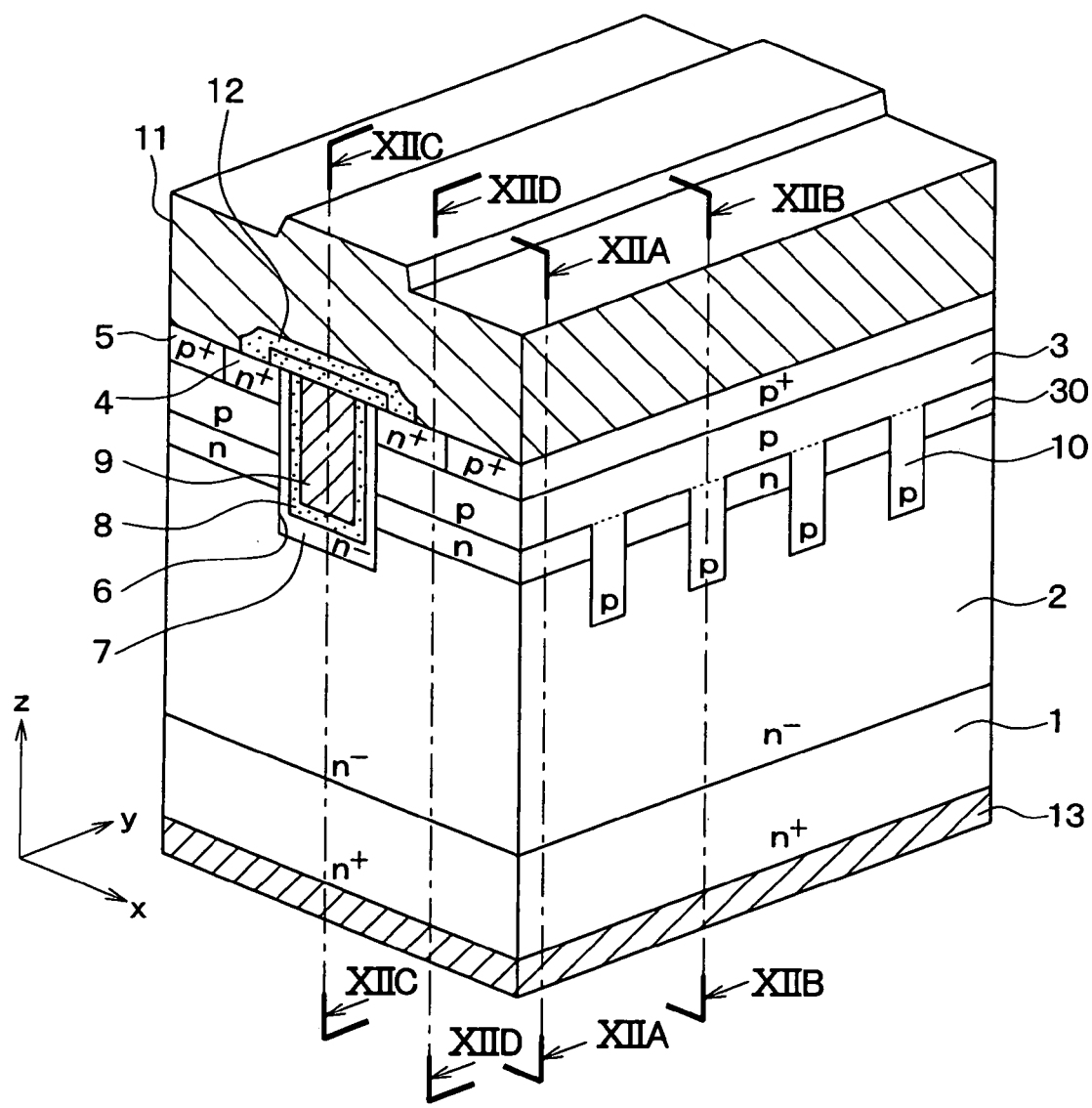
FIG. 11 is a diagram illustrating a perspective cross-sectional view of a MOSFET in an SiC semiconductor device according to a third embodiment.
Figure 12A:
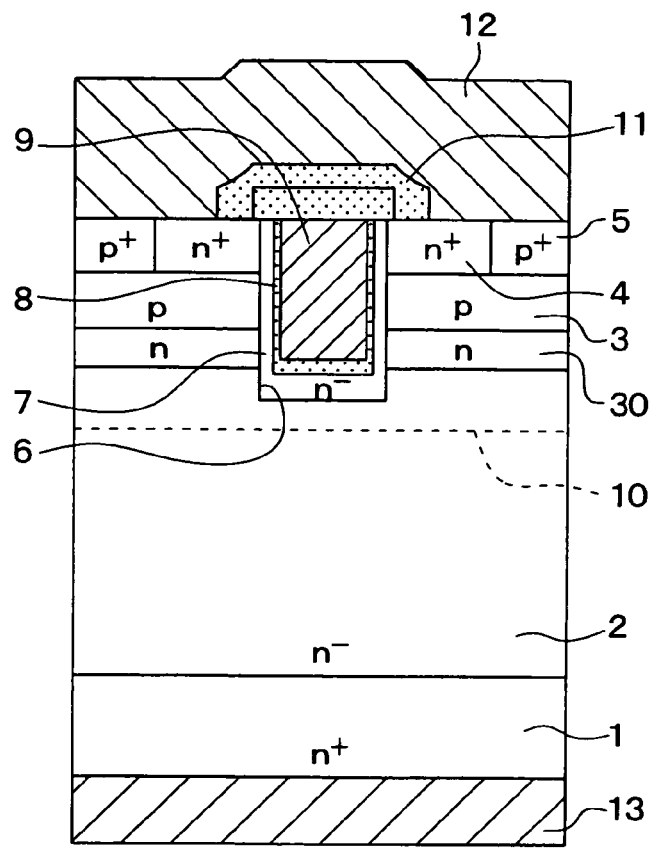
FIG. 12A is a diagram illustrating a cross-sectional view of the MOSFET taken along line XIIA-XIIA in FIG. 11.
Figure 12B:
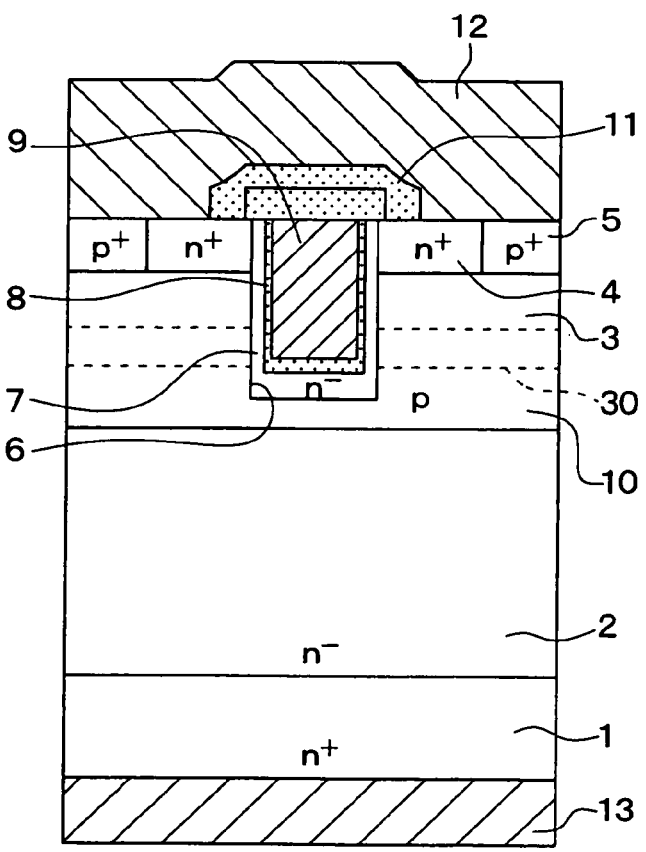
FIG. 12B is a diagram illustrating a cross-sectional view of the MOSFET taken along line XIIB-XIIB in FIG. 11.
Figure 12C:
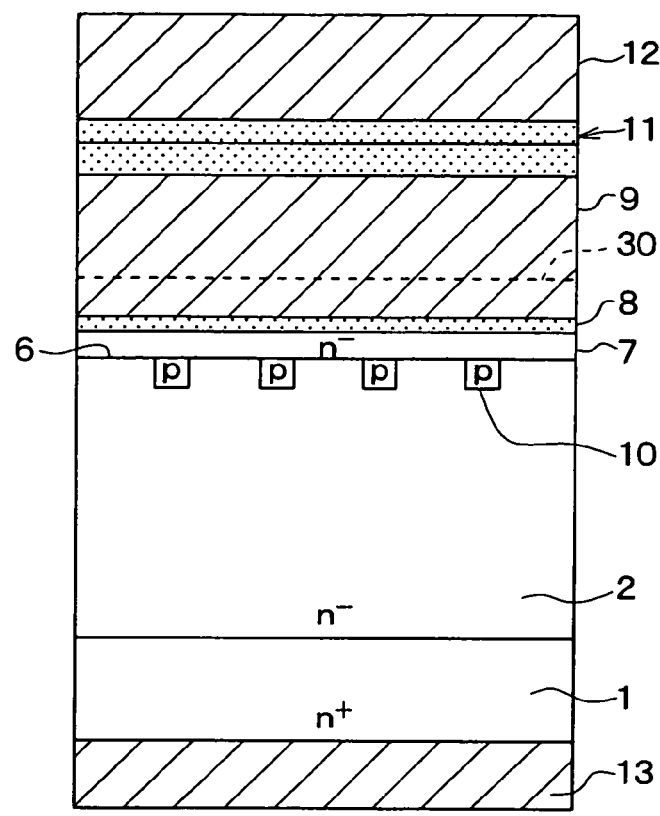
FIG. 12C is a diagram illustrating a cross-sectional view of the MOSFET taken along line XIIC-XIIC in FIG. 11.
Figure 12D:
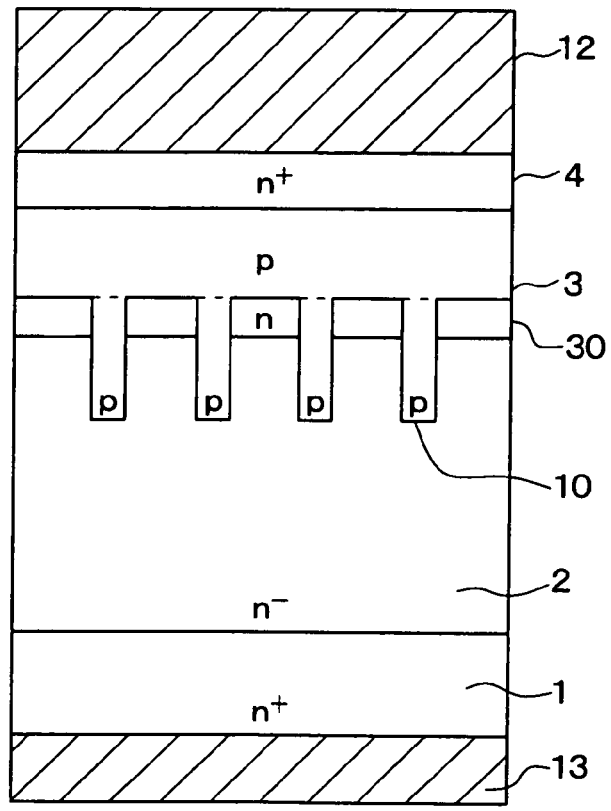
FIG. 12D is a diagram illustrating a cross-sectional view of the MOSFET taken along line XIID-XIID in FIG. 11.

As illustrated in FIG. 11, in a MOSFET included in the SiC semiconductor device according to the present embodiment, the N type current diffusion layer 30 is disposed between the N− type drift layer 2 and the P type base region 3 so as to be in contact with the N type channel layer 7. The P type deep layers 10 extend from the front surface of the N type current diffusion layer 30. The P type deep layers 10 penetrate through the N type current diffusion layer 30 and are contact with the P type base region 3. For example, the P type deep layers 10 have a depth between about 0.6 µm and about 1.0 µm from the front surface of the N type current diffusion layer 30. An impurity concentration, a width, and an interval of the P type deep layers 10 according to the present embodiment are similar to those of the P type deep layers 10 illustrated in FIG. 1.

The MOSFET according to the present embodiment can be operated in a manner similar to the MOSFET illustrated in FIG. 1. When the MOSFET is activated, electric current that flows in the N type channel layer 7 is extended in the N type current diffusion layer 30 in an approximately normal direction to the sidewall of the trench 6. Thus, the electric current disperse widely in the N− type drift layer 2 and the on-resistance can be reduced in a manner similar to the MOSFET illustrated in FIG. 7. In addition, because the P type deep layers 10 are in contact with the P type base region 3, an electric potential of the P type deep layers 10 can be fixed to a source potential. Thus, an electric field relaxing effect of the MOSFET according to the present embodiment is greater than an electric field relaxing effect of the MOSFET illustrated in FIG. 7, in which the P type deep layers 10 are separated from the P type base region 3 by the N type current diffusion layer 30 and the P type deep layers 10 are in a floating state.

An exemplary manufacturing method of the MOSFET illustrated in FIG. 11 will be described with reference to FIG. 13A to FIG. 14F.

Figure 13A:
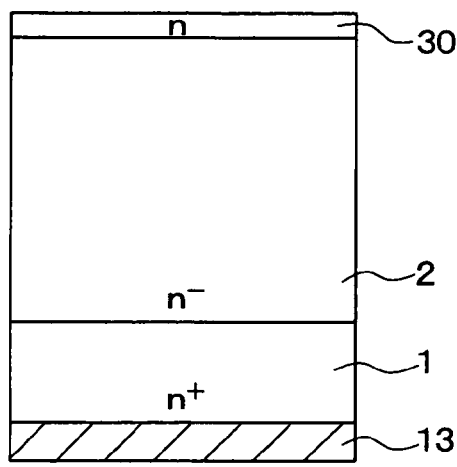
FIG. 13A, FIG. 13C, FIG. 13E, FIG. 14A, FIG. 14C, and FIG. 14E are diagrams illustrating cross-sectional views of an exemplary manufacturing process of the MOSFET taken along line XIIA-XIIA in FIG. 11.
Figure 13B:
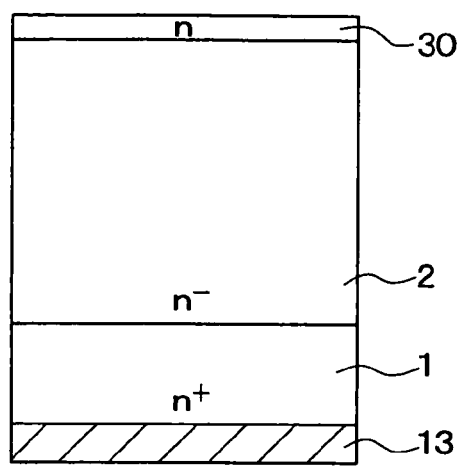
FIG. 13B, FIG. 13D, FIG. 13F, FIG. 14B, FIG. 14D, and FIG. 14F are diagrams illustrating cross-sectional views of the exemplary manufacturing process of the MOSFET taken along line XIIID-XIID in FIG. 11.
Figure 13C:
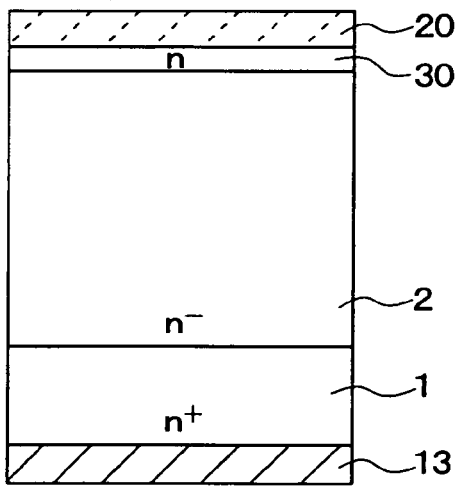
Figure 13D:
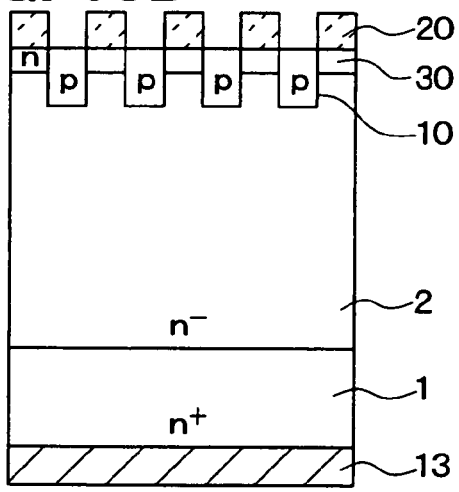
Figure 13E:
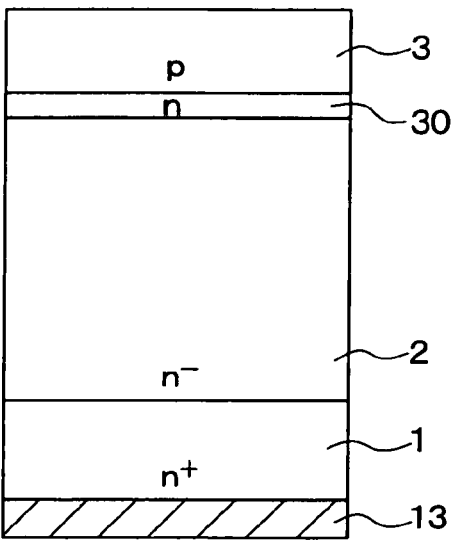
Figure 13F:
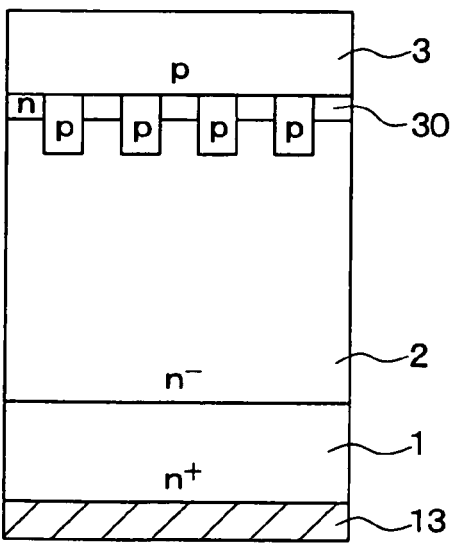
Figure 14A:
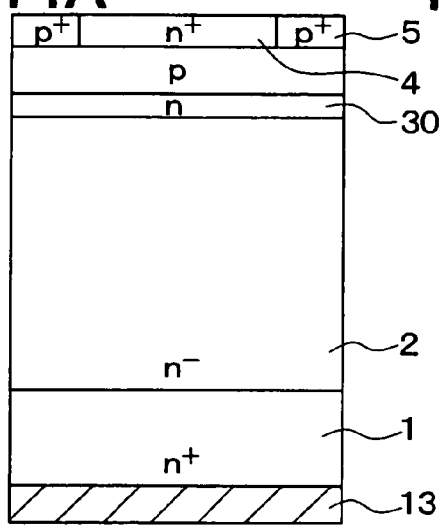
Figure 14B:
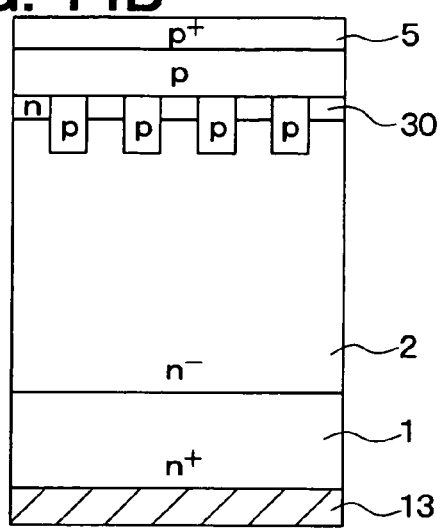
Figure 14C:
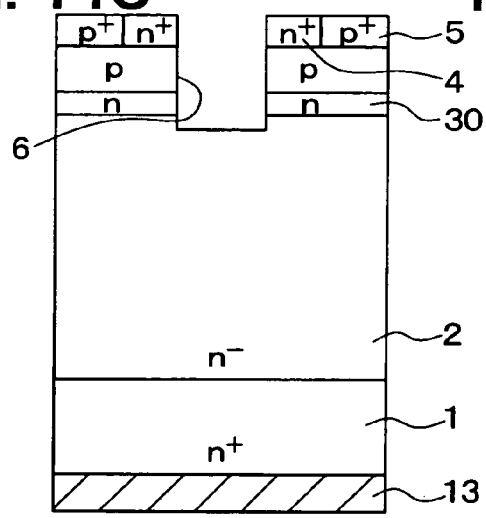
Figure 14D:
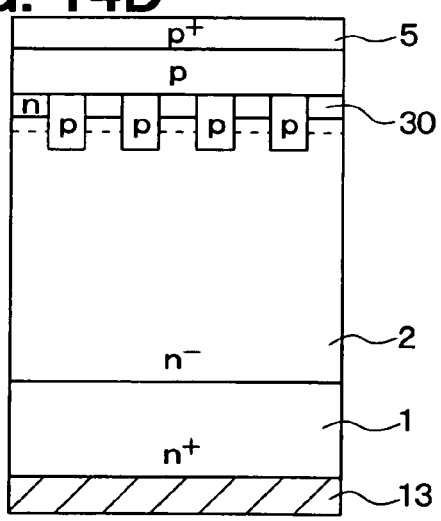
Figure 14E:
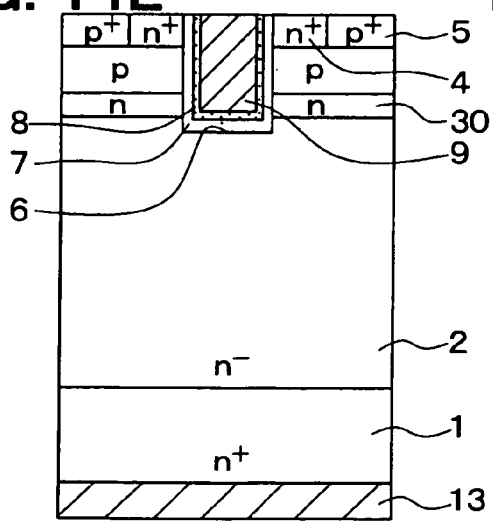
Figure 14F:
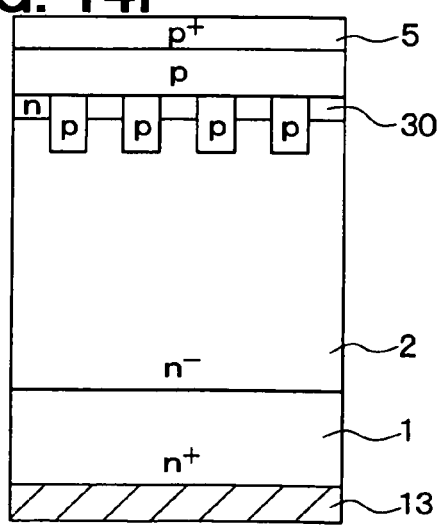

During a process illustrated in FIG. 13A and FIG. 13B, the drain electrode 13 is formed on the rear surface of the N+ type substrate 1 and the N− type drift layer 2 is formed on the front surface of the N+ type substrate 1. Then, the N type current diffusion layer 30 is epitaxially formed on the front surface of the N− type drift layer 2. The impurity concentration of the N type current diffusion layer 30 is greater than the impurity concentration of the N− type drift layer 2. During a process illustrated in FIG. 13D, the mask 20 is formed on the front surface of the N type current diffusion layer 30 and the P type deep layers 10 are formed in a manner similar to the process illustrated in FIG. 5C and FIG. 5D. During a process illustrated in FIG. 13E to FIG. 14F, processes similar to the processes illustrated in FIG. 5E to FIG. 6F are performed. In addition, the interlayer insulating layer 12, the contact holes, the source electrode 11, and the gate wiring are formed. Thereby, the MOSFET illustrated in FIG. 11 is formed.

Fourth Embodiment

An SiC semiconductor device according to a fourth embodiment will be described with reference to FIG. 15. A MOSFET included in the SiC semiconductor device according to the present embodiment may be an inversion type of the MOSFETs illustrated in FIG. 1, FIG. 7, or FIG. 11.

Figure 15:
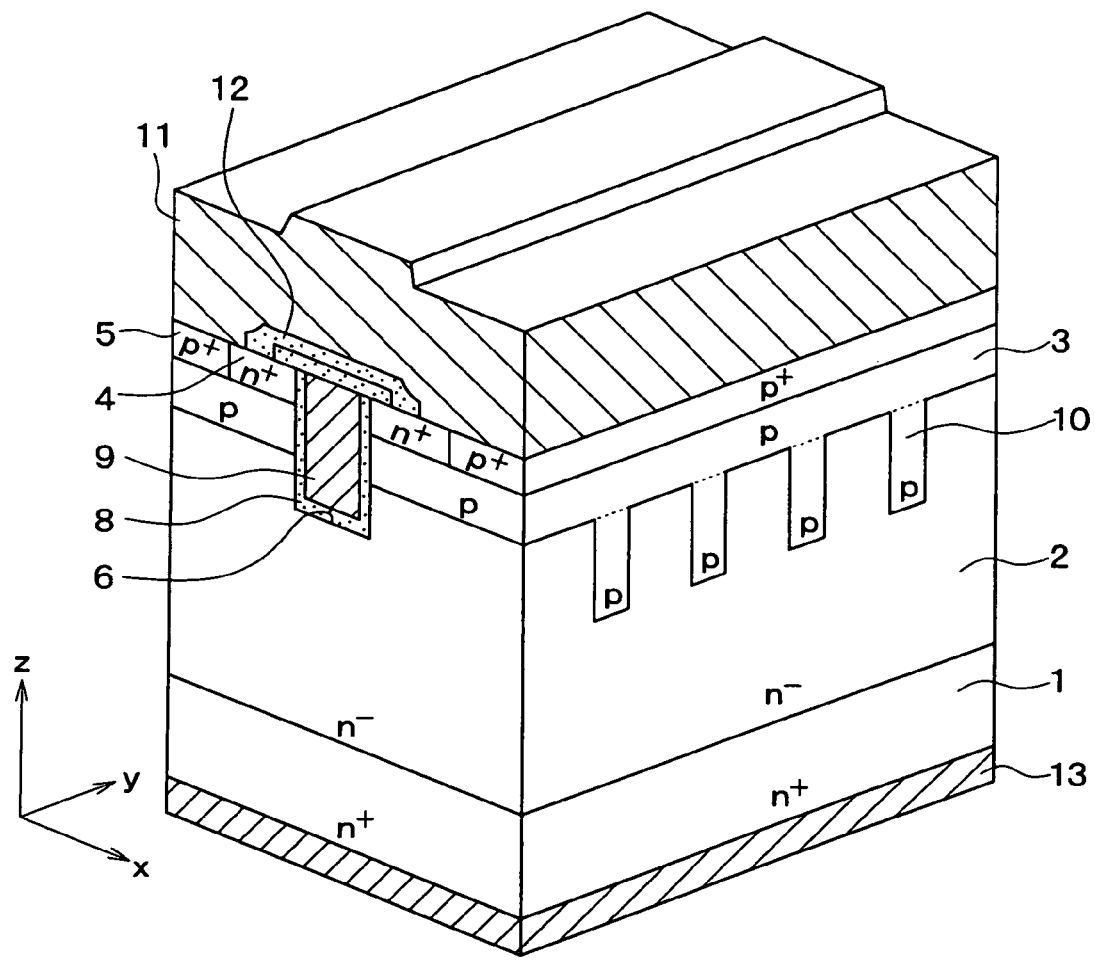
FIG. 15 is a diagram illustrating a perspective cross-sectional view of a MOSFET in an SiC semiconductor device according to a fourth embodiment.

For example, a MOSFET illustrated in FIG. 15 is an inversion type of the MOSFET illustrated in FIG. 1.

In the MOSFET according to the present embodiment, the N type channel layer 7 illustrated in FIG. 1 is not provided and the gate oxide layer 8 is formed on the surface of the trench 6. Thus, the gate oxide layer 8 is in contact with the P type base region 3 and the N+ type source region 4 at the sidewall of the trench 6.

When the gate voltage is applied to the gate electrode 9, a portion of the P type base region 3 in contact with the gate oxide layer 8 becomes an inversion channel and electric current flows between the source electrode 11 and the drain electrode 13.

The MOSFET according to the present embodiment includes the P type deep layers 10. When a drain voltage having a high voltage is applied to the present MOSFET, depletion layers at PN junctions between the P type deep layers 10 and the N− type drift layer 2 expand toward the N− type drift layer 2. Thus, a high voltage due to the drain voltage is restricted from entering the gate oxide layer 8. Thereby, an electric field concentration in the gate oxide layer 8, especially, the electric field concentration in the gate oxide layer 8 at the bottom portion of the trench 6 can be reduced. As a result, the gate oxide layer 8 is restricted from being damaged.

The MOSFET according to the present embodiment can be manufactured in a manner similar to the above-described manufacturing process. However, in the present embodiment, the N type channel layer 7 is not provided and the gate oxide layer 8 is formed directly on the surface of the trench 6.

Each of the SiC semiconductor devices according to the first to fourth embodiments includes the N channel MOSFETs in which a first conductivity type is an N type and a second conductivity type is a P type. Alternatively, each of the SiC semiconductor devices may include P channel MOSFETs in which the conductivity types are reversed. Alternatively, each of the SiC semiconductor devices may include insulated gate bipolar transistors (IGBTs) each having a trench gate structure. In a case where the above-described SiC semiconductor devices include the IGBTs, the conductivity type of the N+ type substrate 1 is changed from the N conductivity type to the P conductivity type. Other structure and a manufacturing method are similar to the above-described embodiments.

In the first to fourth embodiments, the P type base region 3 and the N+ type source region 4 are formed before providing the trench 6. The P type base region 3 and the N+ type source region 4 may be formed by an ion implantation after forming the trench 6. In a case where the N+ type source region 4 in the first to third embodiments is formed by the ion implantation, the N+ type source region 4 may be in contact with the gate oxide layer 8. In a case where the P type base region 3 is formed by the ion implantation, the P type base region 3 can be separated from the sidewall of the trench 6. Thus, the N− type drift layer 2 that remains between the sidewall of the trench 6 and the P type base region 3 can be used as the N type channel layer 7. The P type base region 3 and the N+ type source region 4 may be formed by an ion implantation after forming the trench 6. The N+ type source region 4 and the P+ type body layer 5 may be epitaxially formed.

In the first to fourth embodiments, the P type base region 3 is electrically coupled with the source electrode 11 through the P+ type body layer 5. The P+ type body layer 5 may be a contact part and the P type base region 3 may be electrically coupled with the source electrode 11 through the contact part. In the first to fourth embodiments, the gate oxide layer 8 formed by the thermal oxidation is provided as an example of a gate insulating layer. Alternatively, the gate insulating layer may be an oxide layer formed by another method or a nitride layer, for example. The drain electrode 13 may be formed after forming the source electrode 11.

The impurity concentration of the N type current diffusion layer 30 may be equal to the impurity concentration of the N− type drift layer 2. In the present case, the trench 6 is formed after forming the N type current diffusion layer 30 and a position of the bottom portion of the trench 6 is higher than a case where the N type current diffusion layer 30 is not provided. Thus, the position of the P type deep layers 10 is set be deeper than the bottom portion of the trench 6 more effectively, the electric field relaxing effect at the bottom portion of the trench 6 can be improved compared with the first embodiment.

Fifth Embodiment

Each of the accumulation type MOSFETs according to the first to third embodiments includes the N type channel layer 7 around the trench gate. The N type channel layer 7 is epitaxially formed on the surface of the trench 6. When an epitaxial growth rate of the N type channel layer 7 varies in a plane, the on-resistance of the accumulation type MOSFET may vary in the plane.

On the other hand, the inversion type MOSFET according to the fourth embodiment does not include the N type channel layer 7. Thus, the on-resistance of the inversion type MOSFET does not vary in a plane.

In the inversion type MOSFET, the breakdown voltage is basically determined by a depletion layer expanding along the trench 6 toward the N− type drift layer 2 and a depletion layer expanding from the P type deep layers 10 toward the N− type drift layer 2. However, at a portion away from the trench gate structure, the expanding amount of the depletion layer from the P type deep layers 10 toward the N− type drift layer 2 is reduced. Thus, the breakdown voltage at the portion away from the trench gate structure is determined by the depletion layer expanding from the P type base region 3 to the N− type drift layer 2.

The expanding amount of the depletion layer expanding from the P type base region 3 toward the N− type drift layer 2 increases with the impurity concentration of the P type base region 3. When the impurity concentration of the P type base region 3 is high, for example, when the impurity concentration of the P type base region 3 is about $1 \times 10^{17}$ cm$^{-3}$, a punching through at a reverse bias can be prevented and the breakdown voltage can be improved. However, an inversion channel is formed at a portion of P type base region 3 at a time when the channel region is provided. Thus, when the impurity concentration of the P type base region 3 is high, a channel mobility may be reduced and the on-resistance may increase. In contrast, when the impurity concentration of the P type base region 3 is low, for example, when the impurity concentration of the P type base region 3 is about $1 \times 10^{16}$ cm$^{-3}$, the channel mobility can increase and the on-resistance can be reduced. However, the expanding amount of the depletion layer expanding from the P type base region 3 toward the N− type drift layer 2 may be reduced, and thereby a punching through may occur at the reverse bias. As a result, the breakdown voltage may be reduced when the impurity concentration of the P type base region 3 is low.

Figure 16:
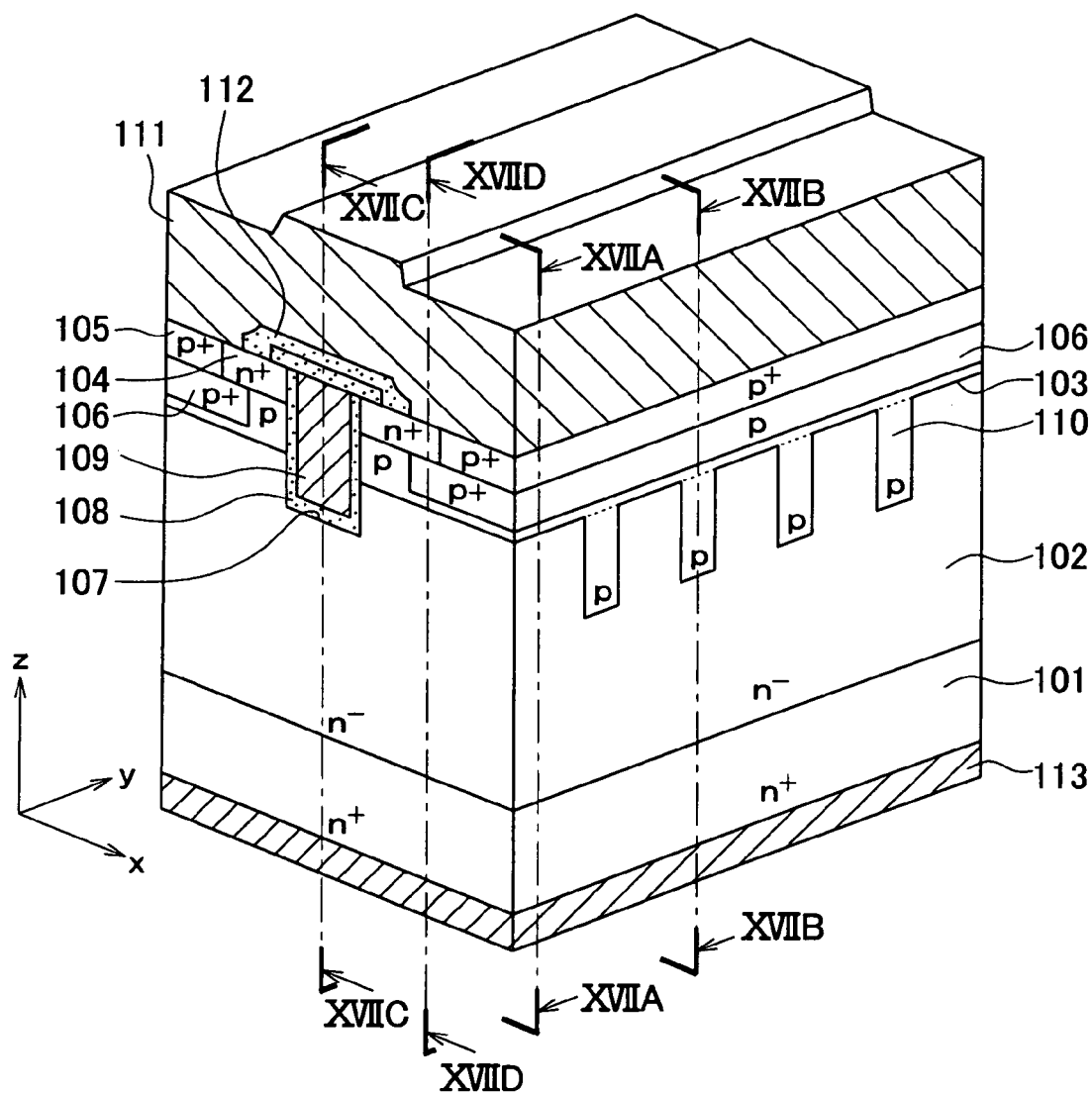
FIG. 16 is a diagram illustrating a perspective cross-sectional view of a MOSFET in an SiC semiconductor device according to a fifth embodiment.
Figure 17A:
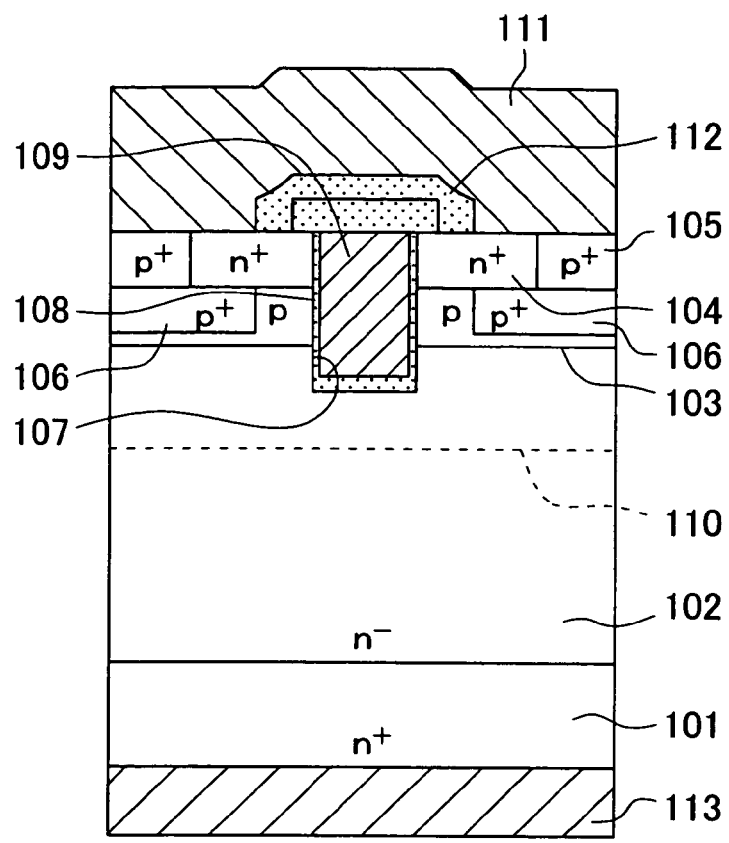
FIG. 17A is a diagram illustrating a cross-sectional view of the MOSFET taken along line XVIIA-XVIIA in FIG. 16.
Figure 17B:
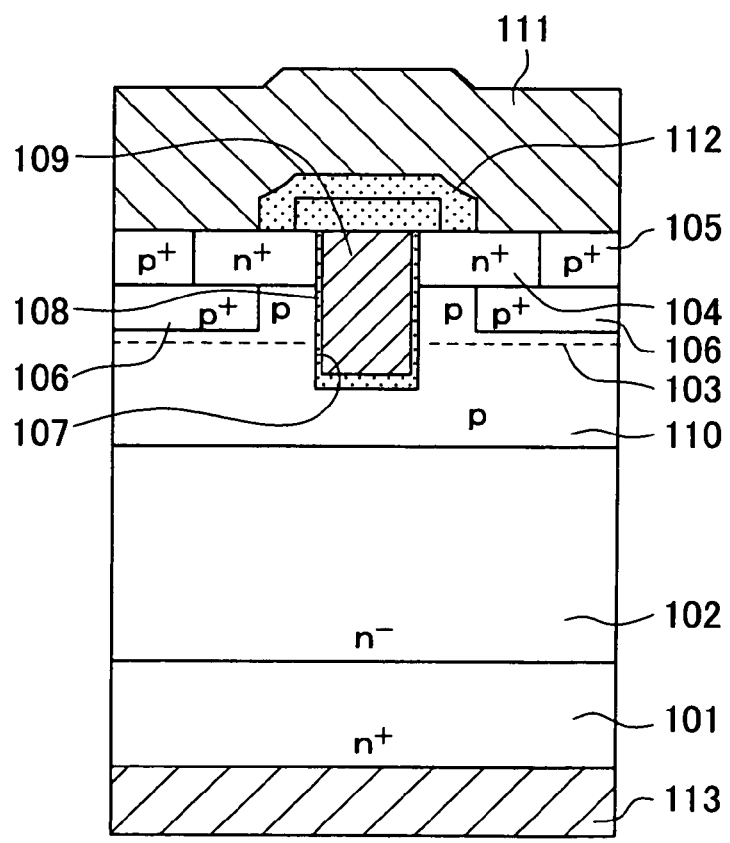
FIG. 17B is a diagram illustrating a cross-sectional view of the MOSFET taken along line XVIIB-XVIIB in FIG. 16.
Figure 17C:
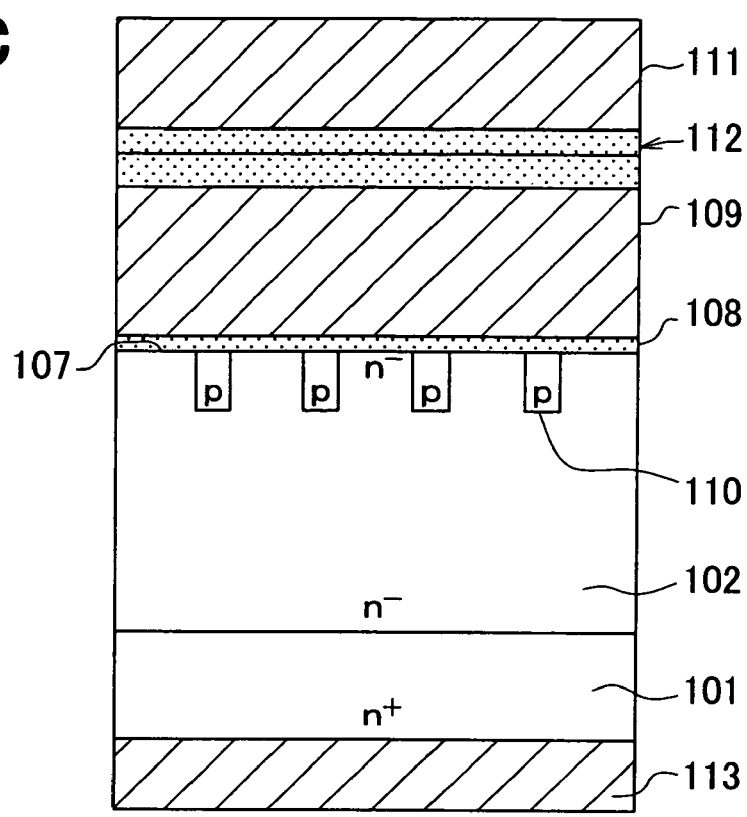
FIG. 17C is a diagram illustrating a cross-sectional view of the MOSFET taken along line XVIIC-XVIIC in FIG. 16.
Figure 17D:
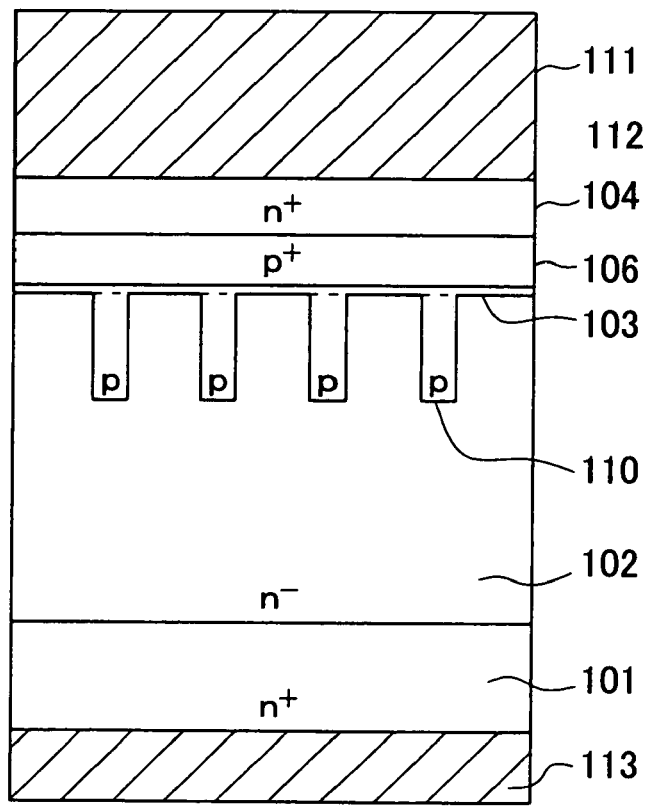
FIG. 17D is a diagram illustrating a cross-sectional view of the MOSFET taken along line XVIID-XVIID in FIG. 16.

An SiC semiconductor device according to a fifth embodiment will now be described with reference to FIG. 16 to FIG. 17D. The SiC semiconductor device according to the present embodiment includes a plurality of inversion type MOSFETs. One of the MOSFETs is illustrated in FIG. 16. In the SiC semiconductor device, the MOSFETs are arranged in a plurality of rows so as to be adjacent to each other.

The MOSFET includes an N+ type substrate 101 made of SiC. The N+ type substrate 1 includes, for example, phosphorus as N type impurities. An impurity concentration of the N+ type substrate 101 is, for example, about $1.0 \times 10^{19}$ cm$^{-3}$. The N+ type substrate 101 has a thickness of, for example, about 300 μm. On a front surface of the N+ type substrate 1, an N− type drift layer 102 made of SiC is located. The N− type drift layer 2 includes, for example, phosphorus as N type impurities. An impurity concentration of the N− type drift layer 2 is, for example, between about $3.0 \times 10^{15}$ cm$^{-3}$ and about 7.0×

$10^{15}$ cm$^{-3}$. The N− type drift layer 102 has a thickness, for example, between about 10 μm and about 15 μm. The impurity concentration of the N− type drift layer 102 may be substantially constant in a thickness direction of the N− type drift layer 102. Alternatively, the impurity concentration of the N− type drift layer 102 may be varied in the thickness direction of the N− type drift layer 102. For example, the impurity concentration of the N− type drift layer 102 may decrease toward a side away from the front surface of the N+ type substrate 101. The impurity concentration of a portion of the N− type drift layer 102 at a distance between about 3 μm and about 5 μm from the front surface of the N+ type substrate 101 may be greater than the impurity concentration of the other portion of the N− type drift layer 102 by about $2.0 \times 10^{15}$ cm$^{-3}$. In the present case, an internal resistance of the N− type drift layer 102 can be reduced. Thus, an on-resistance of the MOSFET can be reduced.

At a surface portion of the N− type drift layer 102, a P type base region 103 is located. At a surface portion of the P type base region 103, an N+ type source region 104 and a P+ type contact layer 105 are located. Furthermore, a P+ type body layer 106 is located in the P type base region 103. The P+ type body layer 106 is located at a portion deeper than the N+ type source region 104 and the P+ type contact layer 105.

The P type base region 103 includes, for example, boron or aluminum as P type impurities. The impurity concentration of the P type base region 103 is, for example, between about $5.0 \times 10^{15}$ cm$^{-3}$ and about $5.0 \times 10^{16}$ cm$^{-3}$. The P type base region 103 has a thickness of, for example, 2.0 μm. The N+ type source region 104 includes, for example, phosphorous, as N type impurities. An impurity concentration of a surface portion of the N+ type source region 104 is, for example, about $1.0 \times 10^{21}$ cm$^{-3}$, for example. The N+ type source region 104 has a thickness of, for example, about 0.3 μm. The P+ type contact layer 105 includes, for example, boron or aluminum as P type impurities. An impurity concentration of a surface portion of the P+ type contact layer 105 is, for example, about $1.0 \times 10^{21}$ cm$^{-3}$. The P+ type contact layer 105 has a thickness of, for example, about 0.3 μm. The P+ type body layer 106 includes, for example, boron or aluminum as P type impurities. An impurity concentration of the P+ type body layer 106 is, for example, between about $1.0 \times 10^{18}$ cm$^{-3}$ and about $1.0 \times 10^{20}$ cm$^{-3}$. The P+ type body layer 106 has a thickness, for example, between about 0.7 μm and about 1.1 μm.

The N+ type source region 104 sandwiches a trench 107. The P+ type contact layer 105 sandwiches the N+ type source region 104 and the trench 107. The P+ type body layer 106 sandwiches the trench 107. The P+ type body layer 106 is away from a sidewall of the trench 107. A distance from the sidewall of the trench 107 to the P+ type body layer 106 is between about 0.4 μm and about 0.9 μm.

The trench 107 penetrates the P type base region 103 and the N+ type source region 104 and reaches the N− type drift layer 102. The trench 107 has a width, for example, between about 1.4 μm and about 2.0 μm. The trench 107 has a depth greater than or equal to about 2.0 μm. For example, the trench 107 has a depth about 2.4 μm. The P type base region 103 and the N+ type source region 104 are in contact with the sidewall of the trench 107.

A surface of the trench 107 is covered with a gate oxide layer 108. On a surface of the gate oxide layer 108, a gate electrode 109 is formed so as to fill the trench 107. The gate electrode 109 is made of doped polysilicon. The gate oxide layer 108 is formed, for example, by thermally oxidizing an inner wall of the trench 107. The gate oxide layer 108 has a thickness of about 100 nm at the sidewall of the trench 107 and at a bottom portion of the trench 107.

In this way, the trench gate structure is formed. The trench gate structure is formed along a y-direction illustrated in FIG. 16. That is, a longitudinal direction of the trench gate structure is the y-direction. A plurality of the trench gate structures is arranged in an x-direction that is approximately perpendicular to the longitudinal direction of the trench gate structure. The N+ type source region 104, the P+ type contact layer 105, and the P+ type body layer 106 are also formed along the longitudinal direction of the trench gate structure.

In the N− type drift layer 102, a plurality of P type deep layers 110 is formed under the P type base region 103. The P type deep layers 110 are formed along an approximately normal direction to the sidewall of the trench 107 where the channel region is provided. That is, the P type deep layers 110 are formed along the x-direction approximately perpendicular to the longitudinal direction of the trench 107. The P type deep layers 110 extend to a depth deeper than the bottom portion the trench 107. For example, the P type deep layers 10 extend to a depth between about 2.6 μm and about 3.0 μm from the front surface of the N− type drift layer 102, that is, between about 0.6 μm and about 1.0 μm from a bottom portion of the P type base region 103. A width of each of the P type deep layers 110 in the y-direction is, for example, between about 0.6 μm and about 1.0 μm. The P type deep layers 110 include, for example, boron or aluminum as P type impurities. An impurity concentration of the P type deep layers 110 is, for example, between about $1.0 \times 10^{17}$ cm$^{-3}$ and about $1.0 \times 10^{19}$ cm$^{-3}$. The P type deep layers 110 are arranged in the longitudinal direction of the trench 107 so as to be parallel to each other. An interval of the P type deep layers 110 is, for example, between about 1.5 μm and about 3.0 μm. In the MOSFET according to the present embodiment, the interval of the P type deep layers 110 is about 2.0 μm.

On surfaces of the N+ type source region 104, the P+ type contact layer 105, and the gate electrode 109, a source electrode 111 and a gate wiring (not shown) are formed. The source electrode 111 and the gate wiring are made of a plurality of metals, for example, an alloy of nickel and aluminum. At least portions of the source electrode 111 and the gate wiring being in contact with an N type SiC are made of a metal that can provide an ohmic connection between each of the source electrode 111 and the gate wiring and the N type SiC. The N type SiC includes the N+ type source region 104 and the gate electrode 109 if the gate electrode 109 includes N type impurities. At least portions of the source electrode 111 and the gate wiring being in contact with a P type SiC are made of a metal that can provide an ohmic connection between each of the source electrode 111 and the gate wiring and the P type SiC. The P type SiC includes the P+ type contact layer 105 and the gate electrode 109 if the gate electrode 109 includes P type impurities. The source electrode 111 and the gate wiring are formed on an interlayer insulating layer 112. Thus, the source electrode 111 and the gate wiring are electrically insulated. The source electrode 111 is electrically coupled with the N+ type source region 104 and the P+ type contact layer 105 through contact holes provided in the interlayer insulating layer 112. The gate wiring is electrically coupled with the gate electrode 109 though a contact hole provided in the interlayer insulating layer 112.

On a rear surface of the N+ type substrate 101, a drain electrode 113 is formed. The drain electrode 113 is electrically coupled with the N+ type substrate 101. Thereby, an N-channel inversion type MOSFET having a trench gate structure is formed.

The present inversion type MOSFET may be operated, for example, as described below.

Before applying a gate voltage to the gate electrode 109, the channel region is not provided at a portion of the P type base region 103 located on the sidewall of the trench 107. Thus, even if a positive voltage is applied to the drain electrode 113, electrons are prevented from moving due to the PNP junction structure configured by the N− type drift layer 102, the P type base region 103, and the N+ type source region 104. Therefore, electric current does not flow between the source electrode 111 and the drain electrode 113.

When the MOSFET is deactivated, for example, when the gate voltage is 0 V, the drain voltage is about 650 V, and the source voltage is 0 V, even if a voltage is applied to the drain electrode 113, the voltage creates a reverse bias. Thus, a depletion layer expands from a region between each of the P type base region 103 and the P type deep layers 110 and the N− type drift layer 102. A depletion layer also expands from a region between the trench gate structure and the N− type drift layer 102. When the impurity concentration of the P type base region 103 is low, the expanding amount of the depletion layer that expands toward the N− type drift layer 102 may be reduced.

In the MOSFET according to the present embodiment, the P+ type body layer 106 is provided in addition to the P type base region 103. The impurity concentration of the P+ type body layer 106 is greater than the impurity concentration of the P type base region 103. Thus, the expanding amount of the depletion layer expanding toward the N− type drift layer 102 can be increased compared with a case where only the P type base region 103 is provided. Thereby, the punching through can be prevented by the depletion layer expanding from a region between the P type base region 103 including the P+ type body layer 106 and the N− type drift layer 102 in addition to the depletion layer expanding from the region between the P type deep layers 110 and the N− type drift layer 102 and the depletion layer expanding from the region between the trench gate structure and the N− type drift layer 102. As a result, the breakdown voltage of the MOSFET can be increased by providing the P+ type body layer 106 having the impurity concentration greater than the P type base region 103.

Because the gate voltage is 0 V, an electric field is applied between the drain electrode 113 and the gate electrode 109. Thus, an electric field concentration can possibly occur at the bottom portion of the gate oxide layer 108. The MOSFET includes the P type deep layers 110 extending to the depth deeper than the trench 107. The depletion layer expands toward the N− type drift layer 102 at the PN junction between the P type deep layers 110 and the N− type drift layer 102. Thus, a high voltage due to the drain voltage is restricted from being applied to the gate oxide layer 108. When the impurity concentration of the P type deep layers 110 is set to be greater than the impurity concentration of the P type base region 103, an expanding amount of the depletion layer expanding toward the N− type drift layer 102 increases. Thereby, an electric field concentration in the gate oxide layer 108, especially, the electric field concentration in the gate oxide layer 108 at the bottom portion of the trench 107 can be reduced.

When the MOSFET is activated, for example, when the gate voltage is about 20 V, the drain voltage is about 1V, and the source voltage is about 0V, the gate electrode 109 is applied with the gate voltage of about 20V. Thus, an inversion channel is formed at a portion of the P type base region 103 adjacent to the sidewall of the trench 107, and thereby the channel region is provided. Electrons induced from the source electrode 111 flows to the N− type drift layer 102 through the N+ type source region 4 and the channel region in the P type base region 103. Thereby, electric current flows between the source electrode 111 and the drain electrode 113.

In the MOSFET according to the present embodiment includes the P+ type body layer 106. Thus, the impurity concentration of the P type base region 103 can be reduced. Thereby, the inversion channel can be easily formed at a portion of the P type base region 103, and an area of the channel region can be increased. As a result, the channel mobility can be increased. The P+ type body layer 106 is formed at the portion of the P type base region 103 away from the trench 107. Thus, the inversion channel can be formed at the portion of the P type base region 103 adjacent to the sidewall of the trench 107 without being affected by the P+ type body layer 106. As a result, the on-resistance of the MOSFET can be reduced compared with a case where the P+ type body layer 106 is not provided.

In a MOSFET without the P+ type body layer 106, in order to provide a predetermined breakdown voltage to the MOSFET by the P type base region 103, the impurity concentration of the P type base region 103 is required to be about $1.0 \times 10^{17}$ $cm^{-3}$. In this case, the channel mobility is about 120 $cm^2$/V·s and the on-resistance is 5.1 mΩ·$cm^2$. In the MOSFET including the P+ type body layer 106, the MOSFET can have the predetermined breakdown voltage when the impurity concentration of the P type base region 103 is about $1.0 \times 10^{16}$ $cm^{-3}$. In this case, the channel mobility is about 210 $cm^2$/V·s and the on-resistance can be reduced to about 3.5 mΩ·$cm^2$.

Figure 18A:
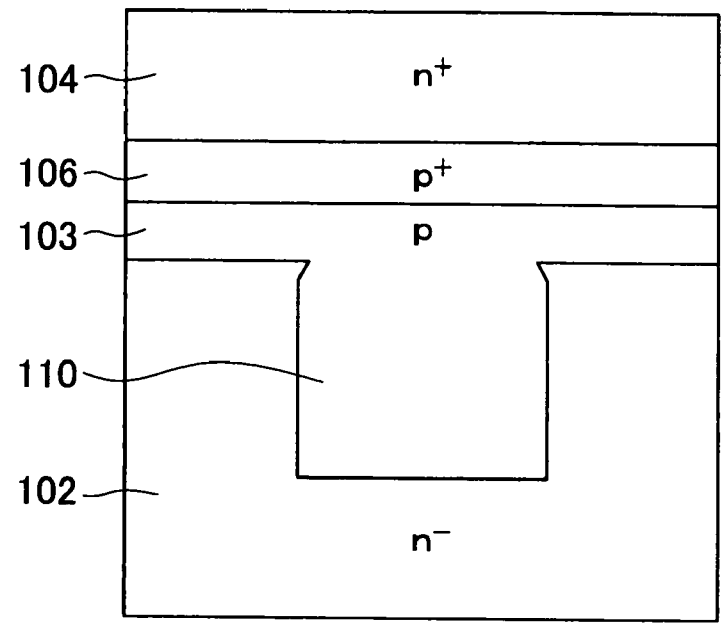
FIG. 18A is a diagram illustrating a cross-sectional view of the MOSFET taken along a line approximately perpendicular to a longitudinal direction of a P type deep layer.
Figure 18B:
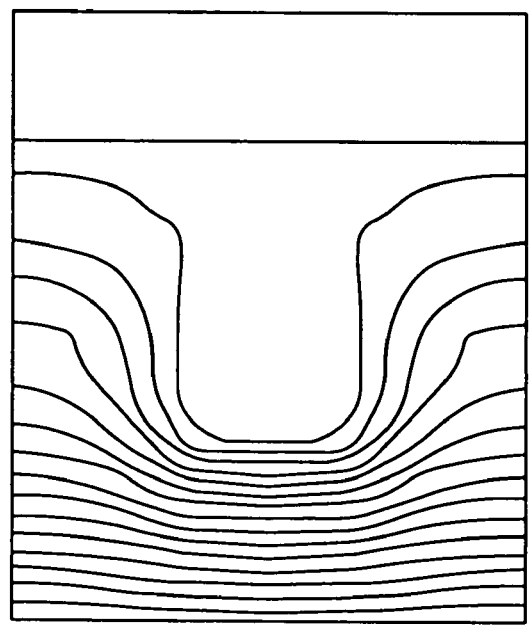
FIG. 18B is a diagram illustrating an electric potential distribution in the cross section of the MOSFET illustrated in FIG. 18A.
Figure 19:
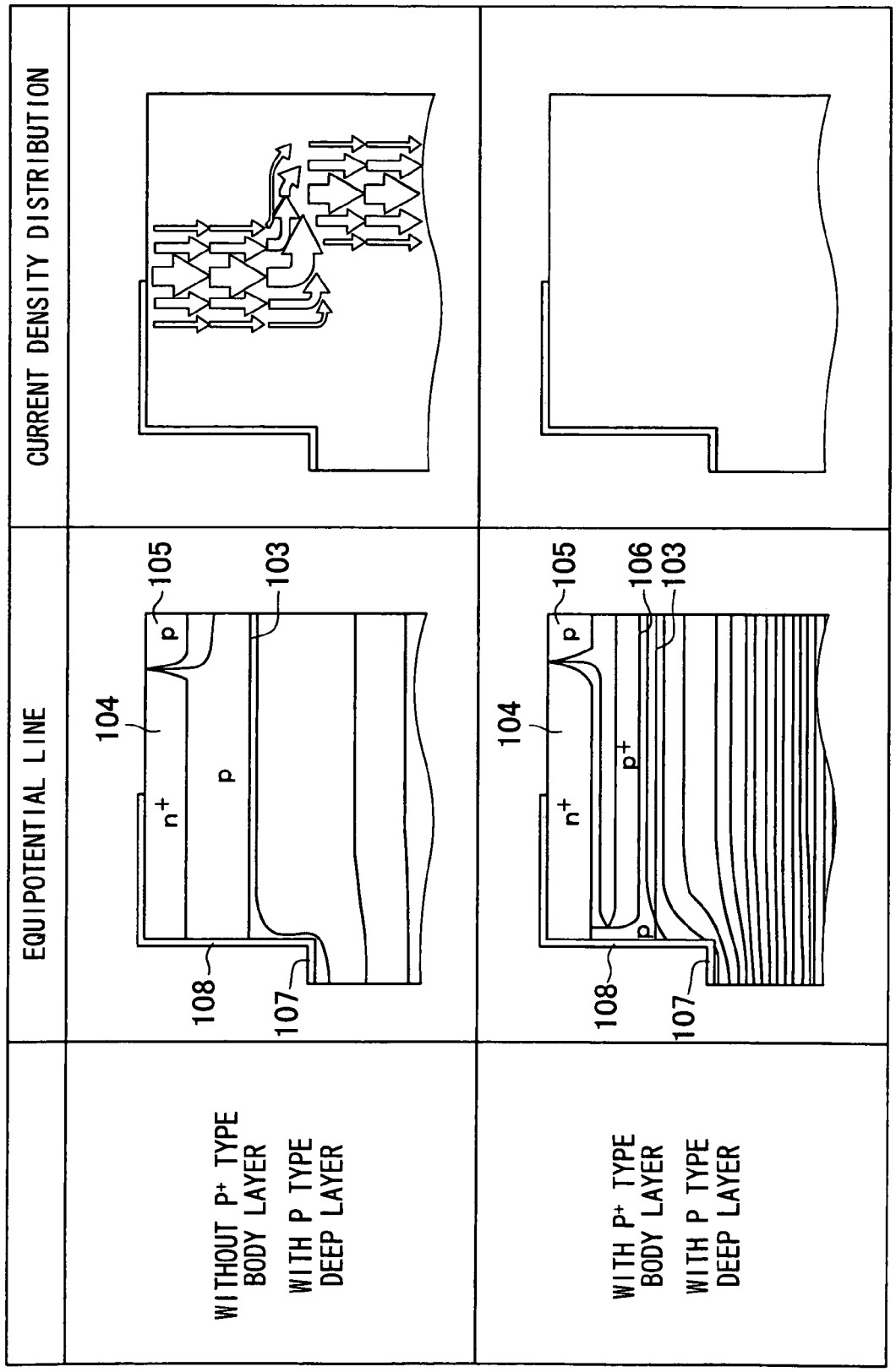
FIG. 19 is a diagram illustrating an electric potential distribution and a current density distribution at a cross section of the MOSFET taken along a line approximately normal direction to a sidewall of a trench at a portion between the P type deep layers.

A behavior of the MOSFET when the MOSFET is deactivated can be simulated as was demonstrated by the inventors. The simulated results are illustrated in FIG. 18B and FIG. 19. In FIG. 19, the simulated result in a case where the MOSFET includes the P type deep layers 110 and the P+ type body layer 106 is not provided and a case where the MOSFET includes both of the P type deep layers 110 and the P+ type body layer 106 are illustrated. In FIG. 18B and FIG. 19, the equipotential lines are illustrated at 10 V intervals.

If the impurity concentration of the P type base region 103 is about two times greater than the impurity concentration of the N− type drift layer 102 and the P+ type body layer 106 and the P type deep layers 110 are not provided, when a depletion layer expands toward the N− type drift layer 102 by about 4 μm, the depletion layer expands toward the P type base region 103 by about 2 μm. In this case, a punching through may easily occur.

When the P type deep layers 110 are provided, a depletion layer also expands from the P type deep layers 110. For example, when the impurity concentration of the P type deep layers 110 is about 100 times greater than the impurity concentration of the N− type drift layer 102, the depletion layer expands mostly toward the N− type drift layer 102. Thus, a high breakdown voltage can be provided as seen from a distribution of the equipotential lines at a bottom portion of the P type deep layers illustrated in FIG. 18B.

However, as seen from the distribution of the equipotential lines at both side portions of the P type deep layers 110 illustrated in 18B and the distribution of the equipotential lines illustrated in FIG. 19, in a case where the P+ type body layer 106 is not provided, the expanding amount of the depletion layer expanding toward the N− type drift layer 102 may be reduced at portions where the P type deep layers 110 are not formed, that is, at portions between the P type deep layers 110. Thus, a high breakdown voltage may not be provided at the portions between the P type deep layers 110. The depletion layer also expands from the trench 107 due to a difference in a work function of the gate oxide layer 108 and SiC. Thus, a high breakdown voltage can be provided at portion adjacent to the trench gate structure. However, a high breakdown voltage may not be provided at another portion away from the trench gate structure. That is, the punching though may not be prevented only by the depletion layer expanding from the P type deep layers 110 and the trench gate structure toward the N− type drift layer 2. Thus, in the case where the P+ type body layer 106 is not provided, a punching through current may flow as illustrated in a current density distribution in FIG. 19.

The MOSFET according to the present embodiment includes the P+ type body layer 106 in addition to the P type deep layers 110. Thus, the expanding amount of the depletion layer expanding toward the N− type drift layer 102 increases at a portion away from the trench gate structure. The impurity concentration of the P+ type body layer 106 can be about 1000 times greater than the impurity concentration of the N− type drift layer 102. Thus, the depletion layer expands mostly toward the N− type drift layer 102. Therefore, as seen from the equipotential line distribution in FIG. 19, a high breakdown voltage can be provided at portions where the P type deep layers 10 are not formed. According to an experiment performed by the inventors, the MOSFET according to the present embodiment can have a high breakdown voltage greater than or equal to about 1200 V.

In the MOSFET according to the present embodiment, the depletion layer expands from the P+ type body layer 106 and the P type base region 103 toward the N− type drift layer 102 in addition to the depletion layer expanding from the P type deep layers 110 and the trench gate structure toward the N− type drift layer 102. Thus, due to the depletion layers, the high breakdown voltage can be provided at the portion away from trench gate structure in addition to the portion adjacent to the trench gate structure and the portions where the P type deep layers 110 are formed. Thereby, a flow of a punching through current can be prevented as seen from the current density distribution illustrated in FIG. 19.

In a case where the P type deep layers 110 are formed along the approximately normal direction of the sidewall of the trench 107 where the channel region is provided, the channel region is not formed at portions of the sidewall of the trench 107 where the P type deep layers 110 are formed. Therefore, the on-resistance may increase. However, the increase of the on-resistance is not so large and can be controlled by changing the width of the P type deep layers 110 and the interval of the P type deep layers 110. Thus, the increase of the on-resistance does not become an issue. In the MOSFET according to the present embodiment, the interval of the P type deep layers 110 can be increased due to the P+ type body layer 106. Thus, the on-resistance can be effectively reduced.

An exemplary method of manufacturing the MOSFET illustrated in FIG. 16 will be described with reference to FIG. 20A to FIG. 21F.

Figure 20A:
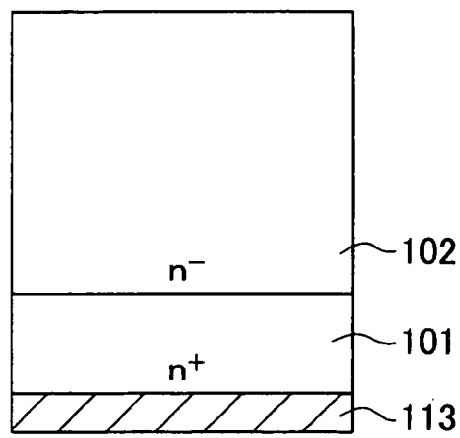
FIG. 20A, FIG. 20C, FIG. 20E, FIG. 21A, FIG. 21C, and FIG. 21E are diagrams illustrating cross-sectional views of an exemplary manufacturing process of the MOSFET taken along line XVIIA-XVIIA in FIG. 16.
Figure 20B:
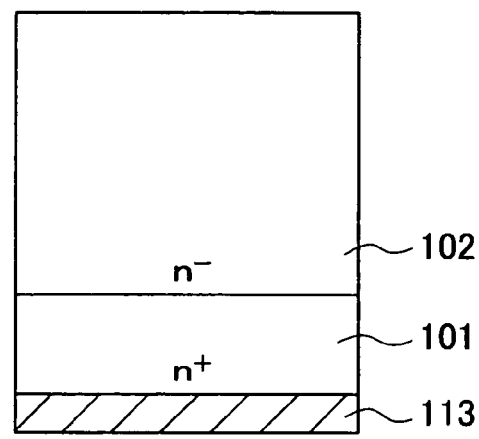
FIG. 20B, FIG. 20D, FIG. 20F, FIG. 21B, FIG. 21D, and FIG. 21F are diagrams illustrating cross-sectional views of the exemplary manufacturing process of the MOSFET taken along line XVIID-XVIID in FIG. 16.

During a process illustrated in FIG. 20A and FIG. 20B, the N+ type substrate 101 is prepared. The impurity concentration of N+ type substrate 101 is, for example, about $1.0 \times 10^{19}$ cm$^{-3}$. The N+ type substrate 101 has a thickness of, for example, about 300 µm. On the rear surface of the N+ type substrate 101, the drain electrode 113 is formed. On the front surface of the N+ type substrate 101, the N− type drift layer 102 is epitaxially formed. The impurity concentration of the N− type drift layer 102 is, for example, between about $3.0 \times 10^{15}$ cm$^{-3}$ and about $7.0 \times 10^{15}$ cm$^{-3}$. The N− type drift layer 2 has a thickness of, for example, about 15 µm.

Figure 20C:
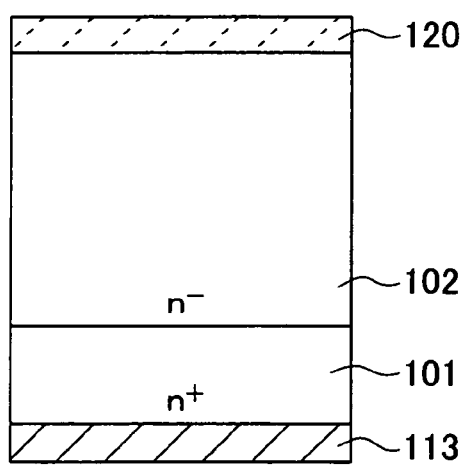
Figure 20D:
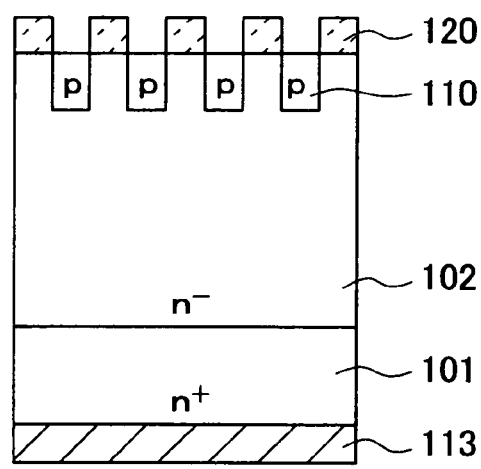

During a process illustrated in FIGS. 20C and 20D, a mask 120 is formed on the front surface of the N− type drift layer 102. The mask 120 is made of LTO, for example. Then, opening portions are provided in the mask 120 by a photolithography process. The opening portions are provided at regions where the P deep layers 110 will be formed. The P type impurities are ion-implanted through the mask 120 and are activated. Thereby, the P type deep layers 110 are formed. The P type impurities are, for example, boron or aluminum. The impurity concentration of the P type deep layers 110 is, for example, between about $1.0 \times 10^{17}$ cm$^{-3}$ and about $1.0 \times 10^{19}$ cm$^{-3}$. The thickness of the P deep layers 110 is, for example, between about 0.6 µm and about 1.0 µm. The width of the P type deep layers 110 is, for example, between about 0.6 µm and about 1.0 µm. The interval of the P type deep layer 110 is between about 2.0 µm and about 3.0 µm, for example, about 2.0 µm. Then, the mask 120 is removed.

Figure 20E:
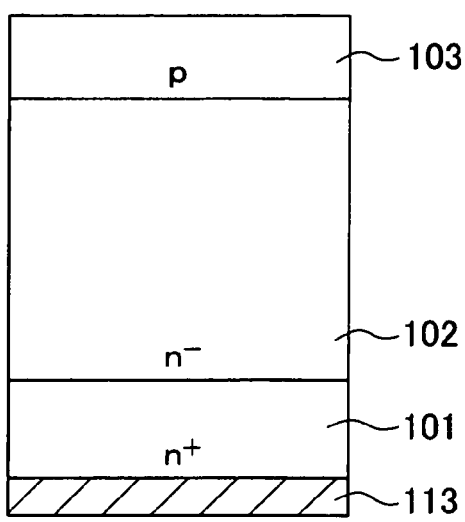
Figure 20F:
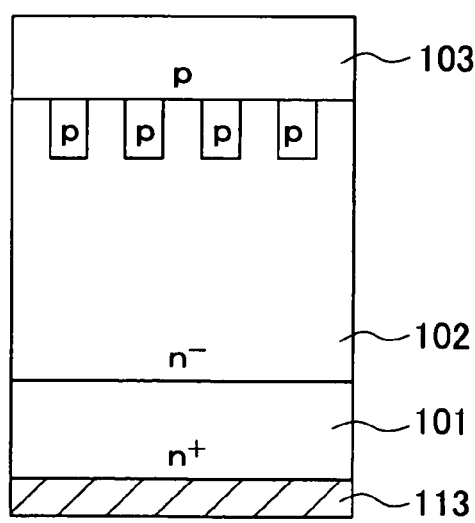

During a process illustrated in FIG. 20E and FIG. 20F, the P type base region 103 is epitaxially formed on the N− type drift layer 102. The impurity concentration of P type base region 103 is, for example, between about $5.0 \times 10^{15}$ cm$^{-3}$ and about $5.0 \times 10^{16}$ cm$^{-3}$. The thickness of the P type base region 103 is, for example, about 2.0 µm.

Figure 21A:
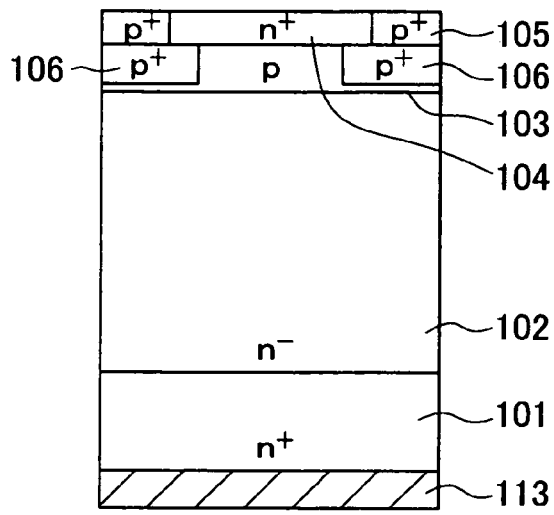
Figure 21B:
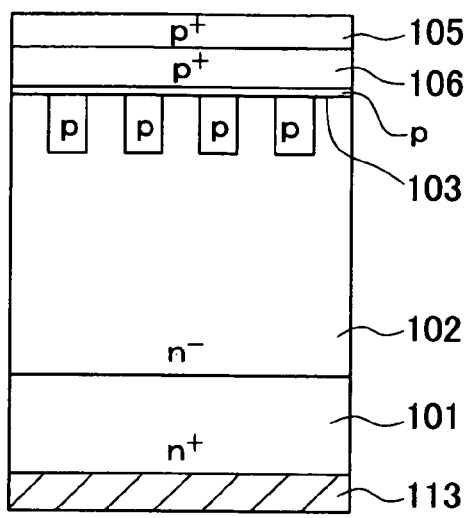

During a process illustrated in FIG. 21A and FIG. 21B, a first mask, for example, made of LTO is formed on the P type base region 103. An opening portion is provided in the first mask by a photolithography process. The opening portion is provided at a portion where the P+ type body layer 106 will be formed so that the P+ type body layer 106 will be away from the sidewall of the trench 107. Then, the P type impurities such as boron or aluminum are ion-implanted.

After removing the first mask, a second mask, for example, made of LTO is formed on the P type base region 103. An opening portion is provided in the second mask by a photolithography process. The opening portion is provided at a portion where the N+ type source region 104 will be formed. Then, the N type impurities such as phosphorous are ion-implanted.

After removing the second mask, a third mask is formed and an opening portion is provided in the third mask by a photolithography process. The opening portion is provided at a portion where the P+ type contact layer 105 will be formed. Then, the P type impurities such as boron or aluminum are ion-implanted.

The implanted ions are activated. Thereby, the N+ type source region 104, the P+ type contact layer 105, and the P+ type body layer 106 are formed. The impurity concentration at the surface portion of the N+ type source region 104 is about $1.0 \times 10^{21}$ cm$^{-3}$ and the thickness of the N+ type source region 104 is about 0.3 µm, for example. The impurity concentration at the surface portion of the P+ type contact layer 105 is about $1.0 \times 10^{21}$ cm$^{-3}$ and the thickness of the source region is about 0.3 µm, for example. The impurity concentration of the P+ type body layer 106 is between about $1.0 \times 10^{18}$ cm$^{-3}$ and about $1.0 \times 10^{20}$ cm$^{-3}$, and the thickness of the P+ type body layer 106 is between about 0.7 µm and about 1.1 µm, for example. After that, the third mask is removed.

Figure 21C:
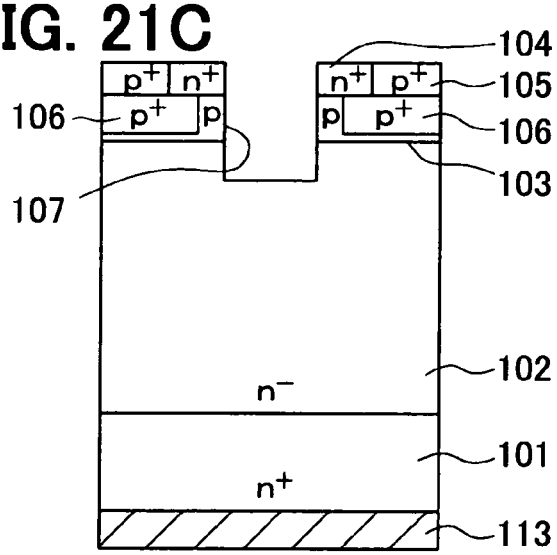
Figure 21D:
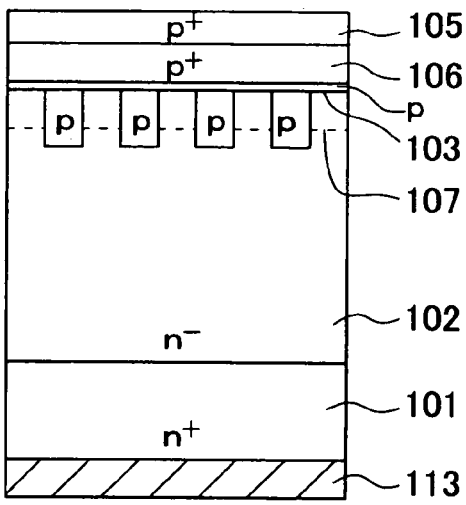

During a process illustrated in FIG. 21C and FIG. 21D, an etching mask is formed on the N+ type source region 104 and the P+ type contact layer 105. An opening portion is provided in the etching mask. The opening portion is provided at a portion where the trench 107 will be formed so that the trench 107 will be away from the P+ type body layer 106. Then, an anisotropic etching process is performed using the etching mask. After that, an isotropic etching process and/or a sacrificial oxidation are performed if needed. Thereby, the trench 107 is provided. The distance between the sidewall of the trench 107 and the P+ type body layer 106 is, for example, between about 0.4 µm and between about 0.9 µm. Then, the etching mask is removed.

During the process for proving the trench 107 and the process for implanting ions for forming the P+ type body layer 106, the masks can possibly be out of alignment.

Thereby, a positional relationship between the P+ type body layer 106 and the trench 107 may vary and the distance between the sidewall of the trench 107 and the P+ type body layer 106 may vary about 0.2 μm at the maximum.

The distance between the sidewall of the trench 107 and the P+ type body layer 106 is required to be greater than or equal to about 0.1 μm so that the inversion channel can be formed at the portion of the P type base region 103 without being affected by the impurity concentration of the P+ type body layer 106 and the channel mobility is not reduced.

In the MOSFET illustrated in FIG. 16, the distance between the sidewall of the trench 107 and the P+ type body layer 106 is greater than or equal to 0.4 μm. Thus, even if the masks are out of alignment, the distance will not be less than 0.2 μm. Therefore, the inversion channel can be formed at the portion of the P type base region 103 without being affected by the impurity concentration of the P+ type body layer 106 and the channel mobility does not reduced.

In a case where the P+ type body layer 106 is provided and the P type deep layers 110 are not provided, the breakdown voltage is provided only by the depletion layer expanding from the trench gate structure and the P+ type body layer 106. Thus, if the P+ type body layer 106 is away from the trench gate structure, the depletion layer expanding from the trench gate structure and the P+ type body layer 106 is difficult to provide a high breakdown voltage between the trench gate structure and the P+ type body layer 106. Thus, there is a limit to the distance between the sidewall of the trench 107 and the P+ type body layer 106. According to an experiment performed by the inventors, when the distance between the sidewall of the trench 107 and the P+ type body layer 106 is less than or equal to about 0.3 μm, the depletion layer expanding from the trench gate structure and the P+ type body layer 106 can provide a high breakdown voltage. However, even if the distance between the sidewall of the trench 107 and the P+ type body layer 106 is set to be about 0.3 μm, the distance may vary between about 0.1 μm and about 0.5 μm when the masks are out of alignment. Thus, the inversion channel may not be formed at the portion of the P type base region 103 due to the impurity concentration of the P+ type body layer 106. Furthermore, the depletion layer expanding from the trench gate structure and the P+ type body layer 106 may not provide the high breakdown voltage between the trench gate structure and the P+ type body layer 106. Thus the MOSFET according to the present embodiment includes both the P+ type body layer 106 and the P type deep layers 110.

Figure 21E:
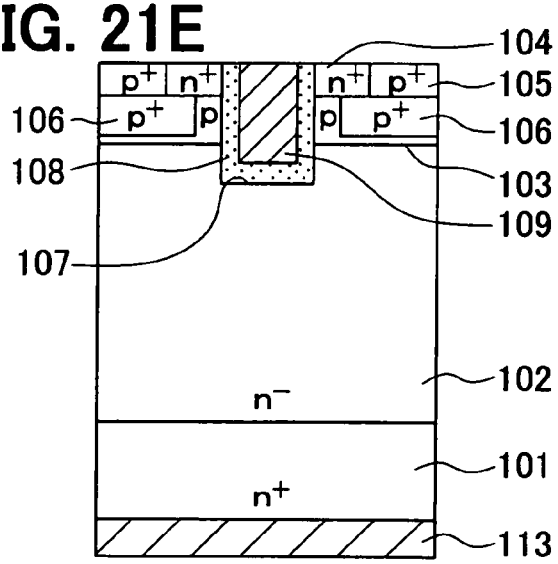
Figure 21F:
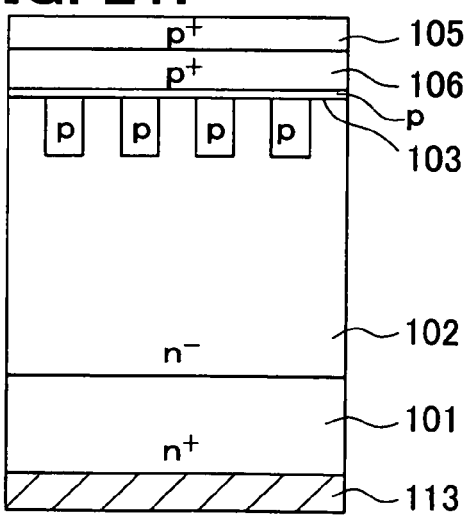

During a process illustrated in FIG. 21E and FIG. 21F, the gate oxide layer 108 is formed on the whole surface of the substrate including an inside of the trench 107. For example, the gate oxide layer 108 is formed by thermal oxidation in a wet atmosphere.

A polysilicon layer doped with the N type impurities is formed on the surface of the gate oxide layer 108, for example, at 600 degrees centigrade so as to have a thickness of about 440 nm. Then, an etch back process is performed so that the gate oxide layer 108 and the gate electrode 109 remain in the trench 107.

A process after forming the gate oxide layer 108 and the gate electrode 109 are similar to a known process. Therefore, the process after forming the gate oxide layer 108 and the gate electrode 109 is not illustrated. The interlayer insulating layer 112 is formed and the contact holes extending to corresponding ones of the N+ type source region 104 and the P+ type contact layer 105 are provided in a cross section of the interlayer insulating layer 112. In addition, the contact hole extending to the gate electrode 109 is provided in another cross section of the interlayer insulating layer 112. A layer of an electrode material is formed on the interlayer insulating layer 112 so as to fill the contact holes. The layer of the electrode material is pattern-formed so that the source electrode 111 and a gate wiring are formed. Thereby, the MOSFET illustrated in FIG. 16 is formed.

In the present manufacturing method, the P type deep layers 110 are not formed by providing trenches and epitaxially forming P type layers so as to fill the trenches. Thus, a planarization process after forming the P type layers is not required. As a result, a crystal defects, which can possibly generate due to the planarization process, can be prevented.

In the present manufacturing method, the P type deep layers 110 are formed by the ion implantation from the surface of the N− type drift layer 102. Alternatively, the ion implantation may be performed from the surface of the P type base region 103. When the ion implantation is performed from the surface of the N− type drift layer 102, the ion implantation does not require a high energy compared with a case where the ion implantation is performed from the surface of the P type base region 103. Thus, crystal defects, which can possibly generate due to an ion implantation with a high energy, can be prevented.

In a case where the longitudinal direction of the trench 107 and the longitudinal direction of the P type deep layers 110 are parallel to each other, a device property is affected by a variation in a distance between the trench 107 and the P type deep layers 110. Thus, a mask for providing the trench 107 and a mask for providing the P type deep layers 110 are required to be positioned with a high degree of accuracy. However, it is inevitable that the masks can possibly be out of alignment. Thus, an effect of a misalignment of the masks on the device property cannot be completely prevented. In the SiC semiconductor device according to the present embodiment, the longitudinal direction of the trench 107 and the longitudinal direction of the deep layers 110 are approximately perpendicular to each other. Thus, the device property is not affected by the misalignment of the masks. Thereby, a variation in the device property can be restricted and a yield can be improved.

In the above-described example, the distance between the sidewall of the trench 107 and the P+ type body layer 106 is set to be between about 0.4 μm and about 0.9 μm. When the width of each of the P type deep layers 110 is about 1.5 μm, the interval of the P type deep layers 110 is about 2.0 μm, and the distance between the sidewall of the trench 107 and the P+ type body layer 106 is between about 0.4 μm and about 0.9 μm, the breakdown voltage can be improved and the on-resistance can be reduced. The distance between the sidewall of the trench 107 and the P+ type body layer 106 can be set in accordance with the width and the interval of the P type deep layers 110.

Figure 22:
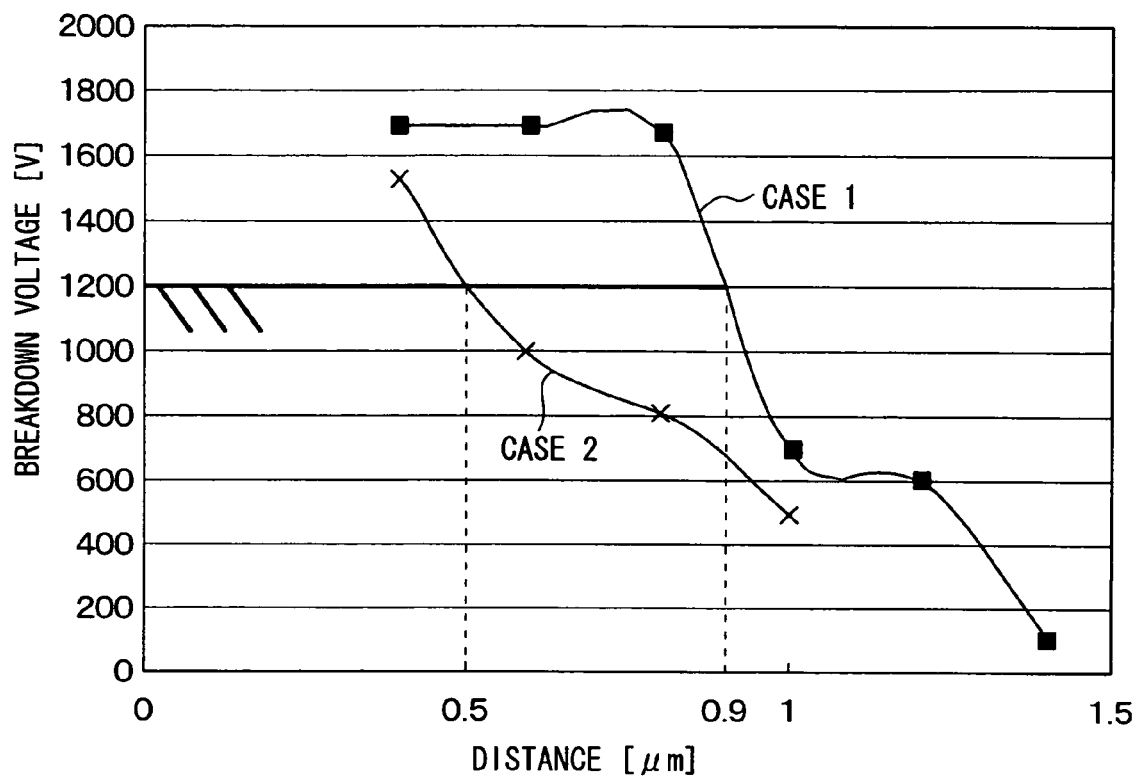
FIG. 22 is a graph illustrating a relationship between a distance from a trench gate structure to the P+ type body layer and a breakdown voltage.
Figure 23:
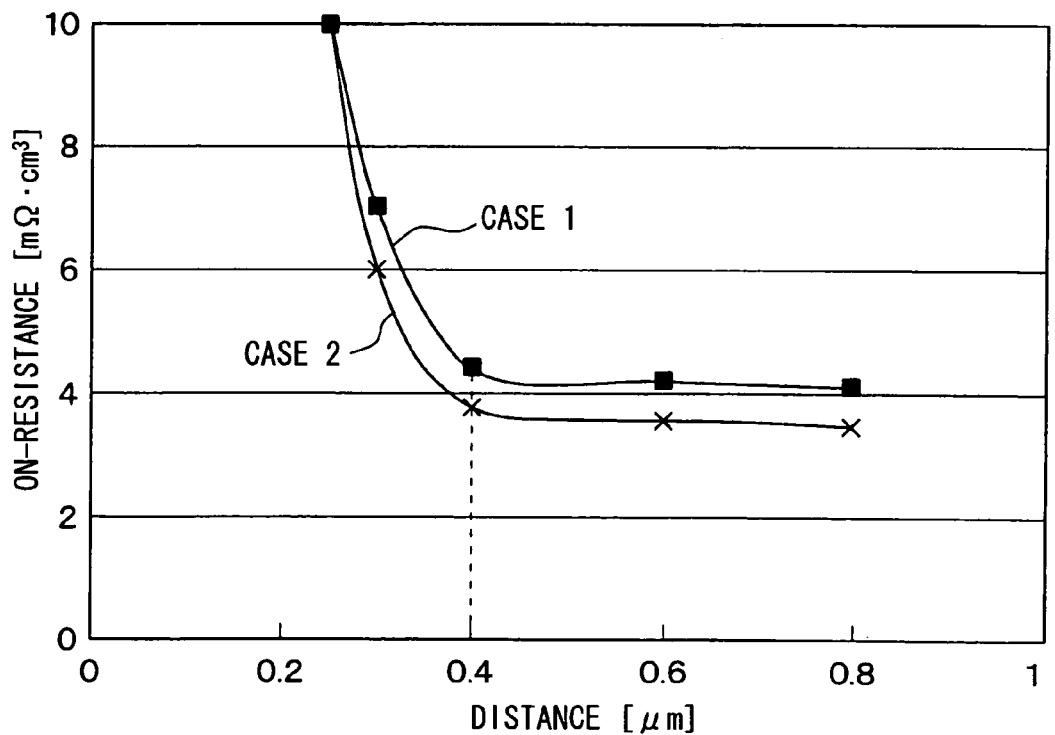
FIG. 23 is a graph illustrating a relationship between the distance from the trench gate structure to the P+ type body layer and an on-resistance.

In a case 1 where the width of the P type deep layers 110 is about 1.5 μm and the interval of the P type deep layers 110 is about 2.0 μm, when the distance between the sidewall of the trench 107 and the P+ type body layer 106 is less than or equal to about 0.9 μm, a breakdown voltage is greater than or equal to about 1200 V, as illustrated in FIG. 22. Furthermore, when the distance between the sidewall of the trench 107 and the P+ type body layer 106 is greater than or equal to 0.4 μm, the on-resistance is about 4 mΩ·cm$^2$, as illustrated in FIG. 23.

In a case 2 where the width of the P type deep layers 110 is about 1.5 μm and the interval of the P type deep layers 110 is about 3.0 μm, when the distance between the sidewall of the trench 107 and the P+ type body layer 106 is less than or equal to about 0.5 μm, a breakdown voltage is greater than or equal to about 1200 V, as illustrated in FIG. 22. Furthermore, when the distance between the sidewall of the trench 107 and the P+ type body layer 106 is greater than or equal to 0.4 μm, the on-resistance is about 4 mΩ·cm², as illustrated in FIG. 23.

In this way, the breakdown voltage can be improved and the on-resistance can be reduced by setting the distance between the trench 107 and the P+ type body layer 106 in accordance with the width and the intervals of the P type deep layers 110.

The SiC semiconductor device according to the present embodiment includes the N-channel type MOSFET, as an example. Alternatively, the SiC semiconductor device may include a P-channel type MOSFET in which conductivity types of the components are reversed. Alternatively, the SiC semiconductor device may include IGBTs each having a trench gate structure. In a case where the SiC semiconductor device include the IGBTs, the conductivity type of the N+ type substrate 101 is changed from the N conductivity type to the P conductivity type. Other structure and a manufacturing method are similar to the above-described method.

In the above-described manufacturing process, the P type base region 103, the N+ type source region 104, and the P+ type body layer 106 are formed before providing the trench 107. Alternatively, the P type base region 103, the N+ type source region 104, and the P+ type body layer 106 may be formed by ion implantation after providing the trench 107.

In the above-described method, the gate oxide layer 108 formed by the thermal oxidation is provided as an example of a gate insulating layer. Alternatively, the gate insulating layer may be an oxide layer formed by another method or a nitride layer, for example. The drain electrode 113 may be formed after forming the source electrode 111.

In the MOSFET illustrated in FIG. 16, the P type deep layers 110 are formed along the approximately normal direction of the sidewall of the trench 107, as an example. The P type deep layers 110 may also be formed along a direction inclined to the sidewall of the trench 107. Alternatively, a part of the P type deep layers 110 may be arranged in a direction inclined to one side from the normal direction of the sidewall of the trench 107 and the other part of the P type deep layers 110 may be arranged in a direction inclined to the opposite side of the one side from the normal direction. In the present case, the part of the P type deep layers 110 cross the other part of the P type deep layers 110, and thereby the P type deep layers 110 are arranged in a lattice pattern. At least the longitudinal direction of the P type deep layers 110 is set so as to cross the longitudinal direction of the trench 107. That is, when the trench 107 is provided along a first direction, the P type deep layers 110 are formed along a second direction crossing the first direction.

In the MOSFET illustrated in FIG. 16, the P+ type body layer 106 is located at a portion deeper than the N+ type source region 104 and shallower than the P type base region 103, as an example. The P+ type body layer 106 may also be located at a portion deeper than the P type base region 103. The P+ type body layer 106 may also be separated from the P+ type contact layer 105.

Sixth Embodiment

In the first to fifth embodiments, only the exemplary structures of the MOSFETs included in cell sections of the SiC semiconductor devices are described and a structure of an outer edge portion of a cell section and a structure of peripheral section surrounding an outer edge portion of the cell section are not described. Thus, exemplary structures of an outer edge portion of a cell section and a peripheral section will now be described.

Figure 24:
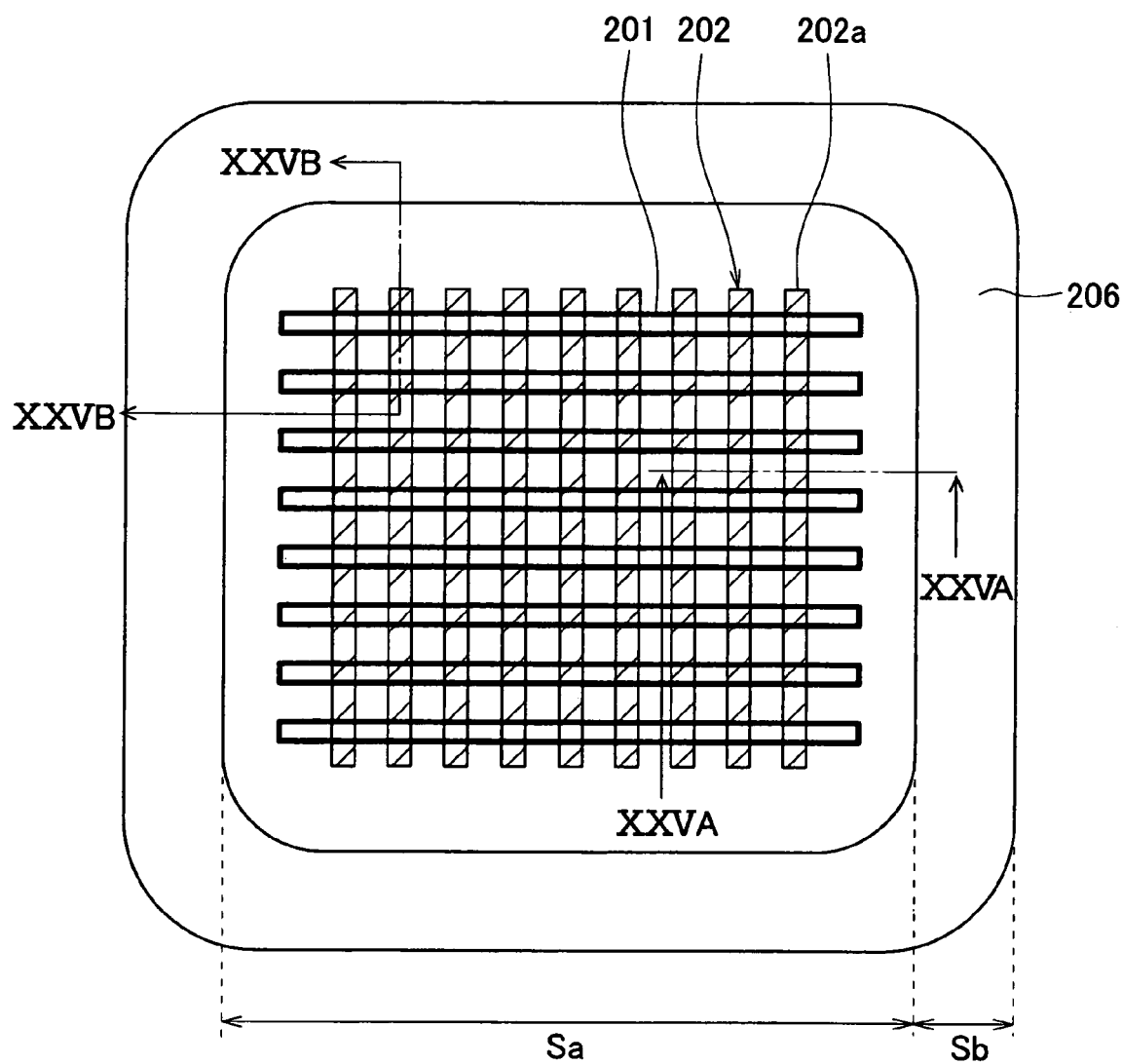
FIG. 24 is a diagram illustrating a top view of an SiC semiconductor device according to a comparative example.

At the beginning, a structure of an outer edge portion of a cell section and a peripheral section according to a comparative example will be described with reference to FIG. 24 to FIG. 25B. An SiC semiconductor device illustrated in FIG. 24 includes a plurality of trenches 201 arranged in a stripe pattern. The SiC semiconductor device further includes a plurality of P type deep layers 202. The P type deep layers 202 are arranged in a stripe pattern along an approximately normal direction to the longitudinal direction of the trenches 201 and are arranged in parallel with a planer direction of a substrate. The SiC semiconductor device includes a cell section Sa where the trenches 201 and the P type deep layers 202 are formed and a peripheral section Sb surrounding the cell section Sa. At the peripheral section Sb, a mesa structure portion 206 is provided. As illustrated in FIG. 25A and FIG. 25B, the mesa structure portion 206 is recessed to a portion deeper than a P type base region 203 and a P+ type contact layer 204 and reaches an N− type drift layer 205. At a boundary portion between the cell section Sa and the peripheral section Sb, a P type RESURF (reduced surface field) layer 207 is located. The P type RESURF layer 207 is formed from a sidewall of a stepped part of the mesa structure portion 206 and to a bottom surface of the stepped part. The P type RESURF layer 207 surrounds an outer edge portion of the cell section Sa. A plurality of P type guard ring layers 208 surround the P type RESURF layer 207. An N+ type layer 209 surrounds the P type RESURF layer 207 and the P type guard ring layers 208. A same potential ring electrode 210 is electrically coupled with the N+ type layer 209. Thereby, a peripheral high-voltage part is formed.

A breakdown voltage of the semiconductor device illustrated in FIG. 25 can be simulated as was performed by the inventors.

Figure 26:
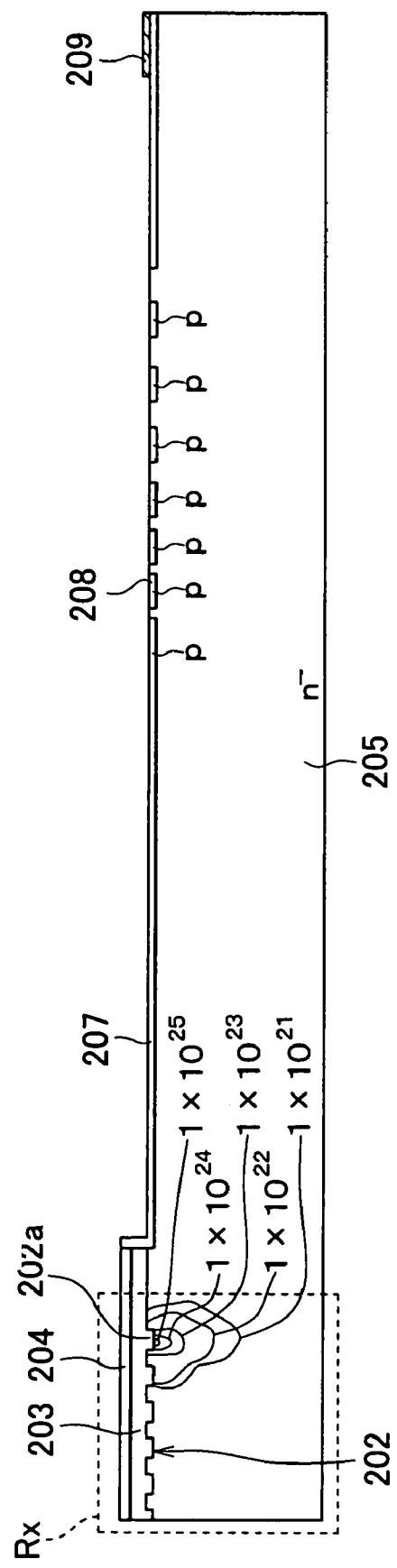
FIG. 26 is a diagram illustrating an impact ionization-rate distribution in the SiC semiconductor device according to the comparative example when a breakdown occurs in the SiC semiconductor device.
Figure 27A:
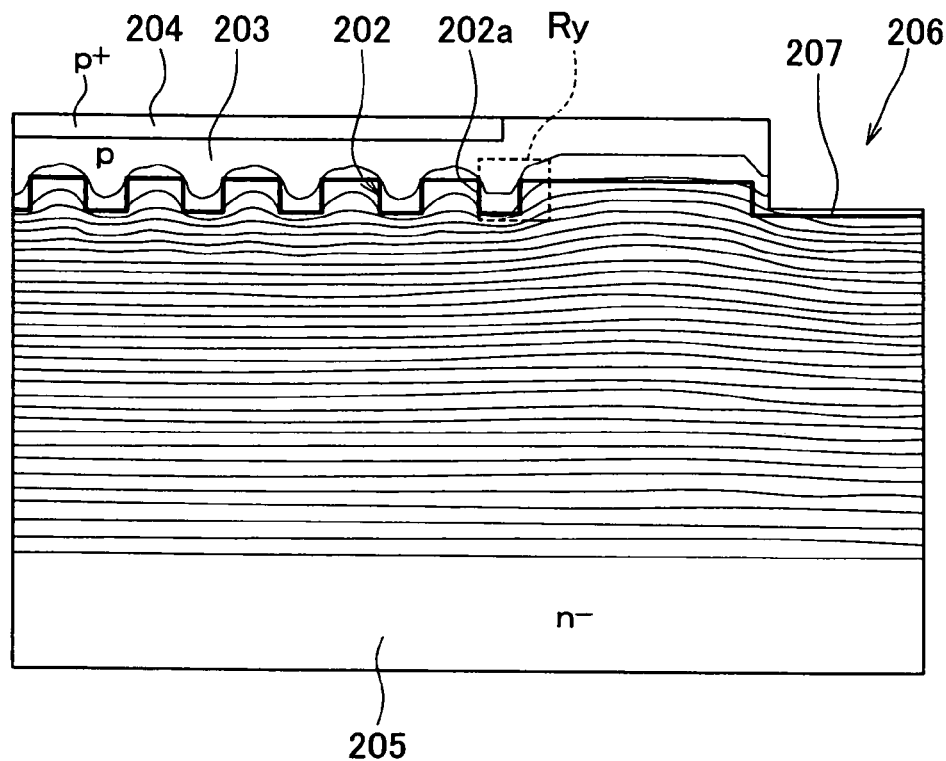
FIG. 27A is a diagram illustrating an electric potential distribution in a region Rx in FIG. 26.
Figure 27B:
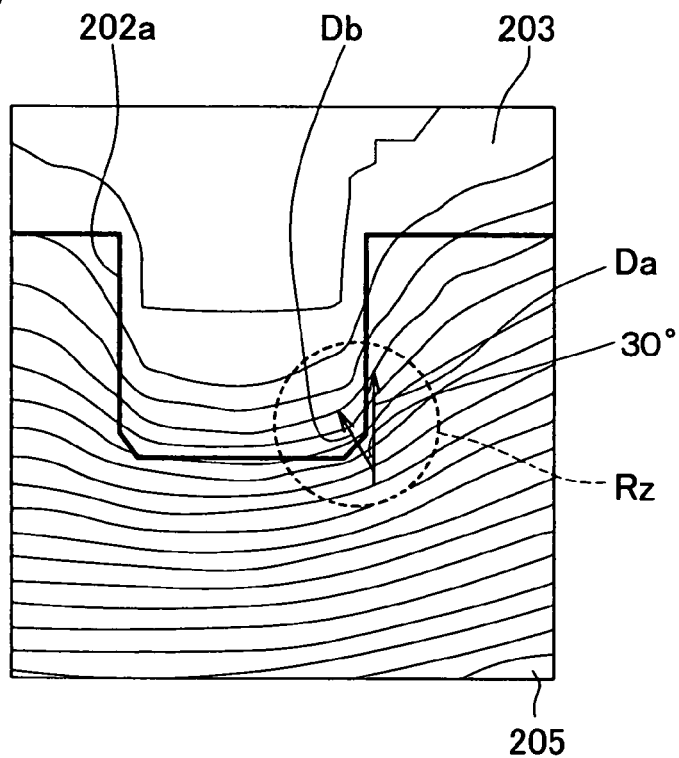
FIG. 27B is a diagram illustrating an electric potential distribution in a region Ry in FIG. 27A.

As illustrated in FIG. 26, a breakdown occurs at a P type deep layer 202a located at the outer edge portion of the cell section Sa and an impact ionization-rate distribution increases at a portion adjacent to the P type deep layer 202a. As illustrated in FIG. 27A and FIG. 27B, at a portion where the P type deep layers 202 are successively arranged, a high breakdown voltage can be provided by depletion layers expanding from each of the adjacent P type deep layers 202 and a depletion layer expanding from the P type base region 203. Thus, equipotential lines are restricted from entering the P type base region 203. However, the P type deep layer 202a located at the outer edge portion of the cell section Sa is arranged on outside of the other P type deep layers 202. Thus, as illustrated in FIG. 27B, the equipotential lines may enter an upper portion of the P type base region 203. Thus, the outer edge portion of the cell section Sa is difficult to have a high breakdown voltage.

A breakdown field strength of SiC depends on a plane direction. When the SiC semiconductor device is made of an SiC substrate having a Si-face, a vertical direction Da of the SiC substrate, that is, a direction from a rear surface to a front surface of the SiC substrate is a direction of a (0001)-face. Thus, the SiC semiconductor device can have a high breakdown voltage when an electric field is applied to the SiC semiconductor device in a state where a direction of equipotential lines corresponds to the planer direction of the substrate. However, at the P type deep layer 202a located at the outer edge portion of the cell section Sa, the equipotential lines incline with respect to the planer direction of the substrate. Thus, as illustrated in FIG. 27B, the electric field Db is applied to the P type deep layer 202a in a state that the electric field Db inclines from the vertical direction Da of the SiC substrate by about 30 degrees. Thus, at the portion adjacent to the P type deep layer 202a, the breakdown field strength may be reduced by about 20 percent compared with a case where the direction of the electric field corresponds to the direction of the (0001)-face. As a result, the portion adjacent to the P type deep layer 202a, for example, a portion surrounded by the circle Rz may be damaged.

Next, an SiC semiconductor device according to a sixth embodiment will be described with reference to FIG. 28 to FIG. 30D. The SiC semiconductor device includes a cell section Sa and a peripheral section Sb surrounding the cell section Sa. In the cell section Sa, a plurality of MOSFETs are formed. In the peripheral section Sb, a peripheral high-voltage part is formed.

The SiC semiconductor device includes an N+ type substrate 301 made of SiC. A main surface of the N+ type substrate 301 is a Si-face, that is, a vertical direction of the N+ type substrate 301 is a (0001)-face. The N+ type substrate 301 includes, for example, phosphorous as N type impurities. An impurity concentration of the N+ type substrate 301 is, for example, about $1.0 \times 10^{19}$ cm$^{-3}$. The N+ type substrate 301 has a thickness of, for example, about 300 μm. On a front surface of the N+ type substrate 301, an N− type drift layer 302 made of SiC is located. The N− type drift layer 302 includes, for example, phosphorus as N type impurities. An impurity concentration of the N− type drift layer 302 is, for example, between about $3.0 \times 10^{15}$ cm$^{-3}$ and about $7.0 \times 10^{15}$ cm$^{-3}$. The N− type drift layer 302 has a thickness, for example, between about 10 μm and about 15 μm. The impurity concentration of the N− type drift layer 302 may be substantially constant in a thickness direction of the N− type drift layer 302. Alternatively, the impurity concentration of the N− type drift layer 302 may be varied in the thickness direction of the N− type drift layer 302. For example, the impurity concentration of the N− type drift layer 302 may decrease toward a side away from the front surface of the N+ type substrate 301. The impurity concentration of a portion of the N− type drift layer 302 at a distance between about 3 μm and about 5 μm from the front surface of the N+ type substrate 301 may be greater than the impurity concentration of the other portion of the N− type drift layer 302 by about $2.0 \times 10^{15}$ cm$^{-3}$. In the present case, an internal resistance of the N− type drift layer 302 can be reduced. Thus, an on-resistance can be reduced.

At a surface portion of the N− type drift layer 302, a P type base region 303 is located. At a surface portion of the P type base region 303, an N+ type source region 304 and a P+ type contact layer 305 are located.

The P type base region 303 includes, for example, boron or aluminum as P type impurities. The impurity concentration of the P type base region 303 is, for example, between about $5.0 \times 10^{15}$ cm$^{-3}$ and about $5.0 \times 10^{16}$ cm$^{-3}$. The P type base region 103 has a thickness of, for example, about 2.0 μm. The N+ type source region 304 includes, for example, phosphorous as N type impurities. An impurity concentration of a surface portion of the N+ type source region 304 is, for example, about $1.0 \times 10^{21}$ cm$^{-3}$. The N+ type source region 304 has a thickness of, for example, about 0.3 μm. The P+ type contact layer 305 includes, for example, boron or aluminum as P type impurities. An impurity concentration of a surface portion of the P+ type contact layer 305 is, for example, about $1.0 \times 10^{21}$ cm$^{-3}$. The P+ type contact layer 305 has a thickness of, for example, about 0.3 μm.

The N+ type source region 304 sandwiches a trench 306. The P+ type contact layer 305 sandwiches the N+ type source region 304 and the trench 306.

The trench 306 penetrates the P type base region 303 and the N+ type source region 4 and reaches the N− type drift layer 302. The trench 306 has a width between about 1.4 μm and about 2.0 μm and has a depth greater than or equal to about 2.0 μm, for example, 2.4 μm. The P type base region 303 and the N+ type source region 304 are in contact with the sidewall of the trench 306.

A surface of the trench 306 is covered with a gate oxide layer 308. On a surface of the gate oxide layer 308, a gate electrode 309 is formed so as to fill the trench 306. The gate electrode 309 is made of doped polysilicon. The gate oxide layer 308 is formed, for example, by thermally oxidizing an inner wall of the trench 306. The gate oxide layer 308 has a thickness about 100 nm at the sidewall of the trench 306 and at a bottom portion of the trench 306.

Figure 29:
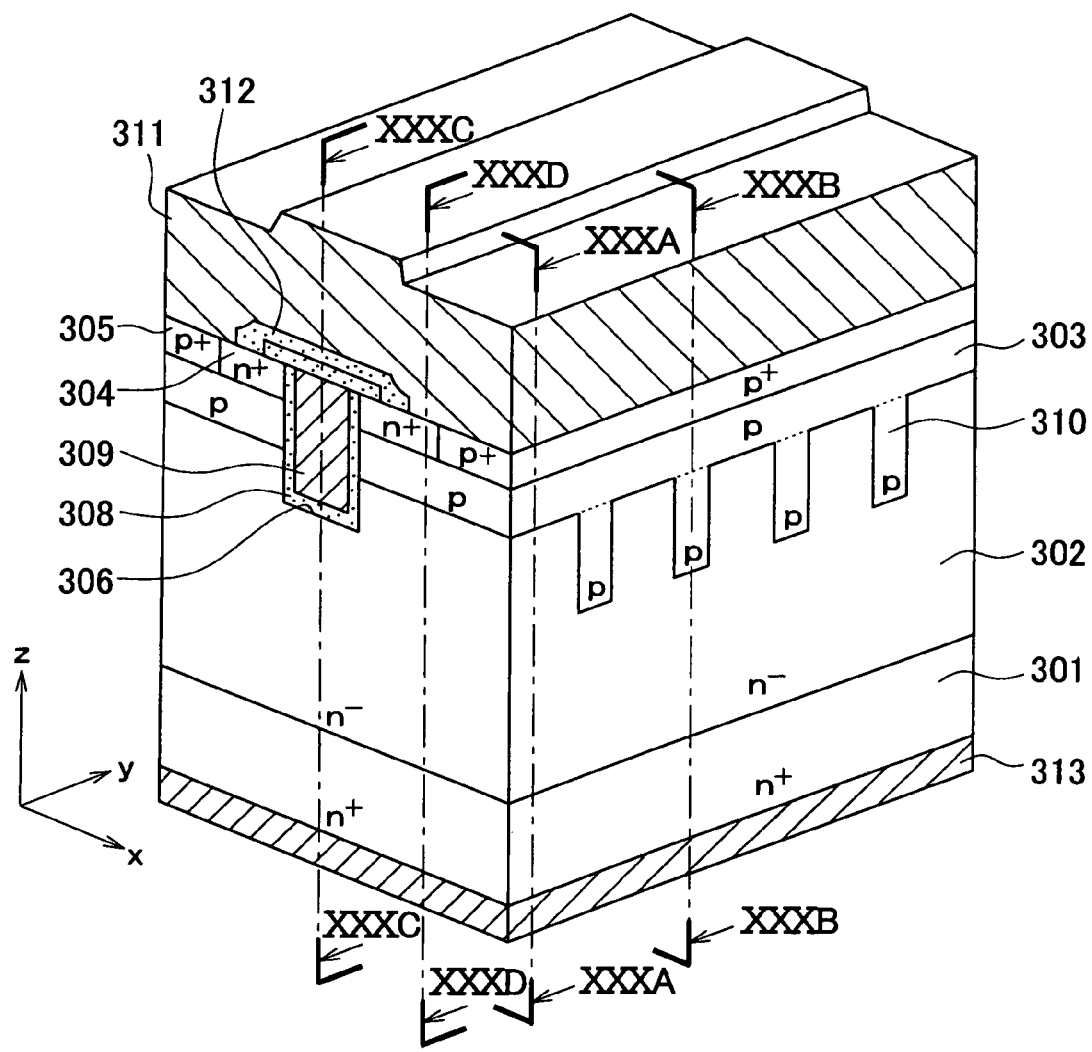
FIG. 29 is a diagram illustrating a perspective cross-sectional view of a MOSFET in the SiC semiconductor device according to the sixth embodiment.
Figure 30A:
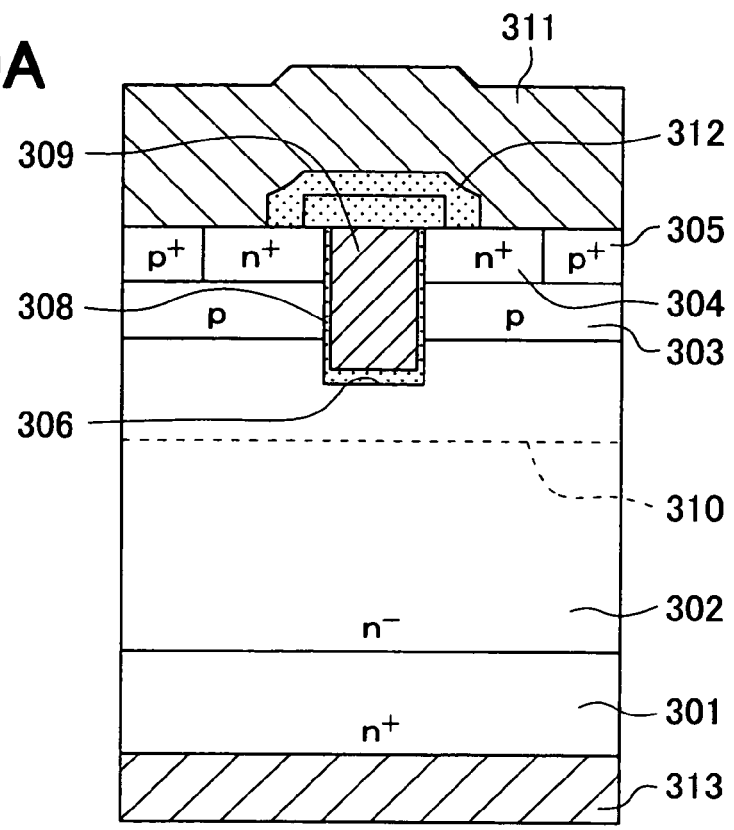
FIG. 30A is a diagram illustrating a cross-sectional view of the MOSFET taken along line XXXA-XXXA in FIG. 29.
Figure 30B:
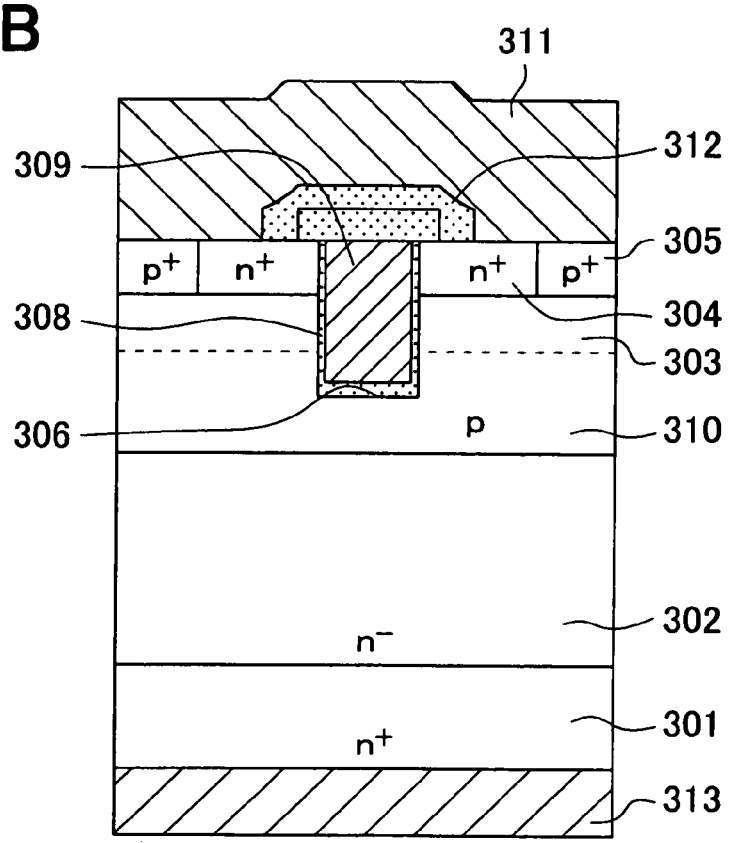
FIG. 30B is a diagram illustrating a cross-sectional view of the MOSFET taken along line XXXB-XXXB in FIG. 29.
Figure 30C:
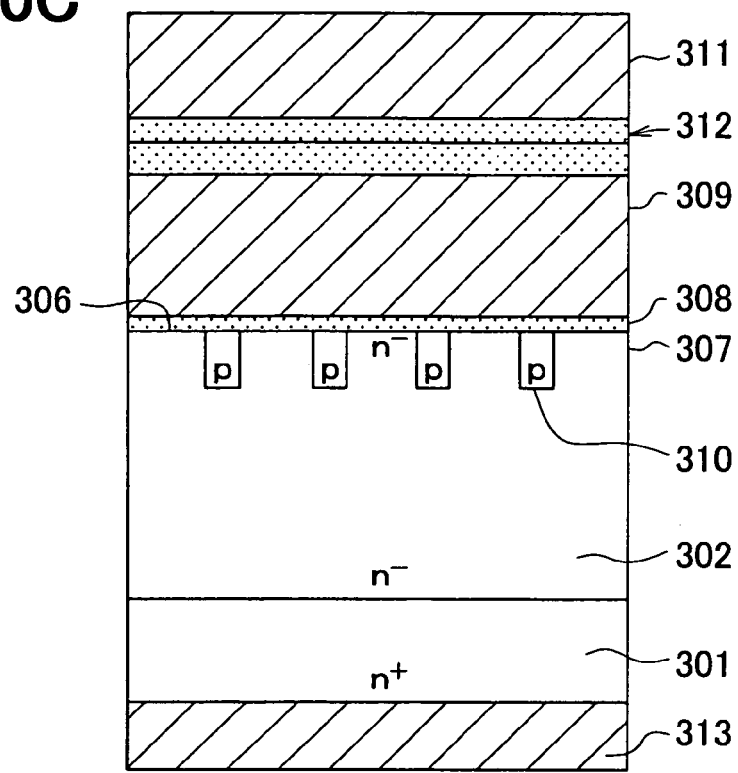
FIG. 30C is a diagram illustrating a cross-sectional view of the MOSFET taken along line XXXC-XXXC in FIG. 29.
Figure 30D:
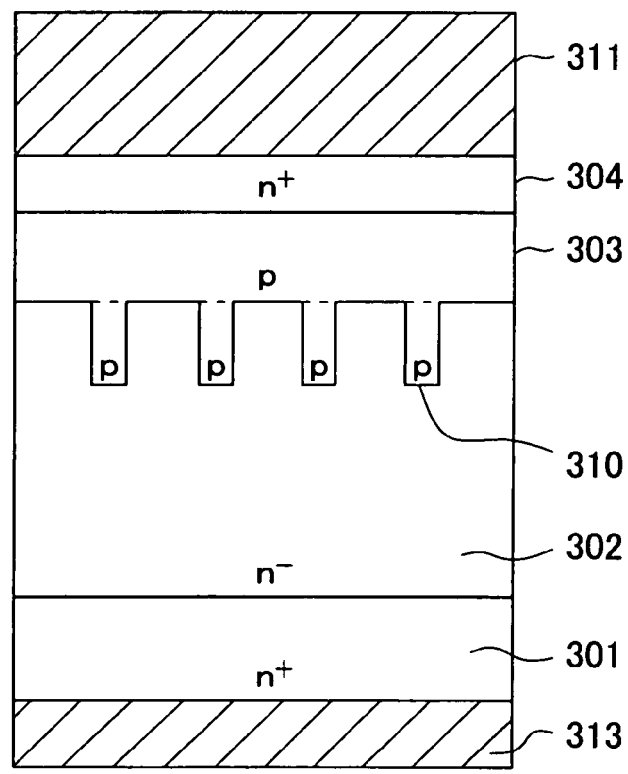
FIG. 30D is a diagram illustrating a cross-sectional view of the MOSFET taken along line XXXD-XXXD in FIG. 29.

The trench gate structure is formed along a y-direction illustrated in FIG. 29. That is, a longitudinal direction of the trench gate structure is the y-direction. A plurality of the trench gate structures is arranged in an x-direction that is approximately perpendicular to the longitudinal direction of the trench gate structure. The N+ type source region 304, the P+ type contact layer 305 are also formed along the longitudinal direction of the trench gate structure.

In the N− type drift layer 302, a P type deep layer 310 is located under the P type base region 303. The P type deep layer 310 has a plurality of stripe portions and an outer edge portion surrounding the stripe portion. The stripe portions of the P type deep layer 310 are formed along an approximately normal direction to the sidewall of the trench 306 where the channel region is provided. That is, the stripe portions of the P type deep layer 310 are formed in parallel with the planer direction of the N+ type substrate 301 along the x-direction approximately perpendicular to the longitudinal direction of the trench 306. The P type deep layer 310 extends to a depth deeper than the bottom portion the trench 306. For example, the P type deep layer 310 extends to a portion between about 2.6 μm and about 3.0 μm from the front surface of the N− type drift layer 302, that is, between about 0.6 μm and about 1.0 μm from a bottom portion of the P type base region 303. A width of each of the stripe portions of the P type deep layer 310 in the y-direction is between about 0.6 μm and about 1.0 μm. The P type deep layer 310 includes, for example, boron or aluminum as P type impurities. An impurity concentration of the P type deep layer 310 is between about $1.0 \times 10^{17}$ cm$^{-3}$ and about $1.0 \times 10^{19}$ cm$^{-3}$, for example, about $5.0 \times 10^{17}$ cm$^{-3}$. At an inner portion of the cell section Sa, the stripe portions of the P type deep layer 310 are arranged in the longitudinal direction of the trench gate structure in a stripe pattern. The stripe portions of The P type deep layer 310 are parallel to each other and an interval of the stripe portions is, for example, between about 1.5 μm and about 3 μm. The outer edge portion of the P type deep layer 310 is formed at the whole area of the outer edge portion of the cell section Sa and reaches the peripheral section Sb.

The P type base region 303 and the P+ type contact layer 305 are formed above the P type deep layer 310 to the portion that is not active, that is, the outer edge portion of the cell section Sa. Also at the portion that is not active, a source electrode 311 is electrically coupled with the P+ type contact layer 305.

On surfaces of the N+ type source region 304, the P+ type contact layer 305, and the gate electrode 309, the source electrode 311 and a gate wiring (not shown) are formed. The source electrode 311 and the gate wiring are made of a plurality of metals, for example, an alloy of nickel and aluminum. At least portions of the source electrode 311 being in contact with an N type SiC are made of a metal that can provide an ohmic connection between each of the source electrode 311 and the N type SiC. At least portions of the source electrode 311 being in contact with a P type SiC are made of a metal that can provide an ohmic connection between each of the source electrode 311 and the P type SiC. The source electrode 311 and the gate wiring are formed on an interlayer insulating layer 312. Thus, the source electrode 311 and the gate wiring are electrically insulated. The source electrode 311 is electrically coupled with the N+ type source region 304 and the P+ type contact layer 305 through contact holes provided in the interlayer insulating layer 312. The gate wiring is electrically coupled with the gate electrode 309 though a contact hole provided in the interlayer insulating layer 312.

On a rear surface of the N+ type substrate 301, a drain electrode 313 is formed. The drain electrode 313 is electrically coupled with the N+ type substrate 301. In this way, an N-channel inversion type MOSFET having a trench gate structure is formed.

Exemplary structures of the outer edge portion of the cell section Sa and the peripheral portion Sb will now be described with reference to FIG. 31A and FIG. 31B.

At the peripheral section Sb, a mesa structure portion 314 is provided. The mesa structure portion 314 is recessed to a portion deeper than the P type base region 303 and the P+ type contact layer 305 and reaches the N− type drift layer 302. The mesa structure portion 314 has a depth, for example, between about 2.1 μm and about 2.5 μm. At a boundary portion between the cell section Sa and the peripheral section Sb, a P type RESURF layer 315 is located. The P type RESURF layer 315 is formed from a sidewall of a stepped part of the mesa structure portion 314 to a bottom surface of the stepped part. The P type RESURF layer 315 surrounds the outer edge portion of the cell section Sa. A plurality of P type guard ring layers 316 surround the P type RESURF layer 315. An N+ type layer 317 surrounds the P type RESURF layer 315 and the P type guard ring layers 316. A same potential ring electrode 318 is electrically coupled with the N+ type layer 317. Thereby, the peripheral high-voltage part is formed.

The P type RESURF layer 315 is formed from the boundary portion between the cell section Sa and the peripheral section Sb toward an outside of the cell section Sb, for example, by about 20 μm. A part of the P type RESURF layer 315 formed on the sidewall of the stepped part of the mesa structure portion 314 has a thickness of about 0.7 μm in an approximately horizontal direction and includes P type impurities of about $1.0 \times 10^{17}$ cm$^{-3}$. A part of the P type RESURF layer 315 formed on the bottom surface of the recess part of the mesa structure portion 314 has a depth of about 0.7 um from the bottom surface and includes P type impurities of about $4.0 \times 10^{17}$ cm$^{-3}$. As described above, the depth of the P type deep layers 310 from the surface of the N− type drift layer 302 is, for example, between about 2.6 μm and about 3.0 μm. Thus, the depth of the P type deep layer 310 from the bottom surface of the recess part of the mesa structure portion 314 is similar to the depth of the P type RESURF layer 315 from the bottom surface of the recess part of the mesa structure portion 314.

At the whole area of the outer edge portion of the cell section Sa, the outer edge portion of the P type deep layer 310 is formed toward the peripheral section Sb. Thus, the trench gate structures and the stripe portions of the P type deep payer 310 that are arranged in the stripe pattern are surrounded by the outer edge portion of the P type deep layer 310. At the boundary portion of the cell section Sa and the peripheral section Sb, the outer edge portion of the P type deep layer 310 is connected with the P type RESURF layer 315.

The P type RESURF layer 315 is surrounded, for example, by six P type guard ring layers 316. In the P type guard ring layers 316, the most inner layer is located, for example, at about 0.5 μm from the P type RESURF layer 315. A width of each of the P type guard ring layers 316 is, for example, about 2 μm. An interval of the P type guard ring layers 316 is, for example, about 1 μm. A depth of each of the P type guard ring layers 316 is, for example, about 0.7 μm. Each of the P type guard ring layers 316 includes P type impurities of $1.0 \times 10^{18}$ cm$^{-3}$, for example.

The MOSFET according to the present embodiment may be operated, for example, as described below.

Before applying a gate voltage to the gate electrode 309, the channel region is not provided at a portion of the P type base region 303 located on the sidewall of the trench 306. Thus, even if a positive voltage is applied to the drain electrode 313, electrons are prevented from moving due to the PNP junction structure configured by the N− type drift layer 302, the P type base region 303, and the N+ type source region 304. Therefore, electric current does not flow between the source electrode 311 and the drain electrode 313.

When the MOSFET is activated, for example, when the gate voltage is about 20 V, the drain voltage is about 1 V, and the source voltage is about 0 V, the gate electrode 309 is applied with the gate voltage of about 20 V. Thus, the inversion channel is formed at a portion of the P type base region 303 adjacent to the sidewall of the trench 306, and thereby the channel region is provided. Electrons induced from the source electrode 311 flows to the N− type drift layer 302 through the N+ type source region 304 and the channel region in the P type base region 303. Thereby, electric current flows between the source electrode 311 and the drain electrode 313.

When the MOSFET is deactivated, for example, when the gate voltage is 0 V, the drain voltage is about 650 V, and the source voltage is 0 V, even if a voltage is applied to the drain electrode 313, the voltage creates a reverse bias. Thus, depletion layers expand from a joint portion of the P type deep layer 310 and the N− type drift layer 302 and a joint portion of the P type RESURF layer 315 and the N− type drift layer 302. In the SiC semiconductor device according to the present embodiment, the impurity concentration of the P type deep layer 310 is, for example, about $5.0 \times 10^{17}$ cm$^{-3}$ and the impurity concentration of the P type RESURF layer 315 is, for example, about $4.0 \times 10^{17}$ cm$^{-3}$. Thus, the impurity concentrations of the P type deep layer 310 and the P type RESURF layer 315 are about 100 times greater than the impurity concentration of the N− type drift layer 302. Therefore, the depletion layers expand mostly toward the N− type drift layer 302.

The depth of the P type deep layer 310 is similar to the depth of the P type RESURF layer 315. Thus, the depletion layer expanding from the joint portion of the outer edge portion of the P type deep layer 310 and the N− type drift layer 302 is easily connected with the depletion layer expanding from the joint portion of the P type RESURF layer 315 and the N− type drift layer 302, and the depletion layer expands to the P type guard ring layers 316. Equipotential lines in the depletion layer are substantially horizontal at the joint portion of the outer edge portion of the P type deep layer 310 and the P type RESURF layer 315. Thus, an electric field concentration does not occur at the joint portion of the P type deep layer 310 and the P type RESURF layer 315 but at a portion in the vicinity of the P type guard ring layers 316.

Figure 32D:
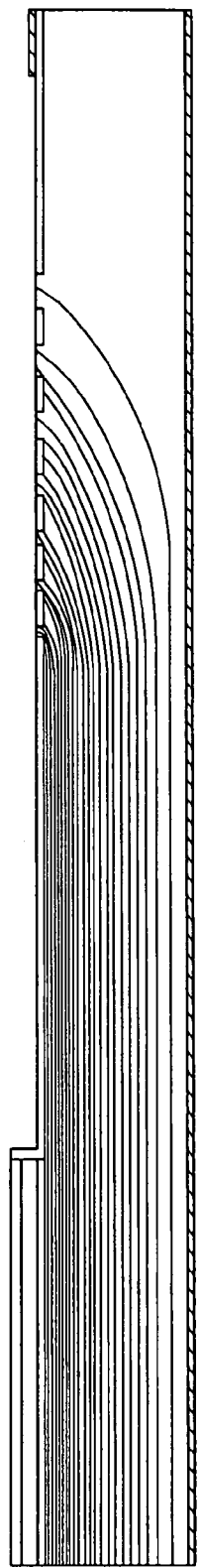
FIG. 32D is a diagram illustrating an electric potential distribution in the SiC semiconductor device illustrated in FIG. 32A in a case where a drain electrode is about 1200 V.
Figure 32E:
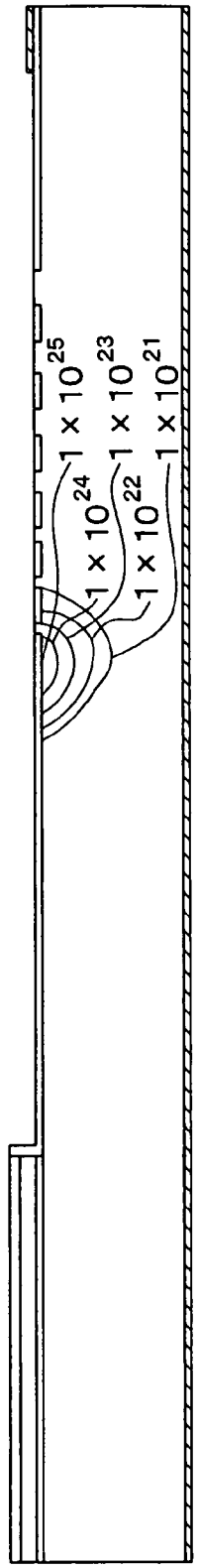
FIG. 32E is a diagram illustrating an impact ionization-rate distribution in the SiC semiconductor device illustrated in FIG. 32B when a breakdown occurs in the SiC semiconductor device.

In the SiC semiconductor device according to the present embodiment, a part in the vicinity of the joint portion of the P type deep layer 310 and the P type RESURF layer 315 is illustrated in FIG. 32A. In a cases where the drain voltage Vd is about 200 V, about 400 V, and about 1200 V, the electric potential distribution at the part in the vicinity of the joint portion of the P type deep layer 310 and the P type RESURF layer 315 become as illustrated in FIG. 32B, FIG. 32C, and FIG. 32D, respectively. In FIG. 32B to FIG. 32D, equipotential lines are illustrated at 70 V intervals. When a breakdown occurs in the SiC semiconductor device, an impact ionization-rate distribution becomes as illustrated in FIG. 32E.

As illustrated FIG. 32B to FIG. 32D, the equipotential lines are substantially horizontal to a planer direction of the N+ type substrate 301 at the joint portion of the P type deep layer 310 and the P type RESURF layer 315. Electric field applies in a vertical direction of the equipotential lines. Thus, at a portion under the joint portion of the P type deep layer 310 and the P type RESURF layer 315, the electric filed applies in a direction approximately vertical to the planer direction of the N+ type substrate 301, that is, in the direction of (0001)-face. The equipotential lines terminate at the P type guard ring layers 316 in a state where the equipotential lines expand sufficiently. The electric field is relaxed by the P type guard ring layers 316. When the drain voltage is high, the electric field concentration does not occur at the portion under the joint portion of the P type deep layer 310 and the P type RESURF layer 315 but at a portion in the vicinity of the P type guard ring layers 316.

As described above, at the portion under the joint portion of the P type deep layer 310 and the P type RESURF layer 315, the electric field applies in the direction of (0001)-face, which has the highest breakdown voltage. Thus, a breakdown does not occur at the outer edge portion of the P type deep layer 310 but at the portion in the vicinity of the P type guard ring layers 316 as illustrated in FIG. 32E. According to a simulation performed by the inventors, the SiC semiconductor device according to the comparative example has a breakdown voltage of about 1100 V and the SiC semiconductor device according to the present embodiment has a breakdown voltage of about 1450 V. Thus, by restricting a breakdown at the P type deep layer 310, the SiC semiconductor device according to the present embodiment can have a high breakdown voltage.

Figure 33A:
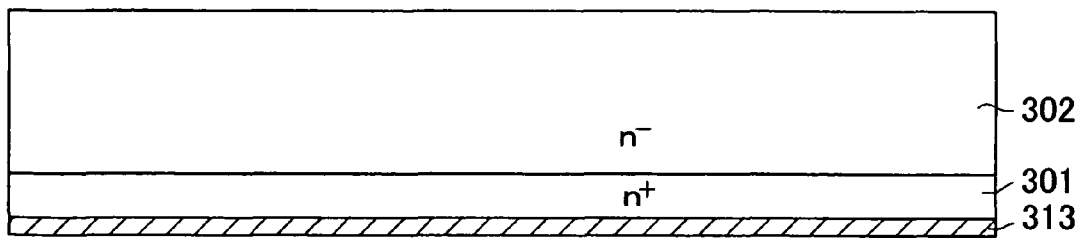
FIG. 33A to FIG. 33E are diagrams illustrating cross-sectional views of an exemplary manufacturing process of the SiC semiconductor device taken along line XXXIB-XXXIB in FIG. 28.

An exemplary method of manufacturing the SiC semiconductor device according to the present embodiment will be described with reference to FIG. 33A to FIG. 33E During a process illustrated in FIG. 33A, the N+ type substrate 301 made of SiC is prepared. The main surface of the N+ type substrate 301 is the Si-face, that is, the vertical direction of the planer direction of the N+ type substrate 301 is the direction of (0001)-face. On the rear surface of the N+ type substrate 301, the drain electrode 313 is formed. On the front surface of the N+ type substrate 301, the N− type drift layer 302 made of SiC is epitaxially formed.

Figure 33B:
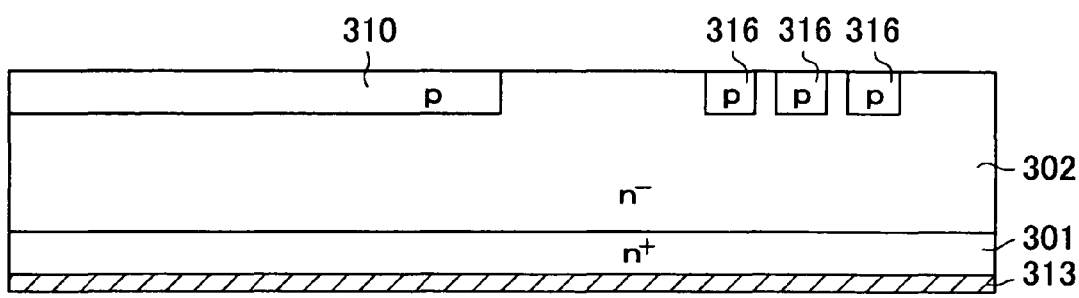

During a process illustrated in FIG. 33B, a mask is formed on the surface of the N− type drift layer 302. The mask is made of LTO, for example. Opening portions are provided in the mask by a photolithography process. The opening portions are provided at regions where the P type deep layer 310 and the P type guard ring layers 316 will be formed. Then, P type impurities, for example, boron or aluminum, are ion-implanted through the mask and are activated. Thereby, the P type deep layer 310 and the P type guard ring layers 316 are formed. After that, the mask is removed.

Figure 33C:
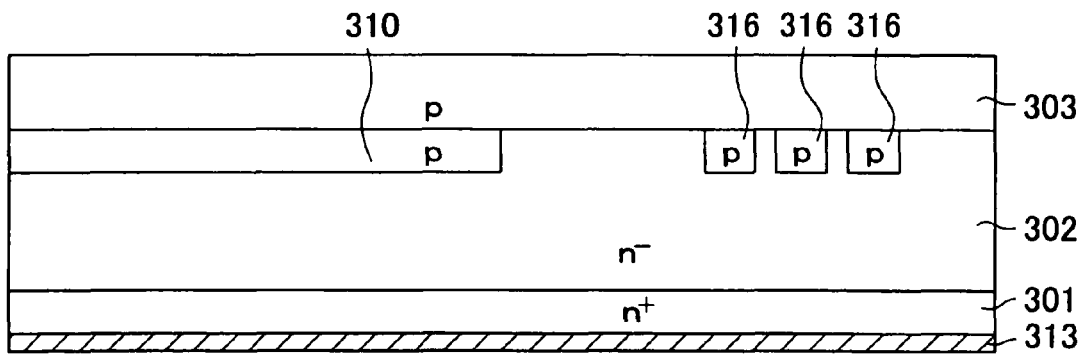

During a process illustrated in FIG. 33C, the P type base region 303 is epitaxially formed on the surface of the N− type drift layer 302.

Figure 33D:
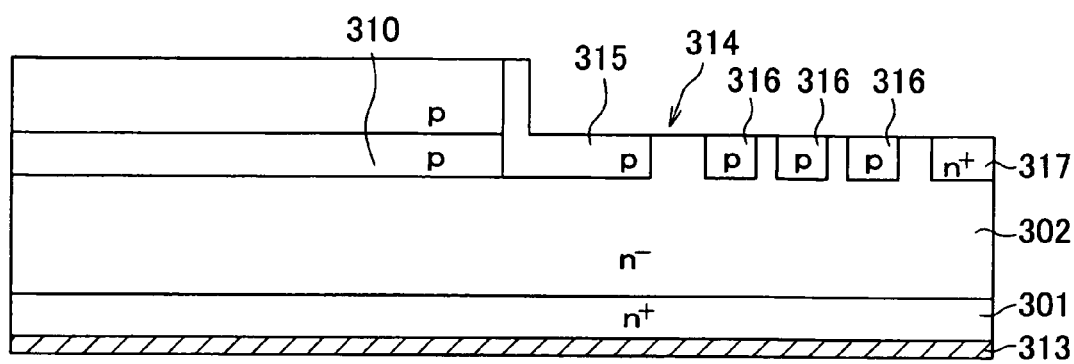

During a process illustrated in FIG. 33D, an etching mask is formed on the P type base region 303 and a peripheral section of the etching mask is opened. Then, the peripheral section Sb of the P type base region 303 is etched so that the recess part reaches the N− type drift layer 302 and the P type guard ring layers 316 are exposed to an outside of the P type base region 303. Thereby, the mesa structure portion 314 is formed. After removing the etching mask, another mask, for example, made of LTO is formed. Then, an opening portion is provided in the mask at a portion where the P type RESURF layer 315 will be formed. The P type impurities are ion-implanted through the mask and are activated. Thereby, the P type RESURF layer 315 is formed. After that, the mask is removed.

Figure 33E:
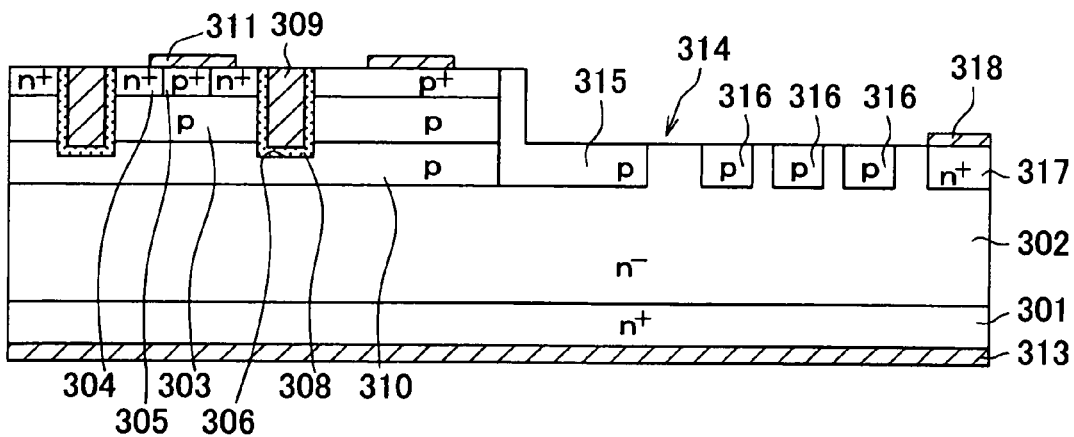

During a process illustrated in FIG. 33E, a mask, for example, made of LTO is formed on the P type base region 303. An opening portion is provided in the mask by a photolithography process. The opening portion is provided at a portion where the N+ type source region 304 will be formed. Then, the N type impurity, for example, nitrogen is ion-implanted. After removing the mask, another mask is formed and an opening portion is provided in the mask by a photolithography process. The opening portion is provided at a portion where the P+ type contact layer 305 will be formed. Then, the P type impurity, for example, nitrogen is ion-implanted. By activating the implanted ions, the N+ type source region 304 and the P+ type contact layer 305 are formed.

Furthermore, an etching mask is formed on the P type base region 303, N+ type source region 304, and the P+ type contact layer 305. An opening portion is provided in the etching mask at a portion where the trench 306 will be formed. Then, an anisotropic etching process is performed using the etching mask. After that, an isotropic etching process and/or a sacrificial oxidation are performed if needed. Thereby, the trench 306 is provided. Then, the etching mask is removed.

Next, the gate oxide layer 308 is formed on the whole surface of the substrate including an inside of the trench 306. For example, the gate oxide layer 308 is formed by thermal oxidation in a wet atmosphere. A polysilicon layer doped with the N type impurities is formed on the surface of the gate oxide layer 308, for example, at 600 degrees centigrade so as to have a thickness of about 440 nm. Then, an etch back process is performed so that the gate oxide layer 308 and the gate electrode 309 remain in the trench 306.

Figure 28:
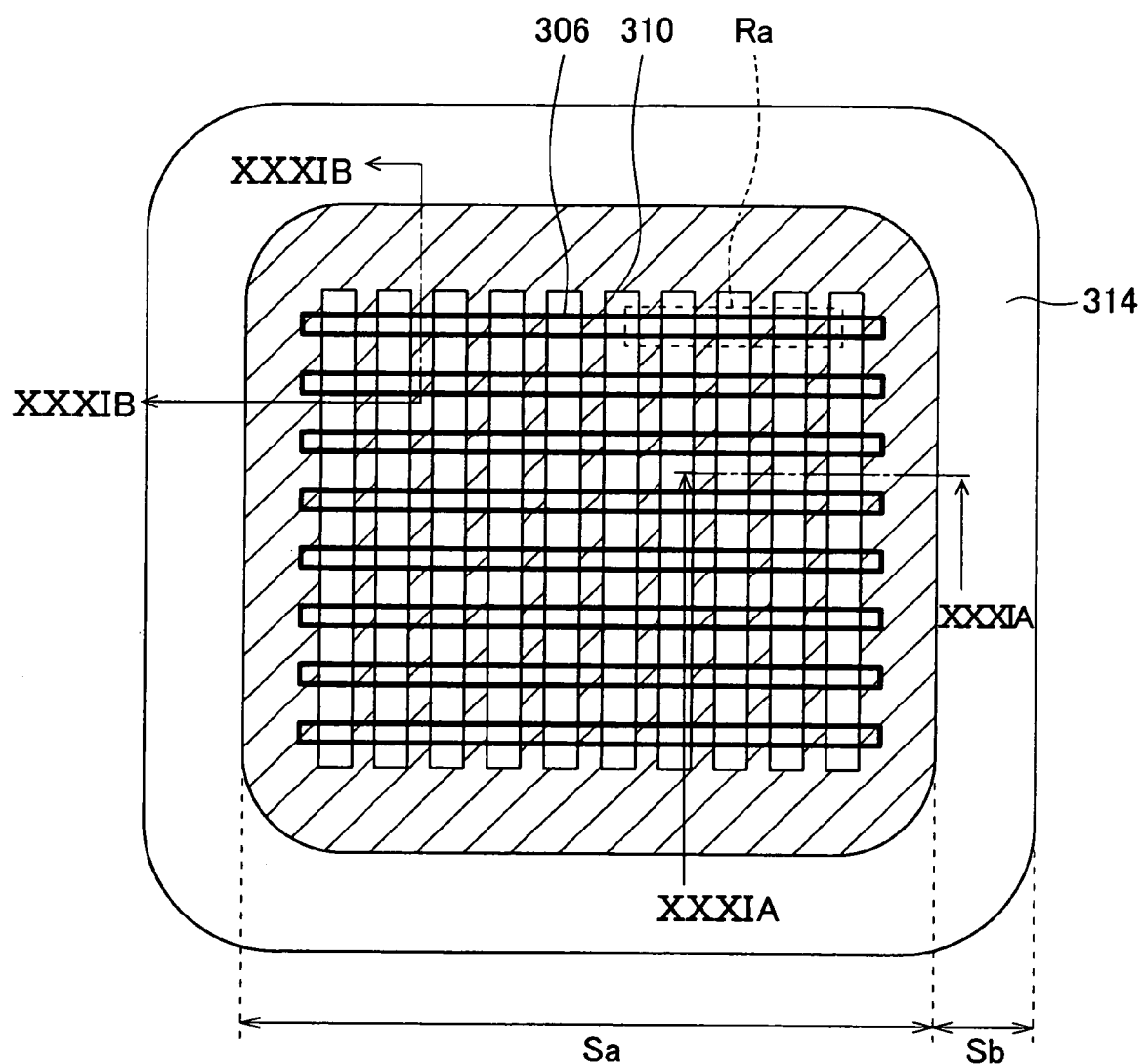
FIG. 28 is a diagram illustrating a top view of an SiC semiconductor device according to a sixth embodiment.

The interlayer insulating layer 312 is formed and the contact holes extending to corresponding ones of the N+ type source region 304 and the P+ type contact layer 305 are provided in a cross section of the interlayer insulating layer 312. In addition, the contact hole extending to the gate electrode 309 is provided in another cross section of the interlayer insulating layer 312. A layer of an electrode material is formed on the interlayer insulating layer 312 so as to fill the contact holes. The layer of the electrode material is pattern-formed so that the source electrode 311 and a gate wiring are formed. Thereby, the SiC semiconductor device illustrated in FIG. 28 is formed.

As described above, in the SiC semiconductor device according to the present embodiment, the outer edge portion of the P type deep layer 310 is formed at the whole area of the outer edge portion of the cell section Sa so as to reach the peripheral section Sb. Thus, the equipotential lines are substantially horizontal to a planer direction of the N+ type substrate 301 at the joint portion of the P type deep layer 310 and the P type RESURF layer 315, and the electric field applies in the vertical direction of the planer direction of the N+ type substrate 301, that is, in the direction of the (0001)-face. Therefore, when the drain voltage is high, the electric field concentration does not occur at the portion under the joint portion of the P type deep layer 310 and the P type RESURF layer 315 but at the portion in the vicinity of the P type guard ring layers 316.

Thus, a breakdown does not occur at the outer edge portion of the P type deep layer 310 but at the portion in the vicinity of the P type guard ring layers 316. As a result, by restricting a breakdown at the P type deep layer 310, the SiC semiconductor device according to the present embodiment can have a high breakdown voltage.

Seventh Embodiment

Figure 34:
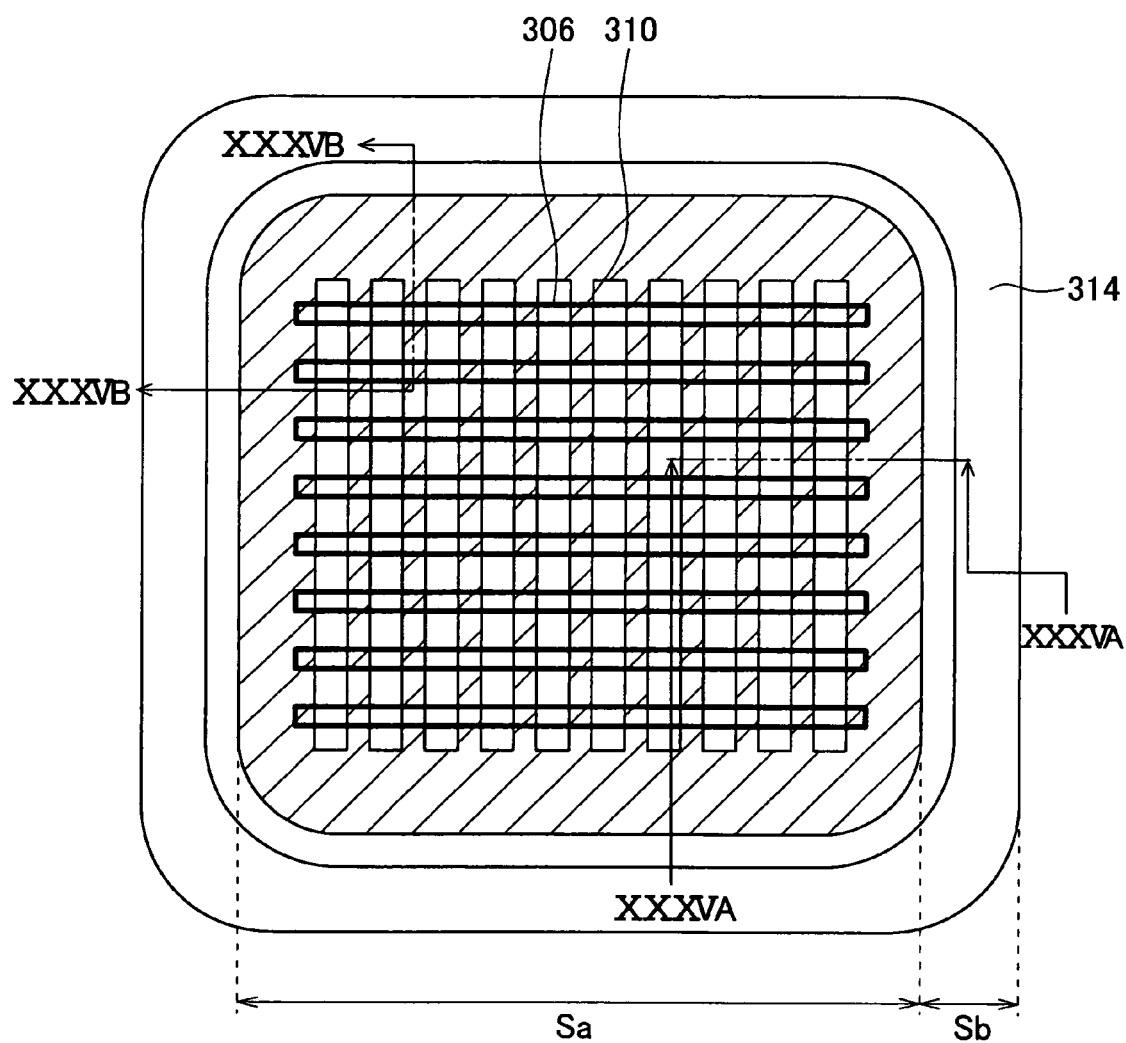
FIG. 34 is a diagram illustrating a top view of an SiC semiconductor device according to a seventh embodiment.

An SiC semiconductor device according to a seventh embodiment of the present invention will be described with reference to FIG. 34, FIG. 35A and FIG. 35B.

In the SiC semiconductor device according to the present embodiment, the outer edge portion of the P type deep layer 310 does not reach the peripheral section Sb and is away from the P type RESURF layer 315. A distance between the P type deep layer 310 and the P type RESURF layer 315 is less than the intervals of the stripe portions of the P type deep layer 310.

Thus, a depletion layer expanding from the outer edge portion of the P type deep layer 310 is connected with a depletion layer expanding from the P type RESURF layer 315. Thus, at a portion between the P type deep layer 310 and the P type RESURF layer 315, the equipotential lines are restricted from entering the P type base region 303 more effectively than a portion between the stripe portions of the P type deep layer 310.

Thus, the equipotential lines are substantially horizontal to the planer direction of the N+ type substrate 301 at the portion between the P type deep layer 310 and the P type RESURF layer 315, and the electric field applies in the vertical direction of the planer direction of the N+ type substrate 301, that is, in the direction of the (0001)-face. Therefore, the SiC semiconductor device according to the present embodiment can have effects similar to the effects of the SiC semiconductor device according to the sixth embodiment.

In addition, in the SiC semiconductor device according to the present embodiment, a clearance is provided between the P type deep layer 310 and the P type RESURF layer 315. Because the P type deep layer 310 and the P type RESURF layer 315 are formed at different processes, the P type deep layer 310 may overlap the P type RESURF layer 315 due to misalignment of masks. However, by providing the clearance between the P type deep layer 310 and the P type RESURF layer 315, the overlap of the P type deep layer 310 and the P type RESURF layer 315 due to the misalignment of the masks can be restricted. If the P type deep layer 310 overlaps the P type RESURF layer 315 and the impurity concentration increases, the equipotential lines may be distorted and the electric field concentration may occur. However, by providing the clearance between the P type deep layer 310 and the P type RESURF layer 315, the electric filed concentration can be restricted.

Eighth Embodiment

Figure 36:
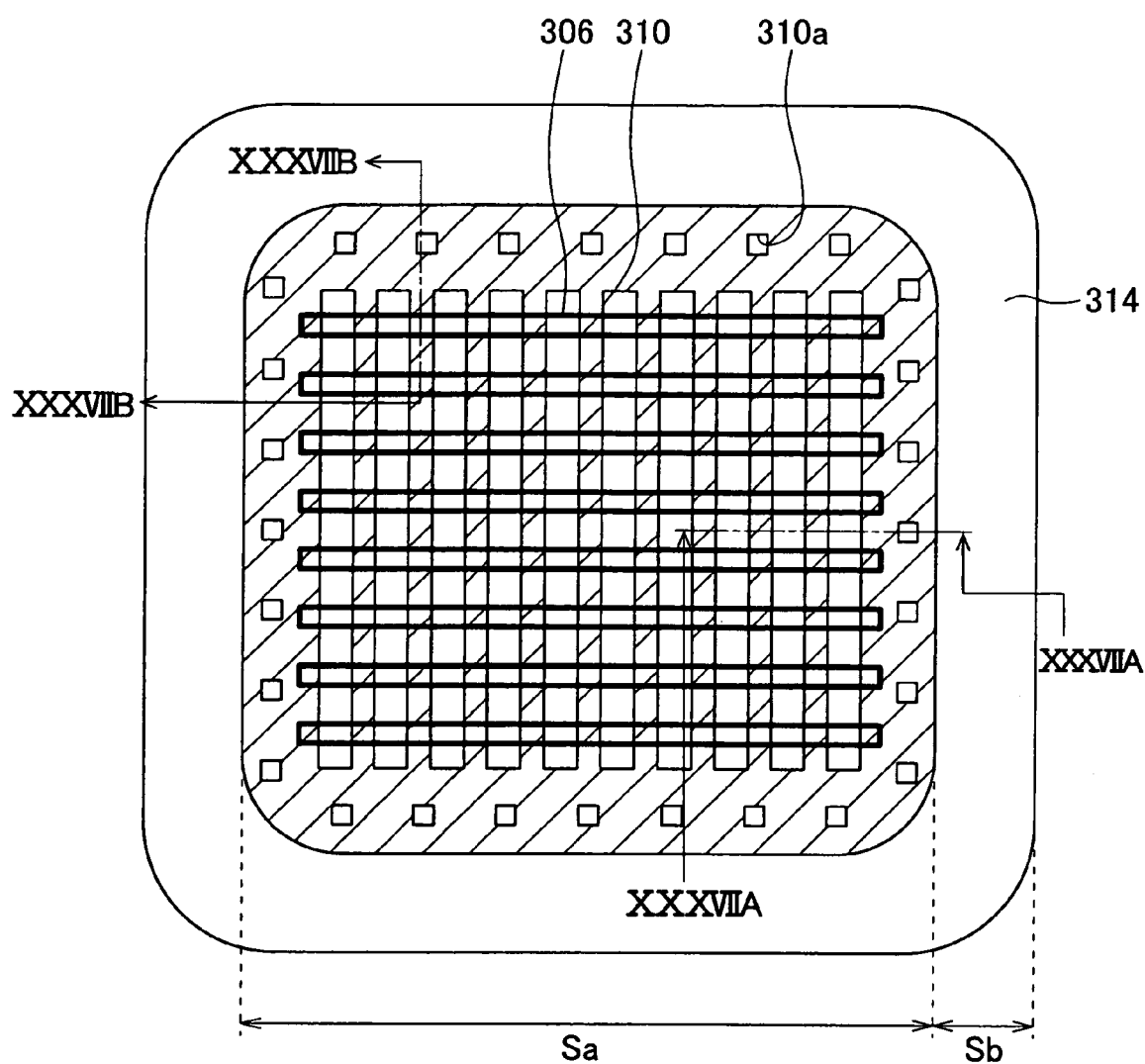
FIG. 36 is a diagram illustrating a top view of an SiC semiconductor device according to an eighth embodiment.

An SiC semiconductor device according to an eighth embodiment of the present invention will be described with reference to FIG. 36, FIG. 37A, and FIG. 37B.

In the SiC semiconductor device according to the present embodiment, the outer edge portion of the P type deep layer 310 reaches the P type RESURF layer 315. However, a plurality of openings 310a in which the P type deep layer 310 is not formed is provided at the outer edge portion of the P type deep layer 310. A dimension of each of the openings 310a is less than the intervals of stripe portions of the P type deep layer 310. For example, each of the openings 310a has an approximately square shape and each side of the approximately square shape is less than the intervals of the stripe portions of the P type deep layer 310. Each of the openings 310a may have another shape. In a case where each of the openings 310a has an approximately circular shape, a diameter of the approximately circular shape is less than the intervals of the stripe portions of the P type deep layer 310.

Although the openings 310a are provided in the outer edge portion of the P type deep layer 310, the dimension of each of the openings 310a is set to be less than the intervals of the stripe portions of the deep layer 310. Thus, the depletion layer expanding from the outer edge portion of the P type deep layer 310 fills the openings 310a when the voltage is not applied to the gate electrode. Therefore, the SiC semiconductor device according to the present embodiment can have effects similar to the effects of the SiC semiconductor device according to the sixth embodiment.

Ninth Embodiment

An SiC semiconductor device according to a ninth embodiment of the present invention will be described with reference to FIG. 38A and FIG. 38B.

In the SiC semiconductor device according to the present embodiment, the P type deep layer 310 is connected with the P type RESURF layer 315. The P type deep layer 310 and the P type RESURF layer 315 has the same depth and the same impurity concentration. The P type RESURF layer 315 is not formed at the sidewall of the stepped part of the mesa structure portion 314. The P type base region 303 is formed to the boundary portion between the cell section Sa and the peripheral section Sb.

Figure 39A:
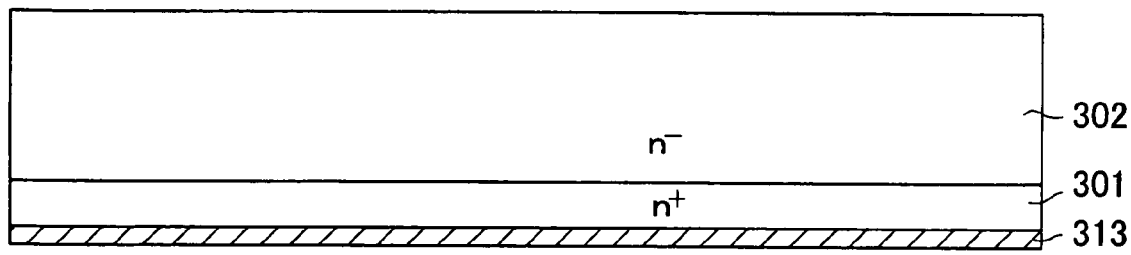
FIG. 39A to FIG. 39E are diagrams illustrating cross-sectional views of an exemplary manufacturing process of the SiC semiconductor device according to the ninth embodiment taken along the line corresponding to line XXXIB-XXXIB in FIG. 28.
Figure 39B:
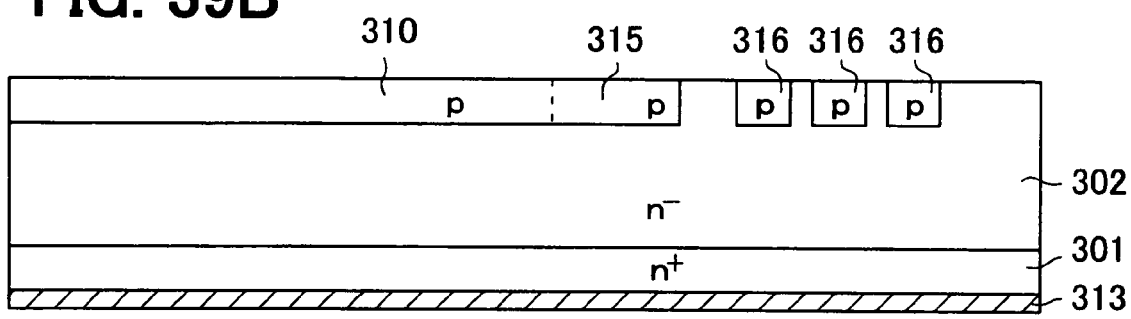
Figure 39C:
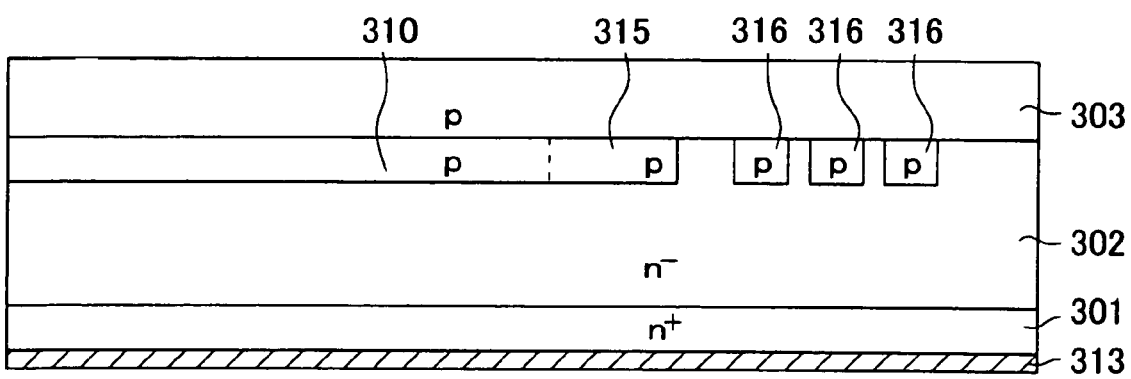
Figure 39D:
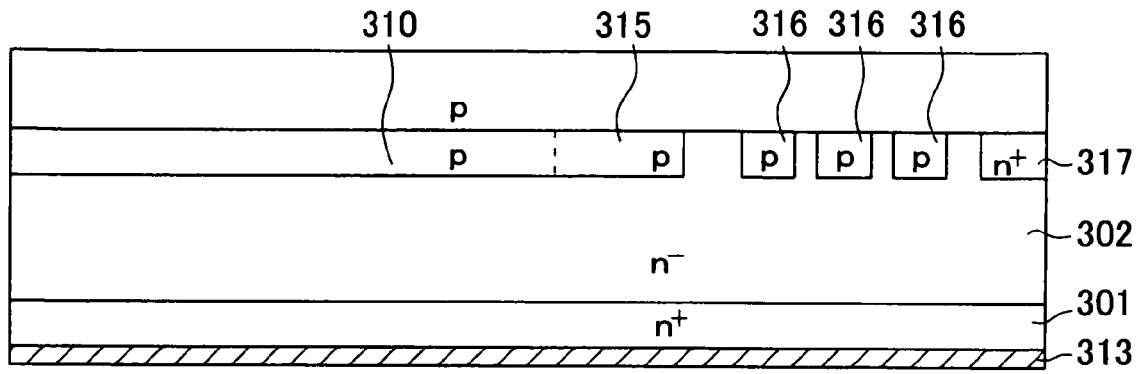
Figure 39E:
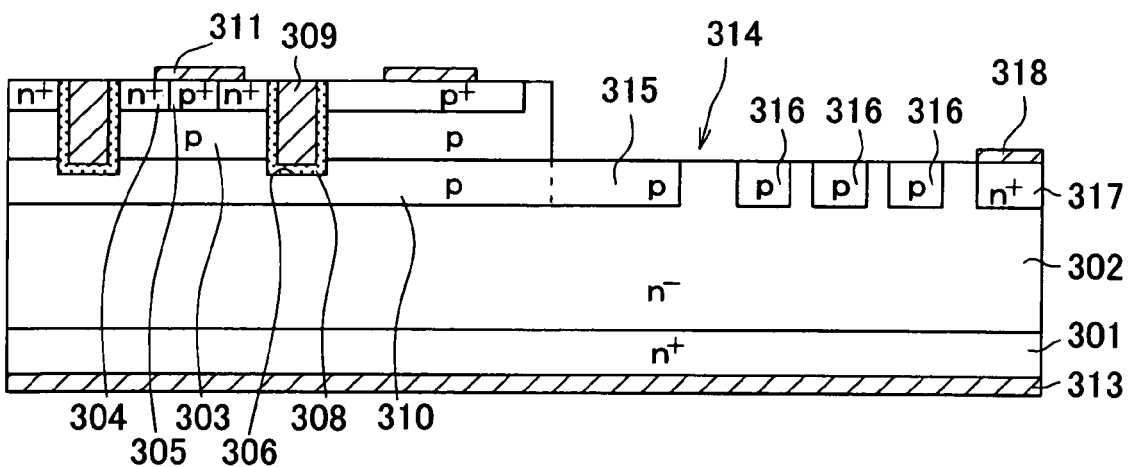

An exemplary method of manufacturing the SiC semiconductor device according to the present embodiment will be described with reference to FIG. 39A to FIG. 39B. A process illustrated in FIG. 39A is performed in a manner similar to the process illustrated in FIG. 33A. A process illustrated in FIG. 39B is performed in a manner similar to the process illustrated in FIG. 33B. However, during the process illustrated in FIG. 39B, the P type RESURF layer 315 is formed at the surface portion of the N− type drift layer 302 in addition to the P type deep layer 310 and the P type guard ring layers 316. The P type RESURF layer 315 is formed so as to be connected with the P type deep layer 310. A process illustrated in FIG. 39C is performed in a manner similar to the process illustrated in FIG. 33C. During a process illustrated in FIG. 39D, the mesa structure portion 314 is formed in a manner similar to the process illustrated in FIG. 33D. A process illustrated in FIG. 39E is performed in a manner similar to the process illustrated in FIG. 33E. Thereby, the SiC semiconductor device according to the present embodiment is formed.

As described above, the P type RESURF layer 315 can be formed at the same time with the P type deep layer 310. The SiC semiconductor device according to the present embodiment can have effects similar to the effects of the SiC semiconductor device according to the sixth embodiment. In addition, the process for forming the P type RESURF layer 315 and the P type deep layer 310 can be simplified. Furthermore, an overlap of the P type RESURF layer 315 and the P type deep layer 310 can be prevented, and thereby the electric field concentration due to a distortion of the equipotential lines can be restricted. Therefore, the SiC semiconductor device according to the present embodiment can have effects similar to the effects of the SiC semiconductor device according to the seventh embodiment.

Each of the SiC semiconductor devices according to the sixth to ninth embodiments includes the N-channel type MOSFET, as an example. Alternatively, the SiC semiconductor devices may include a P-channel type MOSFET in which conductivity types of the components are reversed. Alternatively, the SiC semiconductor devices may include insulated gate bipolar transistors (IGBTs) each having a trench gate structure. In a case where the SiC semiconductor devices include the IGBTs, the conductivity type of the N+ type substrate 301 is changed from the N conductivity type to the P conductivity type. Other structure and a manufacturing method are similar to the method described in the sixth embodiment.

In each of the SiC semiconductor devices according to the sixth to ninth embodiments, the gate oxide layer 308 formed by the thermal oxidation is provided as an example of a gate insulating layer. Alternatively, the gate insulating layer may be an oxide layer formed by another method or a nitride layer, for example. The drain electrode 313 may be formed after forming the source electrode 311.

In each of the SiC semiconductor devices according to the sixth to ninth embodiments, the stripe portions of the P type deep layer 310 are formed along the approximately normal direction of the sidewall of the trench 306, as an example. The P type deep layers 310 may also be formed along a direction inclined to the sidewall of the trench 306. Alternatively, a part of the P type deep layers 310 may be arranged in a direction inclined to one side from the normal direction of the sidewall of the trench 306 and the other part of the P type deep layers 310 may be arranged in a direction inclined to the opposite side of the one side from the normal direction. In the present case, the part of the P type deep layers 310 cross the other part of the P type deep layers 310, and thereby the P type deep layers 310 are arranged in a lattice pattern. At least the longitudinal direction of the P type deep layers 310 is set so as to cross the longitudinal direction of the trench 306. That is, when the trench 306 is provided along a first direction, the P type deep layers 310 are formed along a second direction crossing the first direction. Also in these cases, the clearance between the P type deep layer 310 and the P type RESURF layer 315 described in the seventh embodiment and the dimension of the openings 310a described in the eighth embodiment are set to be less than the intervals of the stripe portions of the P type deep layer 310.

In each of the SiC semiconductor devices according to the sixth to ninth embodiments, the peripheral high-voltage part is configured by the P type RESURF layer 315 and the P type guard ring layers 316. However, a configuration of the peripheral high-voltage part is not limited to the above-described example. The peripheral high-voltage part may be a general peripheral high-voltage structure. Also in the present case, the outer edge portion of the P type deep layer 310 can be formed at the whole area of the outer edge portion of the cell section Sa as described in the sixth embodiment, the outer edge portion of the P type deep layer 310 can be away from the peripheral section Sb as described in the seventh embodiment, or the openings 310a can be provided at the outer edge portion of the P type deep layer 310. By forming the P type deep layer 310 at the outer edge portion of the cell section Sa, a portion where a breakdown can possibly occur is moved to the peripheral section Sb. Thus, the breakdown voltage can be increased.

Figure 40:
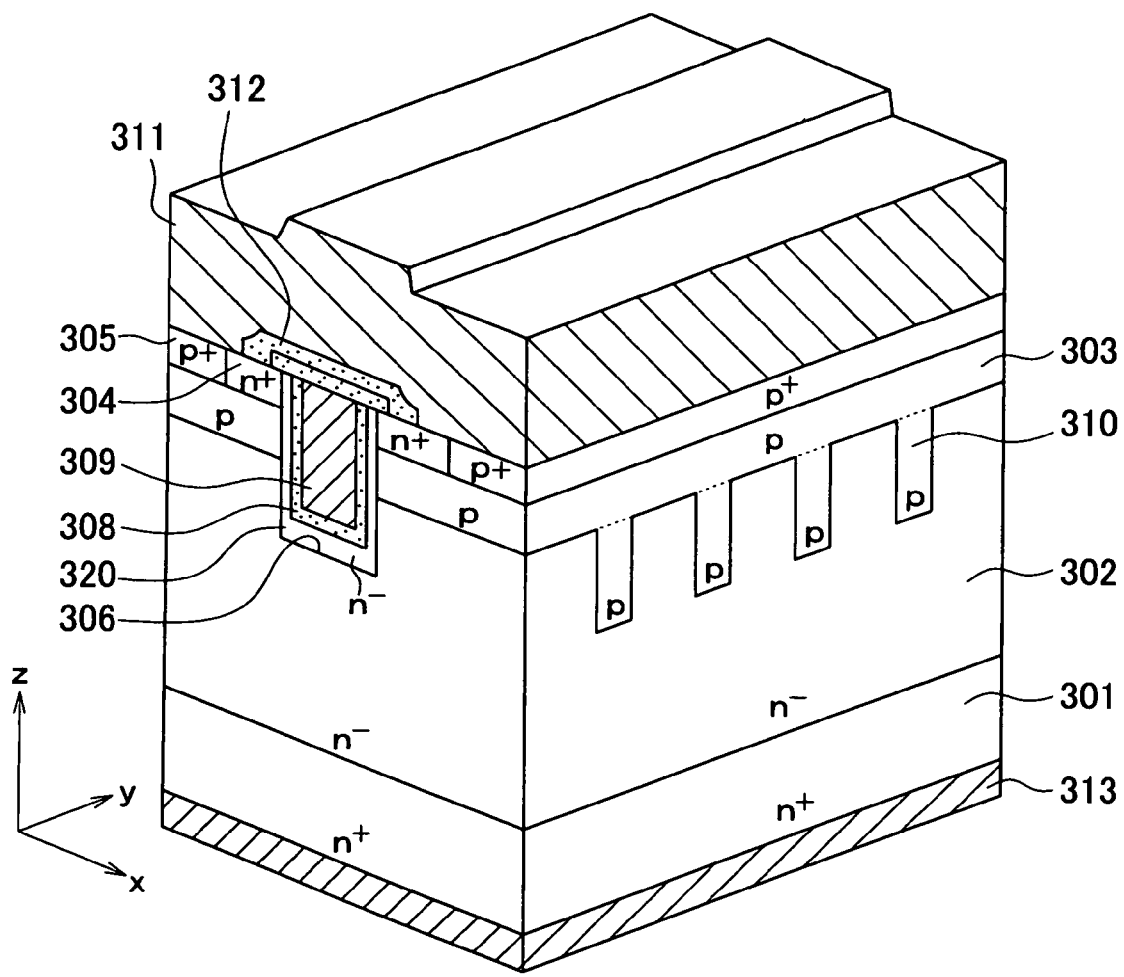
FIG. 40 is a diagram illustrating a perspective cross-sectional view of an accumulation type MOSFET in an SiC semiconductor device according to another embodiment.

Each of the SiC semiconductor devices according to the sixth to ninth embodiments includes the MOSFETs having the inversion type trench gate structure, as an example. Alternatively, each of the SiC semiconductor devices according to the sixth to ninth embodiments may include a MOSFET having an accumulation type trench gate structure as illustrated in FIG. 40. In the present case, an N− type channel layer 320 disposed in the trench 306 and the gate electrode 309 is disposed on a surface of the N− type channel layer 320 through the gate oxide layer 308.

When an orientation of a crystal face is described, it is originally required for attaching a bar above a desired figure. However, the bar is attached before the figure in the present application.

What is claimed is:

1. A silicon carbide semiconductor device comprising a plurality of MOSFETs arranged in a first direction and a plurality of deep layers, each of the plurality of MOSFETs including:
   a substrate made of silicon carbide, the substrate having a first conductivity type, the substrate having first and second opposing surfaces;
   a drift layer located on the first surface of the substrate, the drift layer made of silicon carbide, the drift layer having the first conductivity type and having an impurity concentration less than an impurity concentration of the substrate;
   a base region located on the drift layer, the base region made of silicon carbide and having a second conductivity type;
   a source region located on the base region, the source region made of silicon carbide, the source region having the first conductivity type and having an impurity concentration greater than the impurity concentration of the drift layer;
   a trench extending to a depth deeper than the source region and the base region and reaching the drift layer, the trench sandwiched by each of the base region and the source region, the trench provided along a second direction, the second direction intersecting with the first direction in a planar direction of the substrate;
   a gate insulating layer located on a surface of the trench;
   a gate electrode located on the gate insulating layer in the trench;
   a source electrode electrically coupled with the source region and the base region;
   a drain electrode located on the second surface of the substrate; and
   a body layer having a predetermined distance from a sidewall of the trench, the body layer located at a portion deeper than the source region, the body layer having the second conductivity type and having an impurity concentration greater than the impurity concentration of the base region, wherein
   the plurality of deep layers has a stripe shape formed in parallel with the planar direction of the substrate along the first direction,
   the plurality of deep layers is located under each base region in the plurality of MOSFETs, has a constant depth, and extends to a depth deeper than each trench in the plurality of MOSFETs,
   the plurality of deep layers has the second conductivity type,
   the plurality of deep layers intersects with each trench in the plurality of MOSFETs in a lattice pattern, and
   in each of the plurality of MOSFETs, an inversion channel is provided at a surface portion of the base region located on the sidewall of the trench and electric current flows between the source electrode and the drain electrode through the source region and the drift layer by controlling a voltage applied to the gate electrode.

2. The silicon carbide semiconductor device according to claim 1, further comprising one or more of the deep layers, wherein:
   each of the deep layers has a width of about 1.5 μm;
   the deep layers are arranged at intervals of about 2.0 μm; and
   the predetermined distance from the sidewall of the trench and the body layer is between about 0.4 μm and about 0.9 μm.

3. The silicon carbide semiconductor device according to claim 1, wherein the impurity concentration of the base region is between about $5.0 \times 10^{15}$ cm$^{-3}$ and about $5.0 \times 10^{16}$ cm$^{-3}$; and
   the impurity concentration of the body layer is between about $1.0 \times 10^{18}$ cm$^{-3}$ and about $1.0 \times 10^{20}$ cm$^{-3}$.

* * * * *